(12) United States Patent
Kamimura et al.

(10) Patent No.: US 7,615,330 B2
(45) Date of Patent: Nov. 10, 2009

(54) POSITIVE RESIST COMPOSITION AND PATTERN FORMATION METHOD USING THE SAME

(75) Inventors: Sou Kamimura, Shizouka (JP); Tomoya Sasaki, Shizuoka (JP); Yasutomo Kawanishi, Shizuoka (JP); Kenji Wada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 206 days.

(21) Appl. No.: 11/727,267

(22) Filed: Mar. 26, 2007

(65) Prior Publication Data

US 2007/0224540 A1  Sep. 27, 2007

(30) Foreign Application Priority Data

Mar. 27, 2006 (JP) ............................. 2006-086217
Sep. 22, 2006 (JP) ............................. 2006-257965

(51) Int. Cl.
*G03F 7/004* (2006.01)
*G03F 7/30* (2006.01)

(52) U.S. Cl. .................... 430/270.1; 430/326; 430/921; 430/922

(58) Field of Classification Search .............. 430/270.1, 430/326, 921, 922
See application file for complete search history.

(56) References Cited

U.S. PATENT DOCUMENTS

| | | | |
|---|---|---|---|
| 5,310,619 A * | 5/1994 | Crivello et al. ........... | 430/270.1 |
| 6,680,157 B1 | 1/2004 | Fedynyshyn | |
| 7,217,492 B2 * | 5/2007 | Yoneda et al. ........... | 430/270.1 |
| 7,374,860 B2 * | 5/2008 | Hirano et al. ............ | 430/270.1 |
| 2004/0087690 A1 * | 5/2004 | Lamanna et al. ............ | 524/155 |
| 2007/0072117 A1 * | 3/2007 | Mizutani et al. ......... | 430/270.1 |
| 2007/0082289 A1 * | 4/2007 | Wada ...................... | 430/270.1 |
| 2007/0141512 A1 * | 6/2007 | Wada et al. .............. | 430/270.1 |

FOREIGN PATENT DOCUMENTS

| | | |
|---|---|---|
| EP | 0 898 201 A1 | 2/1999 |
| EP | 1 480 078 A1 | 11/2004 |
| JP | 10-083073 A | 3/1998 |
| JP | 10-120610 A | 5/1998 |
| JP | 10-310545 A | 11/1998 |
| JP | 11-322656 A | 11/1999 |
| JP | 2000-305270 A | 11/2000 |
| JP | 2002-049154 A | 2/2002 |
| JP | 2003-183227 A | 7/2003 |
| JP | 2003-321423 A | 11/2003 |

* cited by examiner

*Primary Examiner*—John S Chu
(74) *Attorney, Agent, or Firm*—Sughrue Mion, PLLC

(57) ABSTRACT

A positive resist composition containing a compound including a sulfonium cation having a structure represented by the formula (Z-I) as defined herein, a low molecular weight compound which increases solubility in an alkali developing solution by an action of an acid, and a compound which generates a compound having a structure represented by the formula (A-I) as defined herein upon irradiation of an actinic ray or a radiation.

11 Claims, No Drawings

POSITIVE RESIST COMPOSITION AND PATTERN FORMATION METHOD USING THE SAME

FIELD OF THE INVENTION

The present invention relates to a resist composition suitable for use in an ultra-micro lithography process, for example, the production of VLSI and high capacity microchips, and other photofabrication processes. More particularly, it relates to a resist composition capable of forming high precision patterns using an electron beam, an X ray, an EUV beam or the like, and to a resist composition which can be suitably employed in ultra-microfabrication of semiconductor devices using an electron beam, an X ray or an EUV beam.

BACKGROUND OF THE INVENTION

Heretofore, in processes for the production of semiconductor devices, for example, IC or LSI, microfabrication has been conducted by means of lithography using a resist composition. In recent years, as the degree of integration in integrated circuits increases, it has been requested to form an ultra fine pattern in the submicron region or the quarter micron region. With such a trend, an exposure wavelength tends to become shorter, for instance, from g-line to i-line and further to a KrF excimer laser beam.

Moreover, the development of lithography using an electron beam, an X ray or an EUV beam also proceeds at present in addition to the use of an excimer laser beam. In particular, the lithography using an EUV beam as the light source is regarded as the promising pattern formation technique of next generation or after the next generation, and the extensive investigations have been made. Performance required for the resist used includes high sensitivity, high resolution and good line edge roughness. However, since there is a trade off relation between the above-described performances, it is important how these performances are satisfied at the same time. The term "line edge roughness" as used herein means a phenomenon wherein an edge between a line pattern of resist and a surface of substrate irregularly fluctuates in the direction vertical to the line due to the characteristics of resist, and the edge looks uneven when the pattern is observed from just above. Since the unevenness is transferred to the substrate in an etching step using the resist as a mask, the unevenness causes deterioration in electric properties thereby resulting in the yield reduction. Particularly, in the ultra fine region of 0.25 µm or less, the line edge roughness is the extremely important problem to be improved. The problem is also important in the lithography using an X-ray or an electron beam.

Separately from the above requirement, since the exposure is conducted under vacuum in the case of using the light source, for example, an electron beam, an X ray or an EUV beam, a problem of outgassing becomes also important in which a low boiling point compound, for example, a solvent or a resist material decomposed with high energy vaporizes to contaminate the optical device. Various investigations with respect to reduction of the outgassing have been recently made and various attempts, for instance, to restrain the vaporization of a low molecular weight compound by providing a top coat layer (see, for example, European patent 1,480,078) or to add a radical trapping agent capable of inhibiting the decomposition of a polymer (see, for example, U.S. Pat. No. 6,680,157) have been made. On the other hand, means for reducing the outgassing regarding an acid generator has been desired.

Heretofore, as a resist suitable for the lithography process using an electron beam, an X ray or an EUV beam, a chemical amplification resist mainly utilizing an acid catalyst reaction has been used in view of high sensitivity. With respect to a positive resist, a chemical amplification resist composition containing as the main components, a phenolic polymer having a property of being insoluble or hardly soluble in an aqueous alkali solution and becoming soluble in the aqueous alkali solution upon the action of an acid and an acid generator has been investigated. However, in a conventional resist using a polymer compound as a material, there is a problem in that the molecular shape of the polymer compound is reflected in the pattern profile and line edge roughness.

On the other hand, in recent years, it has been proposed to use a low molecular weight compound from the stand point of miniaturization of pattern and low line edge roughness. For instance, resist compositions using a phenol compound derivative having a specific structure (see, for example, JP-A-10-120610 (the term "JP-A" as used herein means an "unexamined published Japanese patent application") and JP-A-10-83073, JP-A-2000-305270 and JP-A-2003-183227), calixarene having a specific structure (see, for example, JP-A-10-120610 and JP-A-11-322656), calixresorcinolarene (see, for example, JP-A-11-322656 and JP-A-2003-321423), or a phenolic dendrimer including a mother skeleton of calixresorcinolarene (see, for example, JP-A-10-310545) are disclosed.

However, it is unable to satisfy the high sensitivity, high resolution and good line edge roughness at the same time in the ultra fine region only by means of using such a low molecular weight compound. Moreover, a sufficient investigation is still not made at present with respect to suppression of the outgassing which is an especially important performance required for the EUV lithography.

SUMMARY OF THE INVENTION

Therefore, an object of the present invention is to solve the problems on techniques for improving performance in ultra fine fabrication of semiconductor device using a high energy beam, for example, an X ray, an electron beam or an EUV beam, and more specifically, to provide a positive resist composition which satisfies the high sensitivity, high resolution, good line edge roughness and suppression of the outgassing at the same time and a pattern formation method using the same.

The present invention is as follows.

As a result of intensive investigations, the inventors have found that the object of the invention can be achieved by a resist composition comprising a combination of an acid generator having a specific structure, a compound which generates a compound having a specific structure upon irradiation of an actinic ray or radiation and a low molecular weight compound having a specific structure including a group capable of generating an alkali-soluble group by the action of an acid.

Specifically, the invention includes the following constructions.

(1) A positive resist composition comprising (Z) a compound including a sulfonium cation having a structure represented by formula (Z-I) shown below, (T) a low molecular weight compound which increases solubility in an alkali developing solution by the action of an acid and (A) a compound which generates a compound having a structure represented by formula (A-I) shown below upon irradiation of an actinic ray or radiation:

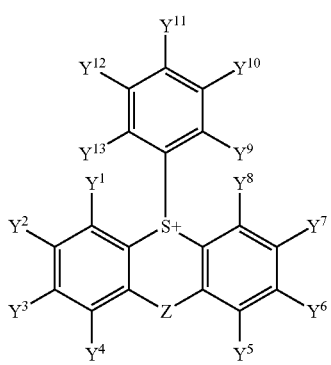

(Z-I)

In formula (Z-I), $Y^1$ to $Y^{13}$ each independently represents a hydrogen atom or a substituent, or adjacent members of $Y^1$ to $Y^{13}$ may be combined with each other to form a ring, and Z represents a single bond or a divalent connecting group.

(A-I)

In formula (A-I), Q represents a sulfo group (—SO$_3$H) or a carboxyl group (—CO$_2$H), A represents a divalent connecting group, X represents —SO$_2$— or —CO—, n represents 0 or 1, B represents a single bond, an oxygen atom or —N(R$_x$)—, R$_x$ represents a hydrogen atom or a monovalent organic group, R represents a monovalent organic group including a proton acceptor functional group or a monovalent organic group including an ammonium group, and when B represents —N(R$_x$)—, R and R$_x$ may be combined with each other to form a ring.

(2) The positive resist composition as described in (1), wherein the low molecular weight compound (T) is a compound having a structure represented by formula (T-I) shown below:

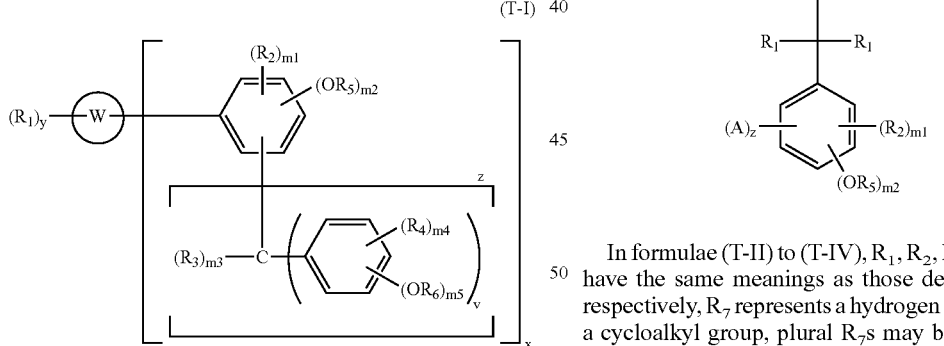

(T-I)

In formula (T-I), $R_1$, $R_2$, $R_3$ and $R_4$ each independently represents a hydrogen atom, an alkyl group or a cycloalkyl group, plural $R_1$s may be combined with each other to form a ring, plural $R_2$s may be combined with each other to form a ring, plural $R_3$s may be combined with each other to form a ring, plural $R_4$s may be combined with each other to form a ring, plural $R_1$s, $R_2$s, $R_3$s and $R_4$s may be the same or different from each other respectively, and $R_5$ and $R_6$ each independently represents a hydrogen atom or an organic group, plural $R_5$s and $R_6$s may be the same or different from each other respectively, provided that at least one of $R_5$s and $R_6$s is an acid-decomposable group (thus, there is at least one acid-decomposable group in all of $R_5$s and $R_6$s), W represents a single bond, an alkylene group, a cycloalkylene group, an arylene group or a group formed by an appropriate combination of these groups, x represents a positive integer, y represents an integer of 0 or more, when W represents a single bond, y is 0, z represents an integer of 0 or more, v represents an integer of 0 or more, m1, m3 and m4 each independently represents a positive integer, and m2 and m5 each independently represents an integer of 0 or more, provided that m1+m2+z=5, m3+v=3, m4+m5=5 and m2+m5≧2.

(3) The positive resist composition as described in (2), wherein the compound having a structure represented by formula (T-I) is a compound having a structure represented by any one of the following formulae (T-II) to (T-IV):

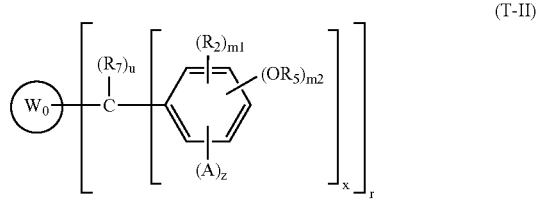

(T-II)

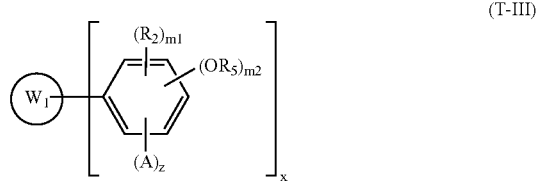

(T-III)

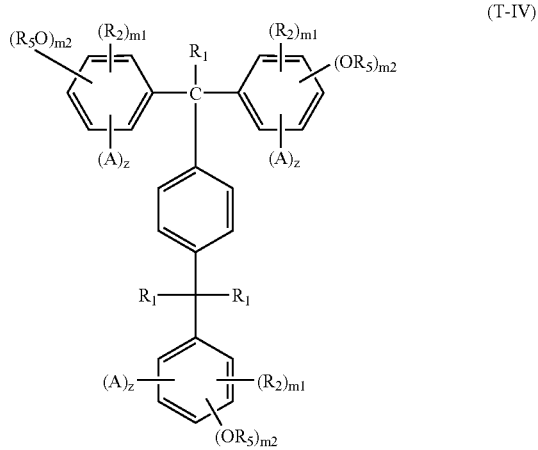

(T-IV)

In formulae (T-II) to (T-IV), $R_1$, $R_2$, $R_5$, $R_6$, x, z, m1 and m2 have the same meanings as those defined in formula (T-I) respectively, $R_7$ represents a hydrogen atom, an alkyl group or a cycloalkyl group, plural $R_7$s may be combined with each other to form a ring, plural $R_7$s may be the same or different from each other, u represents a positive integer, provided that u+x=3, r represents a positive integer, $W_0$ represents an arylene group, $W_1$ represents a single bond, an alkylene group or a cycloalkylene group, and A represents a group having a structure represented by formula (a) shown below:

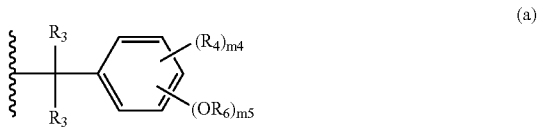

(a)

In formula (a), $R_3$, $R_4$, $R_6$, m4 and m5 have the same meanings as those defined in formula (T-I) respectively.

(4) The positive resist composition as described in Claim (1), wherein the low molecular weight compound (T) is a compound having a structure represented by formula (T-V) shown below:

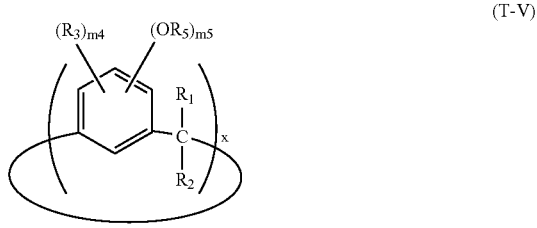

(T-V)

In formula (T-V), $R_1$, $R_2$, $R_3$, $R_5$, m4, m5 and x have the same meanings as those defined in formula (T-I) respectively.

(5) The positive resist composition as described in any one of (1) to (4), wherein the compound which generates a compound having a structure represented by formula (A-I) upon irradiation of an actinic ray or radiation is a sulfonium salt compound of the compound having a structure represented by formula (A-I) or an iodonium salt compound of the compound having a structure represented by formula (A-I).

Further, preferable embodiments of the invention include the following constructions.

(6) The positive resist composition as described in any one of (1) to (5), which further comprises (C) a basic compound and/or (D) a fluorine-based and/or silicon-based surfactant.

(7) The positive resist composition as described in (6), wherein the basic compound (C) is a compound having a structure selected from an imidazole structure, a diazabicyclo structure, an onium hydroxy structure, an onium carboxylate structure, a trialkylamine structure, an aniline structure and a pyridine structure, an alkylamine derivative having a hydroxy group and/or an ether bond, or an aniline derivative having a hydroxy group and/or an ether bond.

(8) A resist pattern formation method comprising forming a resist film by coating the positive resist composition as described in any one of (1) to (7) on a substrate, and then exposing and developing the resist film to form a resist pattern.

According to the invention, the problems on techniques for improving performance in ultra fine fabrication of semiconductor device using a high energy beam, for example, an X ray, an electron beam or an EUV beam are resolved, and a positive resist composition which satisfies the high sensitivity, high resolution, good line edge roughness and suppression of the outgassing at the same time and a pattern formation method using the same are provided.

DETAILED DESCRIPTION OF THE INVENTION

The present invention will be described in more detail below.

With respect to the description of a group (atomic group) in the specification, the term "group", which is not particularly referred to whether it is substituted or not, means and includes both an unsubstituted group and a substituted group. For instance, the description of an "alkyl group" includes not only an alkyl group having no substituent (an unsubstituted alkyl group) but also an alkyl group having a substituent (a substituted alkyl group).

The positive resist composition according to the invention contains (Z) a compound including a sulfonium cation having a structure represented by formula (Z-I) shown below, (T) a low molecular weight compound which increases solubility in an alkali developing solution by the action of an acid and (A) a compound which generates a compound having a structure represented by formula (A-I) shown below upon irradiation of an actinic ray or radiation.

[1] (Z) Compound (Hereinafter Also Referred to as a "Compound (Z)" or "(Z) Component") Including a Sulfonium Cation Having a Structure Represented by Formula (Z-I)

The compound (Z) generates a sulfonium cation having a structure represented by formula (Z-I) shown below upon irradiation of an actinic ray or radiation.

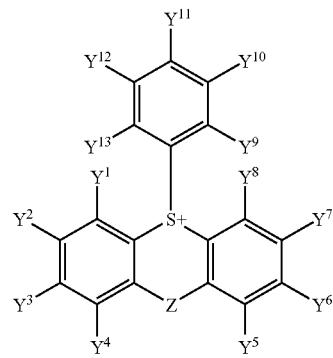

(Z-I)

In formula (Z-I), $Y^1$ to $Y^{13}$ each independently represents a hydrogen atom or a substituent, or adjacent members of $Y^1$ to $Y^{13}$ may be combined with each other to form a ring, and Z represents a single bond or a divalent connecting group.

The substituent represented by any one of $Y^1$ to $Y^{13}$ in formula (Z-I) may be any substituent and is not particularly limited. Examples of the substituent include a halogen atom, an alkyl group, a cycloalkyl group (including a bicycloalkyl group and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxyl group, an alkoxy group (including a cycloalkoxy group), an aryloxy group, a silyloxy group, a heterocyclic oxy group, an acyloxy group, a carbamoyloxy group, an alkoxycarbonyloxy group (including a cycloalkoxycarbonyloxy group), an aryloxycarbonyloxy group, an amino group (including an anilino group), an ammonio group, an acylamino group, an aminocarbonylamino group, an alkoxycarbonylamino group (including a cycloalkoxycarbonylamino group), an aryloxycarbonylamino group, a sulfamoylamino group, an alkyl-, cycloalkyl- or aryl-sulfonylamino group, a mercapto group, an alkylthio group (including a cycloalkylthio group), an arylthio group, a heterocyclic thio group, a sulfamoyl group, a sulfo group, an alkyl-, cycloalkyl- or aryl-sulfinyl group, an alkyl-, cycloalkyl- or aryl-sulfonyl group, an acyl group, an aryloxycarbonyl group, an alkoxycarbonyl group (including a cycloalkylcarbonyl group), a carbamoyl group, an aryl- or heterocyclic-azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

$Y^1$ to $Y^{13}$ each preferably represents a hydrogen atom, a halogen atom, an alkyl group, a cycloalkyl group (including a bicycloalkyl group and a tricycloalkyl group), an alkenyl group (including a cycloalkenyl group and a bicycloalkenyl group), an alkynyl group, an aryl group, a cyano group, a hydroxy group, a carboxyl group, an alkoxy group (including a cycloalkoxy group), an aryloxy group, an acyloxy group, a carbamoyloxy group, an acylamino group, an aminocarbonylamino group, an alkoxycarbonylamino group (including a cycloalkoxycarbonylamino group), an aryloxycarbonylamino group, a sulfamoylamino group, an alkyl-, cycloalkyl- or aryl-sulfonylamino group, an alkylthio group (including a cycloalkylthio group), an arylthio group, a sulfamoyl group, an alkyl-, cycloalkyl- or aryl-sulfonyl group, an aryloxycarbonyl group, an alkoxycarbonyl group (including a cycloalkylcarbonyl group), a carbamoyl group, an imido group, a silyl group or a ureido group.

$Y^1$ to $Y^{13}$ each more preferably represents a hydrogen atom, a halogen atom, an alkyl group, a cycloalkyl group (including a bicycloalkyl group and a tricycloalkyl group), a cyano group, a hydroxy group, an alkoxy group (including a cycloalkoxy group), an acyloxy group, an acylamino group, an aminocarbonylamino group, an alkoxycarbonylamino group (including a cycloalkoxycarbonylamino group), an alkyl-, cycloalkyl- or aryl-sulfonylamino group, an alkylthio group (including a cycloalkylthio group), a sulfamoyl group, an alkyl-, cycloalkyl- or aryl-sulfonyl group, alkoxycarbonyl group (including a cycloalkylcarbonyl group) or a carbamoyl group.

$Y^1$ to $Y^{13}$ each particularly preferably represents a hydrogen atom, an alkyl group, a cycloalkyl group (including a bicycloalkyl group and a tricycloalkyl group), a cyano group, a hydroxy group, an alkoxy group (including a cycloalkoxy group) or an alkylsulfonyl group.

The ring formed by combining adjacent members of $Y^1$ to $Y^{13}$ each other includes an aromatic or nonaromatic, hydrocarbon ring or hetero ring, and a polycyclic condensed ring formed by a combination thereof. Examples of the ring include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

The divalent connecting group represented by Z includes, for example, an alkylene group, an arylene group, an ether group, a thioether group, an amino group, —CH=CH—, —C≡C—, a carbonyl group, a sulfido group, a sulfone group, a sulfoxido group, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO— and —OSO$_2$O—.

Z preferably represents a single bond, an alkylene group (preferably a methylene group), an ether group, a thioether group, a carbonyl group, a sulfido group, a sulfone group, —COO—, —CONH—, —SO$_2$NH—, —CF$_2$—, —CF$_2$CF$_2$— or —COCO—, more preferably represents a single bond, an ether group, a thioether group, a carbonyl group, a sulfido group or a sulfone group, and particularly preferably represents a single bond or a sulfone group.

The compound of (Z) component has a counter anion. The counter anion is preferably an organic anion. The term "organic anion" as used herein means an anion having at least one carbon atom. Further, the organic anion is preferably a non-nucleophilic anion. The term "non-nucleophilic anion" as used herein means an anion having an extremely low ability for causing a nucleophilic reaction and an anion capable of restraining decomposition with the lapse of time by an intramolecular nucleophilic reaction.

The non-nucleophilic anion includes, for example, a sulfonic acid anion, a carboxylic acid anion, a sulfonylimido anion, a bis(alkylsulfonyl)imido anion and a tris(alkylsulfonyl)methyl anion.

The non-nucleophilic sulfonic acid anion includes, for example, an aliphatic sulfonic acid anion, an aromatic sulfonic acid anion and camphorsulfonic acid anion. The non-nucleophilic carboxylic acid anion includes, for example, an aliphatic carboxylic acid anion, an aromatic carboxylic acid anion and an aralkylcarboxylic acid anion.

The aliphatic moiety in the aliphatic sulfonic acid anion may be an alkyl group or a cycloalkyl group and preferably includes, an alkyl group having from 1 to 30 carbon atoms and a cycloalkyl group having from 3 to 30 carbon atoms, for example, a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group or a bornyl group.

The aromatic group in the aromatic sulfonic acid anion includes preferably an aryl group having from 6 to 14 carbon atoms, for example, a phenyl group, a tolyl group or a naphthyl group.

The alkyl group, cycloalkyl group and aryl group in the aliphatic sulfonic acid anion and aromatic sulfonic acid anion may have a substituent, for example, a nitro group, a halogen atom (for example, a fluorine atom, a chlorine atom, a bromine atom or an iodine atom), a carboxyl group, a hydroxy group, an amino group, a cyano group, an alkoxy group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), an alkoxycarbonyloxy group (preferably having from 2 to 7 carbon atoms). The aryl group and ring structure included in each of these groups may further have a substituent, for example, an alkyl group (preferably having from 1 to 15 carbon atoms).

The aliphatic moiety in the aliphatic carboxylic acid anion includes the alkyl group and cycloalkyl group same as in the aliphatic sulfonic acid anion.

The aromatic group in the aromatic carboxylic acid anion includes the aryl group same as in the aromatic sulfonic acid anion.

The aralkyl group in the aralkylcarboxylic acid anion includes preferably an aralkyl group having from 6 to 12 carbon atoms, for example, a benzyl group, a phenethyl group, a naphthylmethyl group, a naphthylethyl group or a naphthylmethyl group.

The alkyl group, cycloalkyl group, aryl group and aralkyl group in the aliphatic carboxylic acid anion, aromatic carboxylic acid anion and aralkylcarboxylic acid anion may have a substituent, for example, a halogen atom, an alkyl group, a cycloalkyl group, an alkoxy group or an alkylthio group, same as in the aromatic sulfonic acid anion.

Examples of the sulfonylimido anion include a saccharin anion.

The alkyl group in the bis(alkylsulfonyl)imido anion or tris(alkylsulfonyl)methyl anion preferably includes an alkyl group having from 1 to 5 carbon atoms, for example, a methyl group, an ethyl group, a propyl group, an isopropyl group, a n-butyl group, an isobutyl group, a sec-butyl group, a pentyl group or a neopentyl group. The alkyl group may have a substituent, for example, a halogen atom, an alkyl group substituted with a halogen atom, an alkoxy group and an alkylthio group.

Other examples of the non-nucleophilic anion include phosphorus fluoride, boron fluoride and antimony fluoride.

As the counter anion of the compound of (Z) component, a sulfonic acid anion is preferable and an aromatic sulfonic acid anion is more preferable.

Specific examples of the counter anion include a methanesulfonic acid anion, a trifluoromethanesulfonic acid anion, a pentafluoroethanesulfonic acid anion, a heptafluoropropanesulfonic acid anion, a perfluorobutanesulfonic acid anion, a perfluorohexanesulfonic acid anion, a perfluorooctanesulfonic acid anion, a pentafluorobenzenesulfonic acid anion, a 3,5-bistrifluoromethylbenzenesulfonic acid anion, a 2,4,6-triisopropylbenzenesulfonic acid anion, a perfluoroethoxyethanesulfonic acid anion, a 2,3,5,6-tetrafluoro-4-dodecyloxybenzenesulfonic acid anion, a p-toluenesulfonic acid anion, a pentafluorobenzenesulfonic acid anion and a camphorsulfonic acid anion.

The counter anion included in the compound of (Z) component together with the sulfonium cation represented by formula (Z-1) may be monovalent or have two or more valences. When the counter anion has two or more valences, the compound of (Z) component may include two or more sulfonium cations represented by formula (Z-1).

The content of the compound of (Z) component is preferably from 0.1 to 20% by weight, more preferably from 0.5 to 10% by weight, and still more preferably from 1 to 70% by weight, based on the total solid content of the positive resist composition.

The compound of (Z) component is an acid generator which generates an acid upon irradiation of an actinic ray or radiation.

Specific examples of the sulfonium salt (Z) represented by formula (Z-1) are set forth below, but the invention should not be construed as being limited thereto.

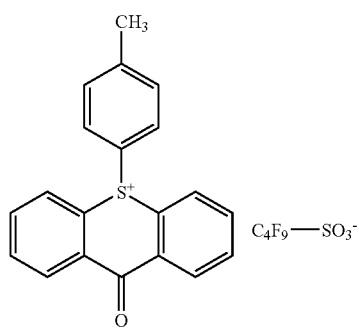

(Z-1)

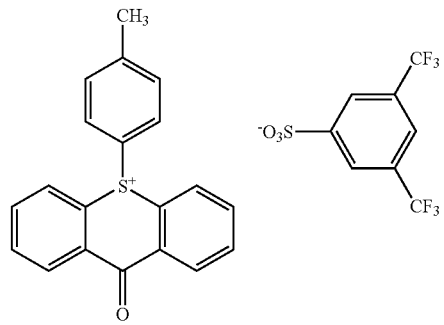

(Z-2)

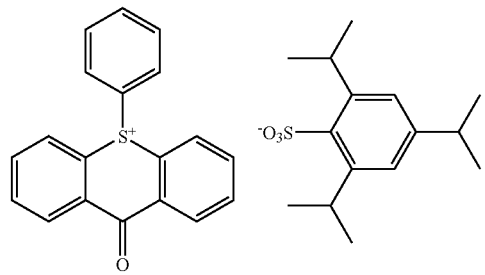

(Z-3)

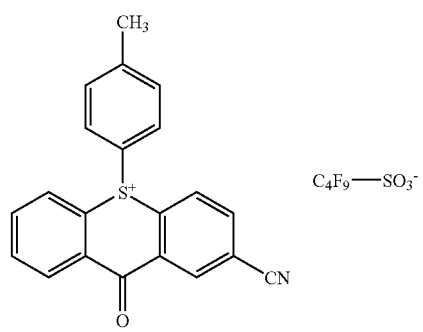

(Z-4)

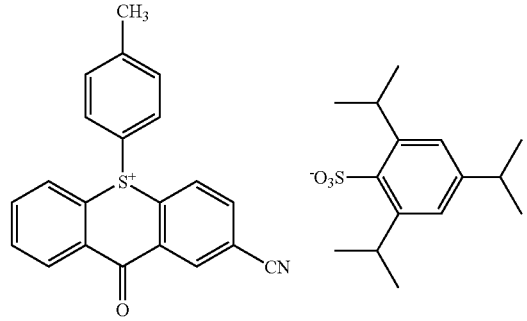

(Z-5)

-continued
(Z-6)
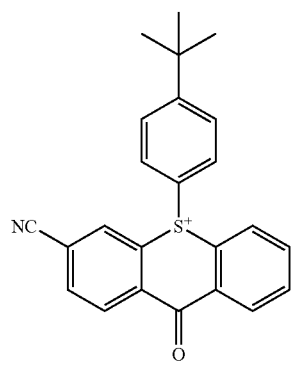
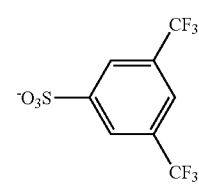
(Z-7)
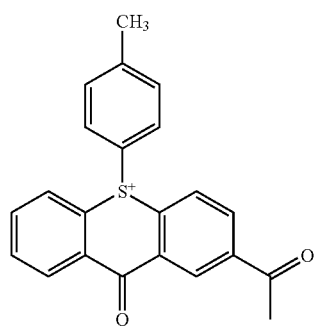
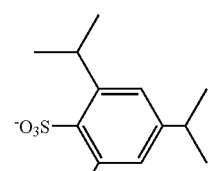
(Z-8)
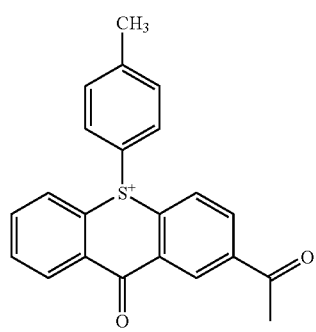
C$_4$F$_9$—SO$_3^-$
(Z-9)
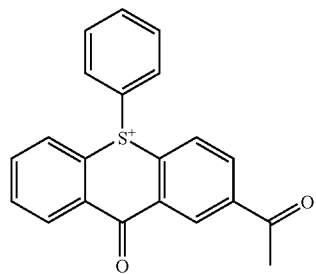
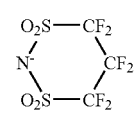
-continued
(Z-10)
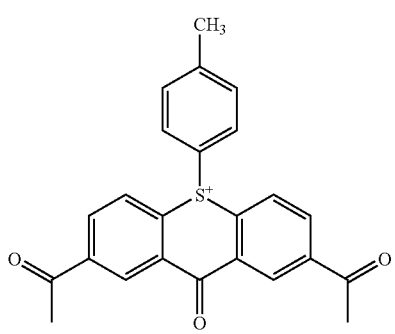
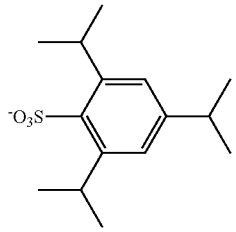
Z-11
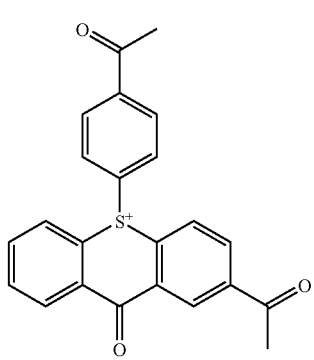
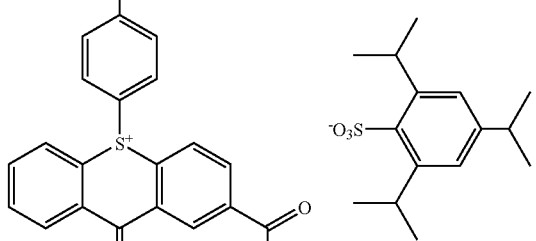
Z-12
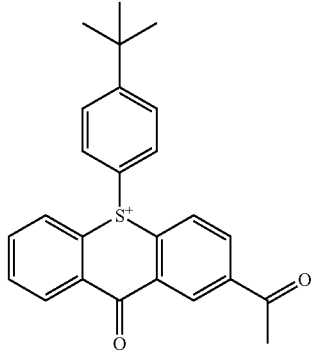
C$_4$F$_9$—SO$_3^-$
Z-13
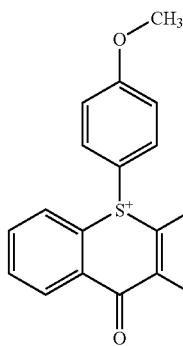

-continued
(Z-14)
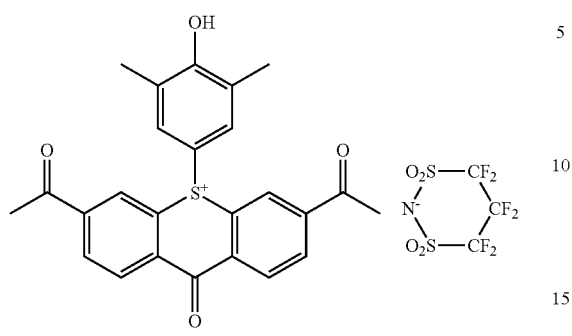
(Z-18)
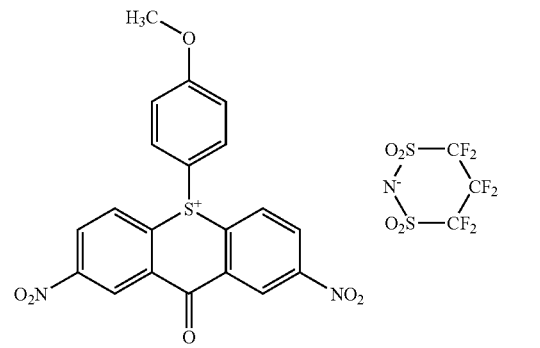
(Z-15)
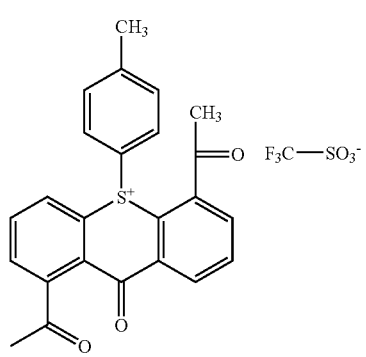
(Z-19)
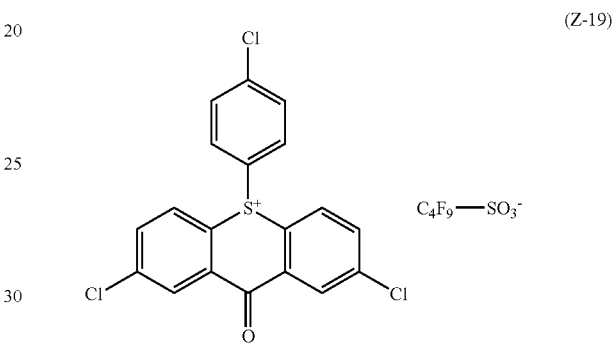
(Z-16)
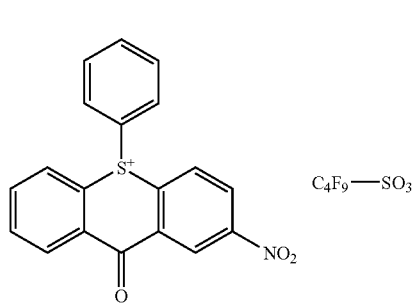
(Z-20)
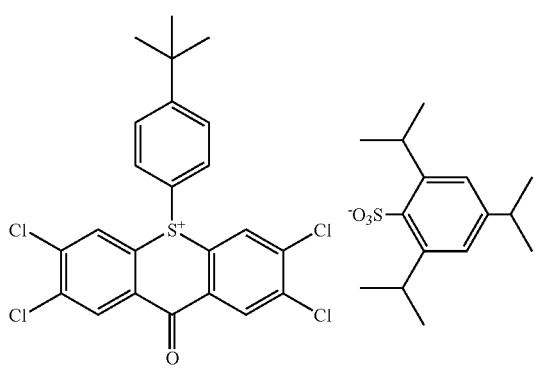
(Z-17)
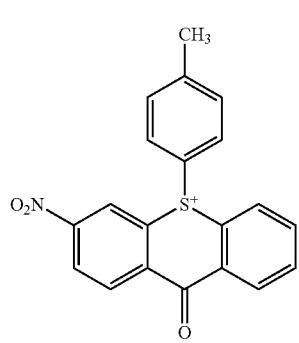
(Z-21)
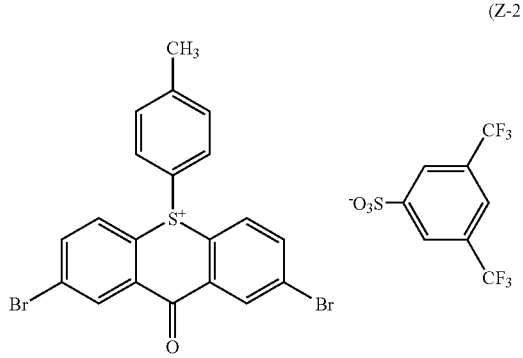

-continued
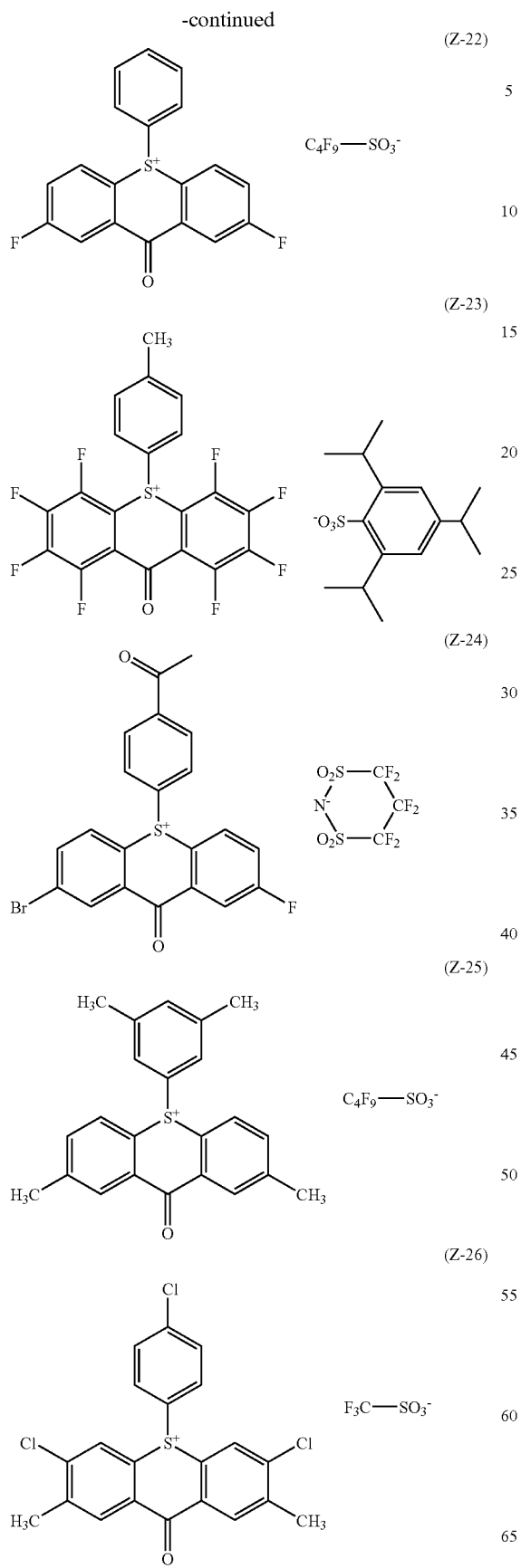
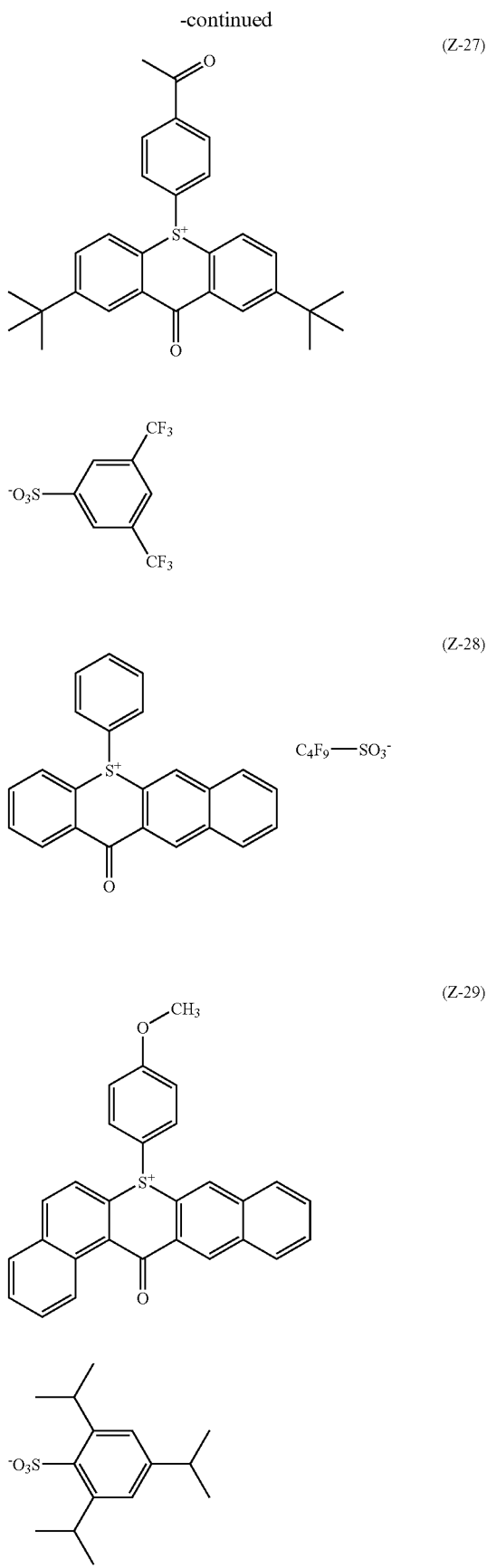

(Z-30)
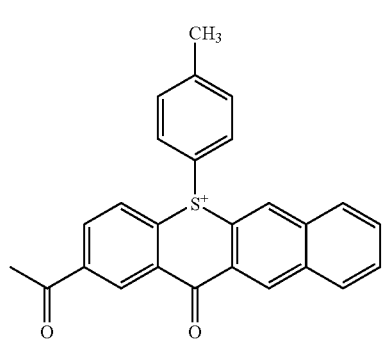
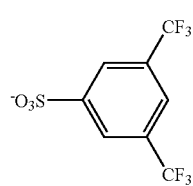
(Z-31)
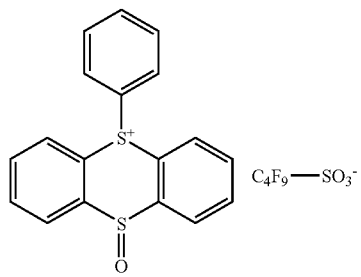
(Z-32)
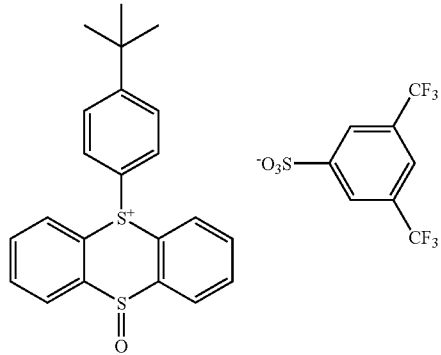
(Z-33)
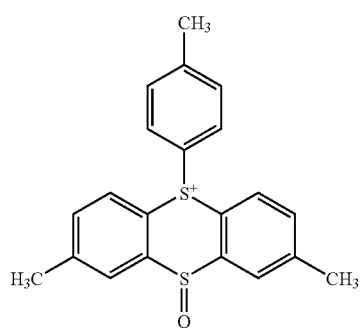
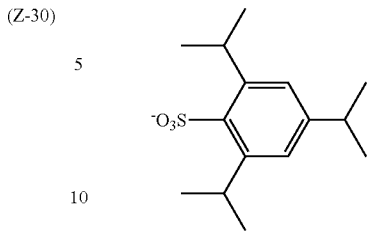
(Z-34)
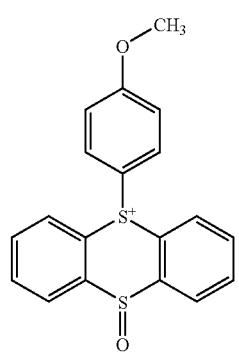
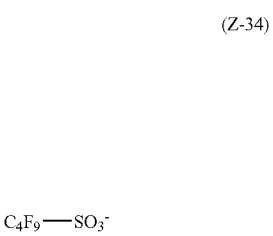
(Z-35)
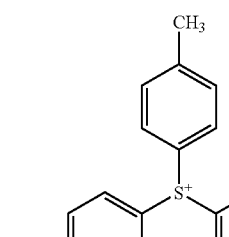
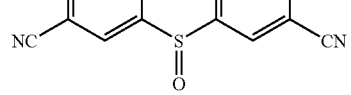
(Z-36)
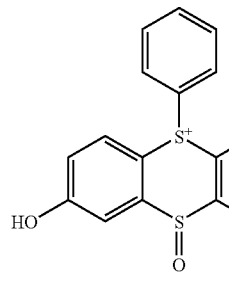

(Z-37)
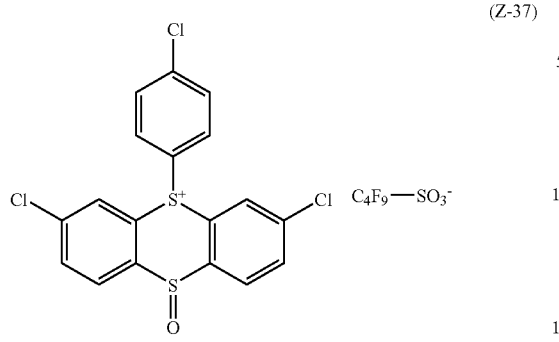
(Z-38)
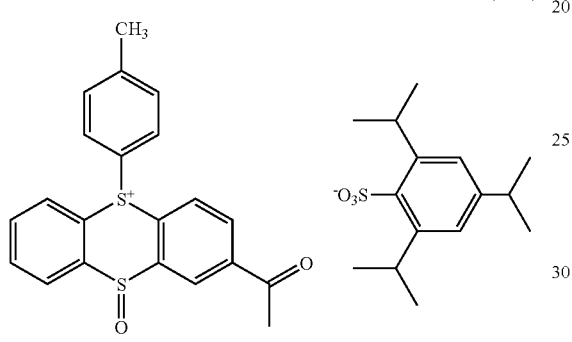
(Z-39)
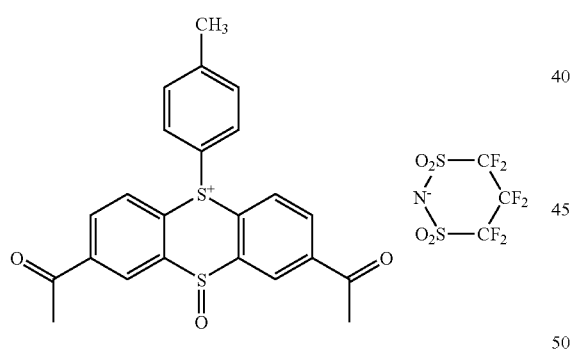
(Z-40)
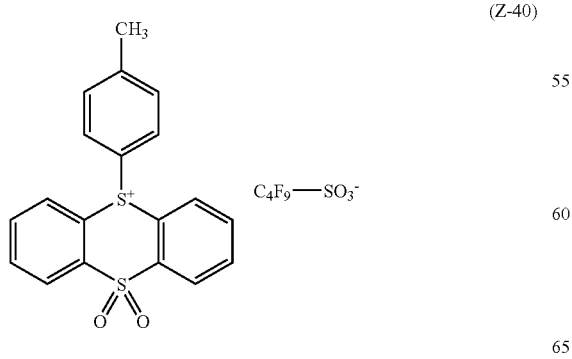
(Z-41)
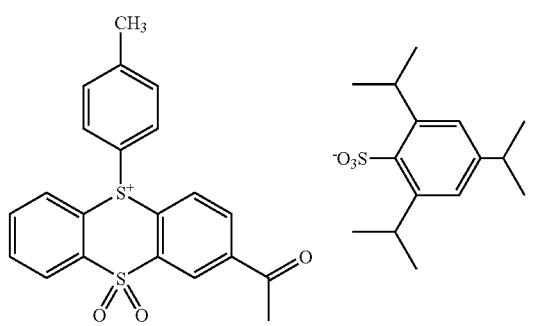
(Z-42)
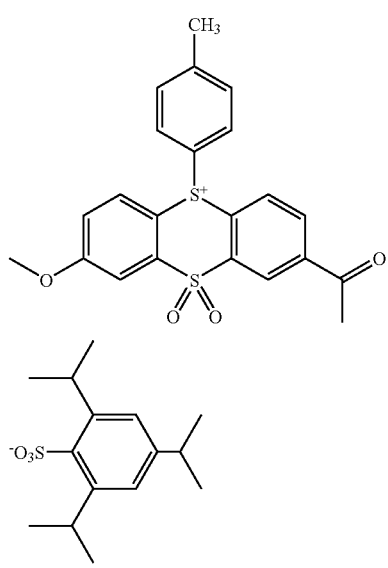
(Z-43)
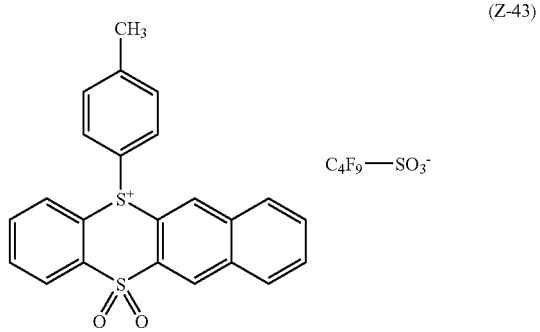
(Z-44)

-continued
(Z-45)
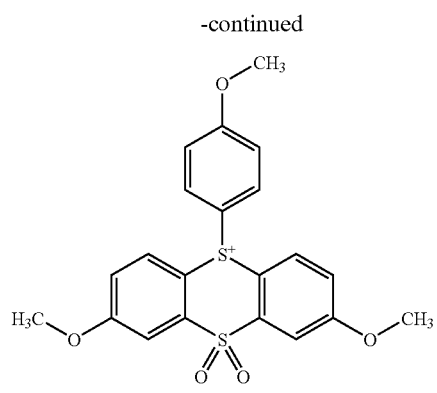
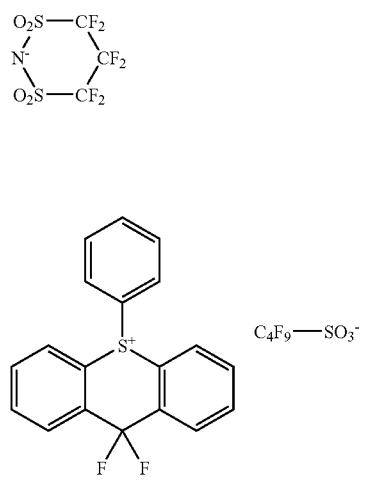
(Z-46)
(Z-47)
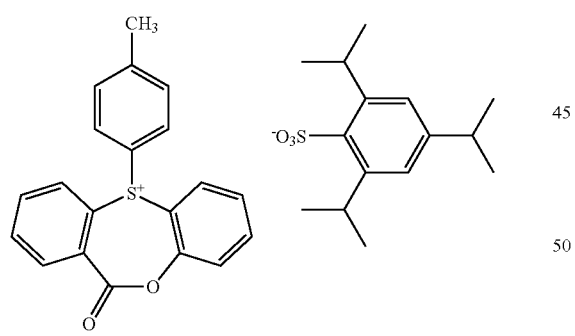
(Z-48)
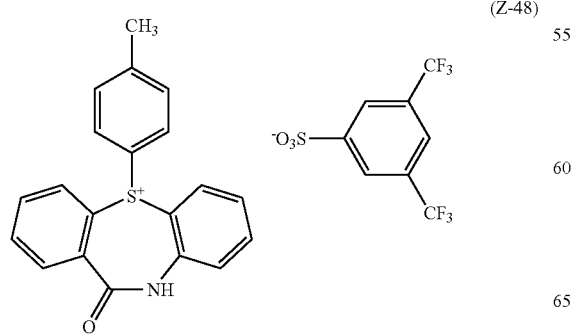
-continued
(Z-49)
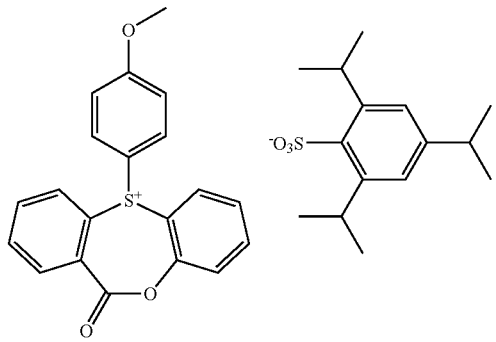
(Z-50)
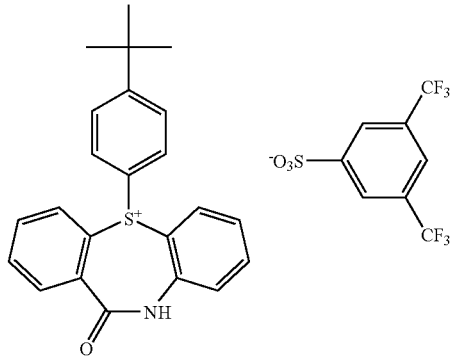
(Z-51)
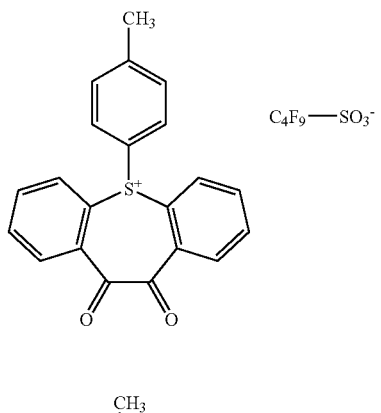
(Z-52)
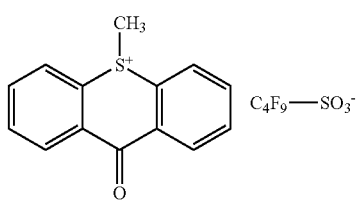
(Z-53)
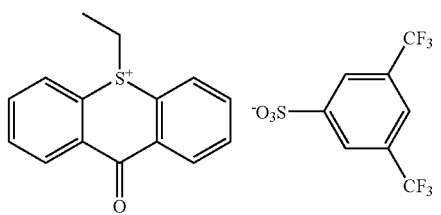

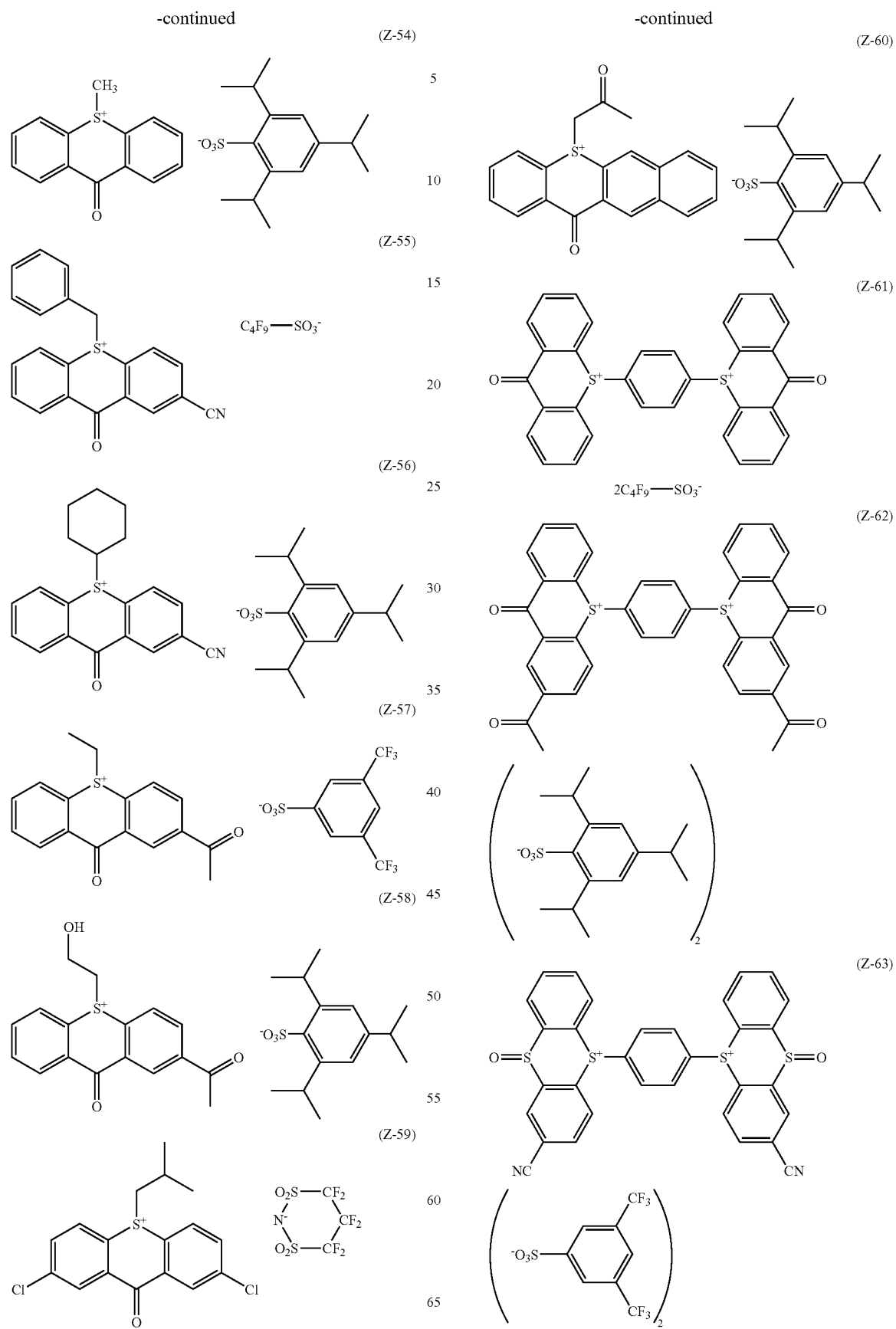

-continued
(Z-64)
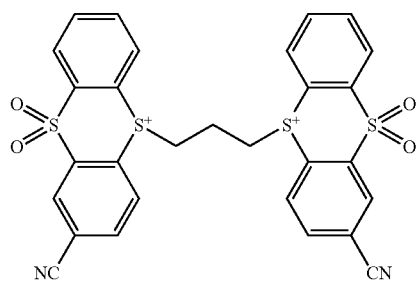
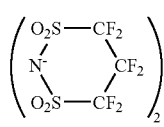
(Z-65)
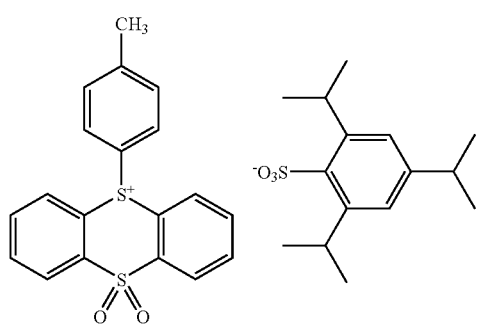
(Z-66)
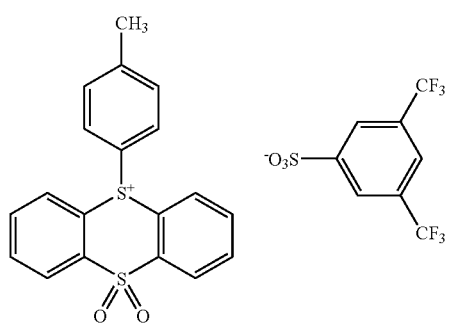
(Z-67)
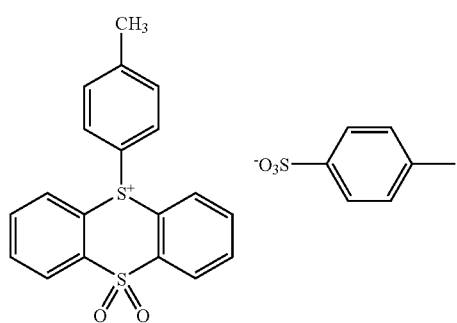
-continued
(Z-68)
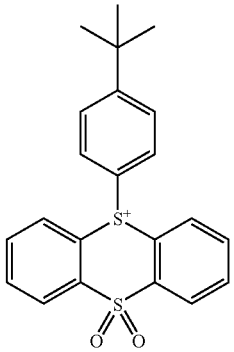
(Z-69)
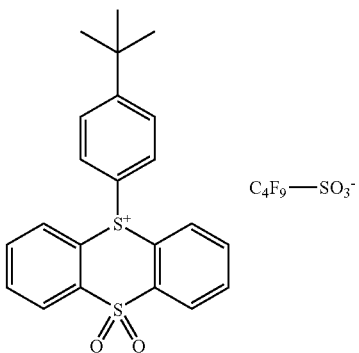
(Z-70)
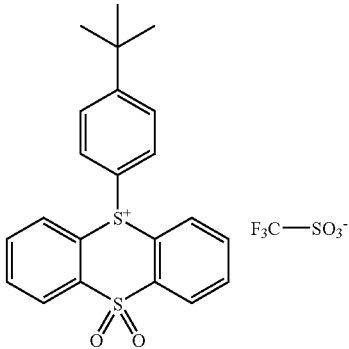
(Z-71)
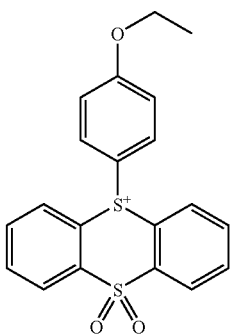
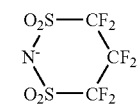

(Z-72)
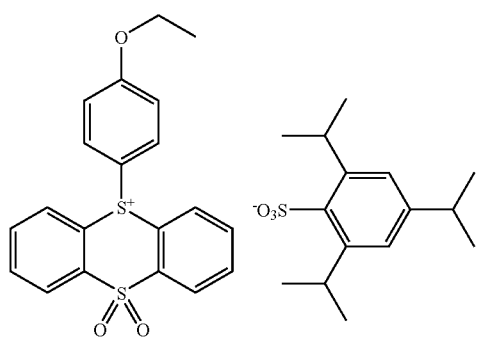
(Z-73)
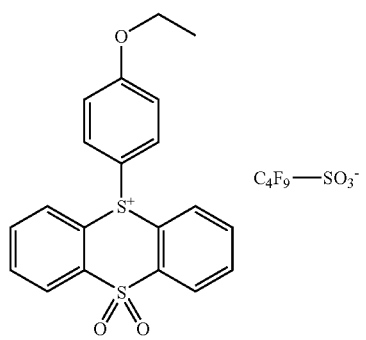
(Z-74)
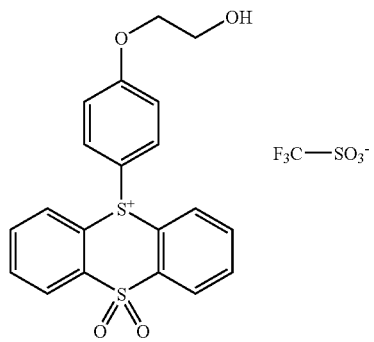
(Z-75)
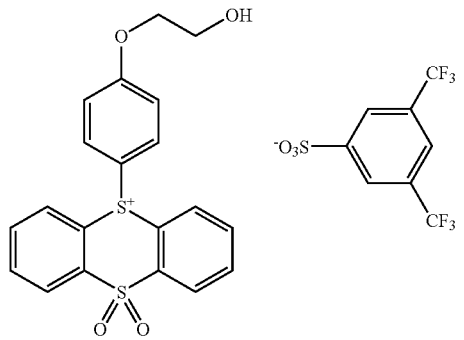
(Z-76)
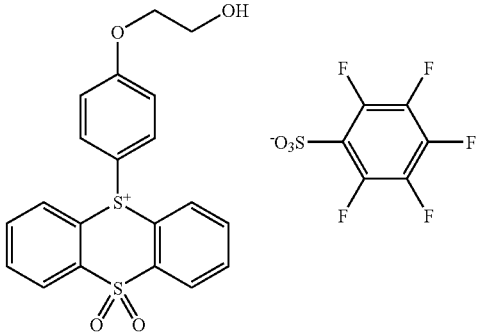
(Z-77)
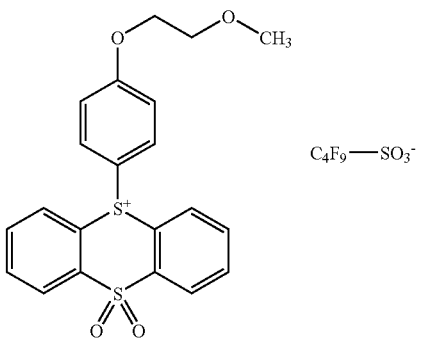
(Z-78)
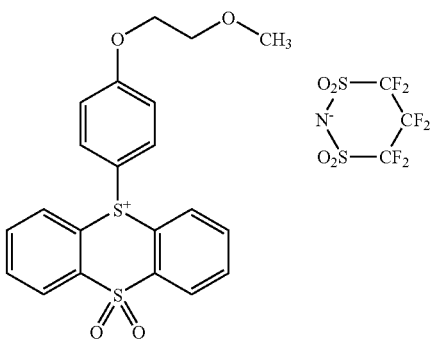
(Z-79)
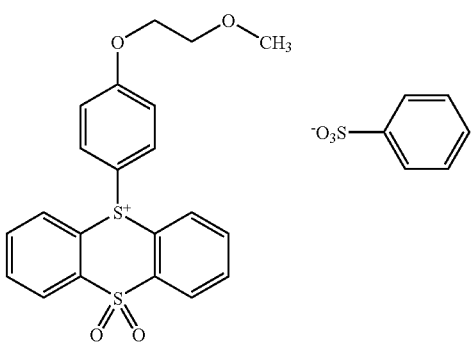

-continued
(Z-80)
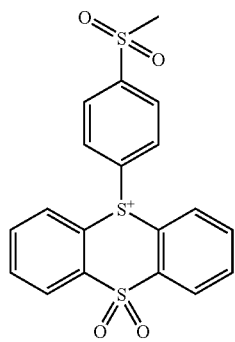 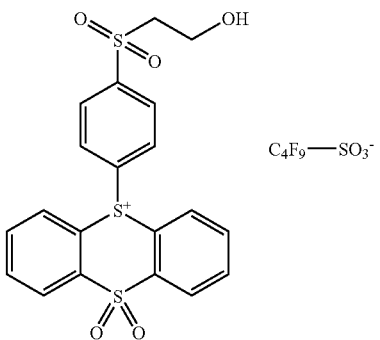
(Z-84)
(Z-81)
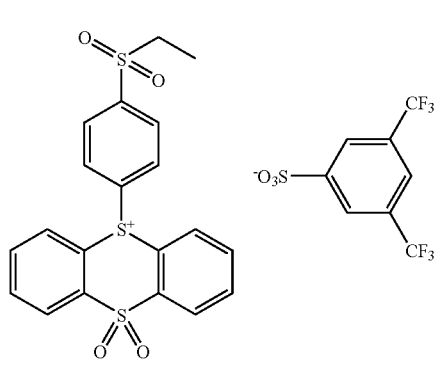 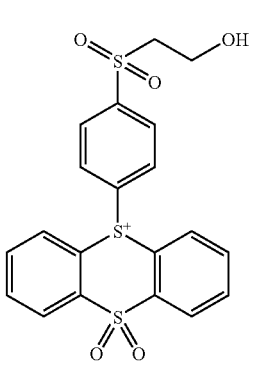
(Z-85)
(Z-82)
(Z-86)
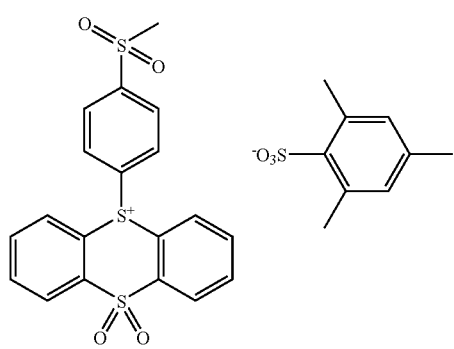 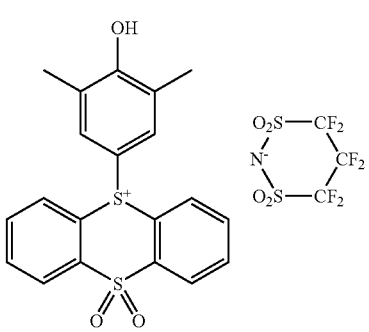
(Z-83)
(Z-87)
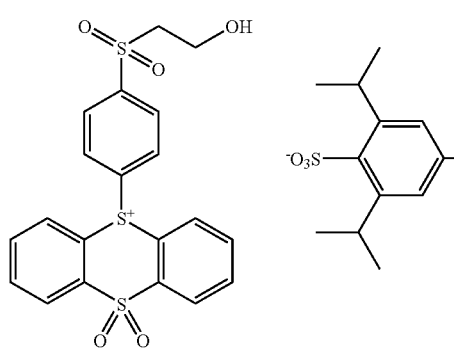 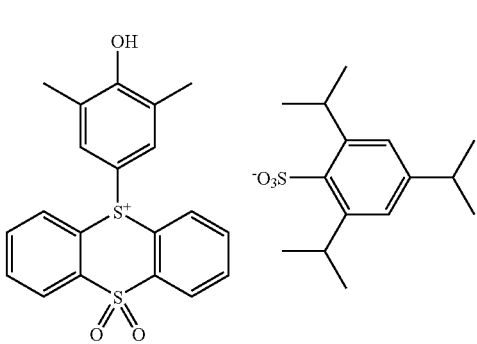

-continued
(Z-88)
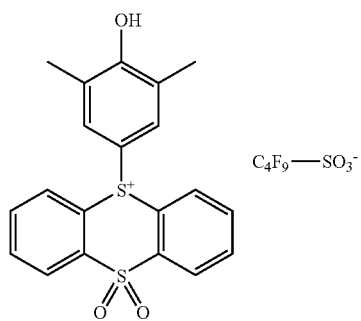
(Z-92)
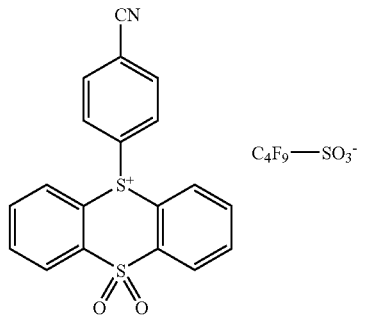
(Z-89)
(Z-93)
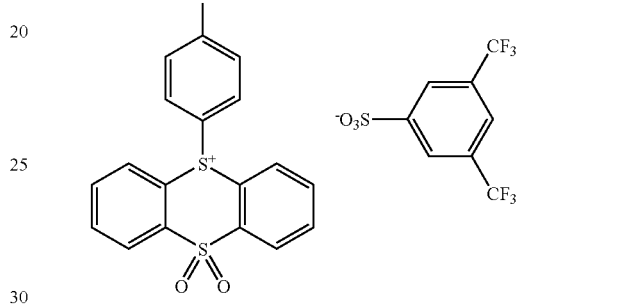
(Z-90)
(Z-94)
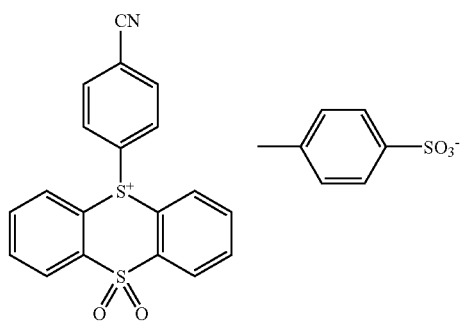
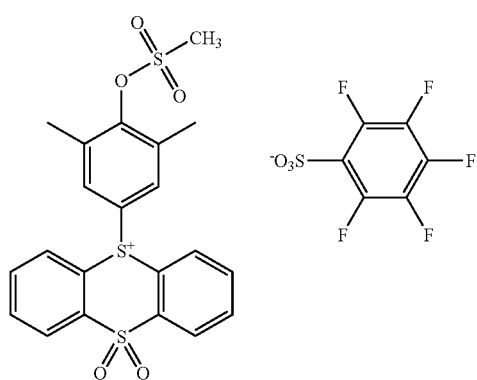
(Z-95)
(Z-91)
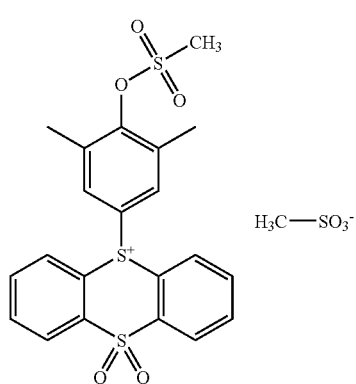
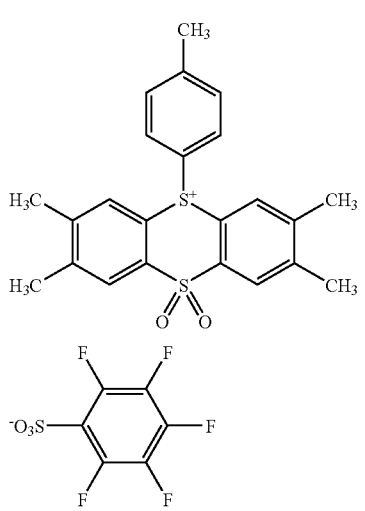

(Z-96) 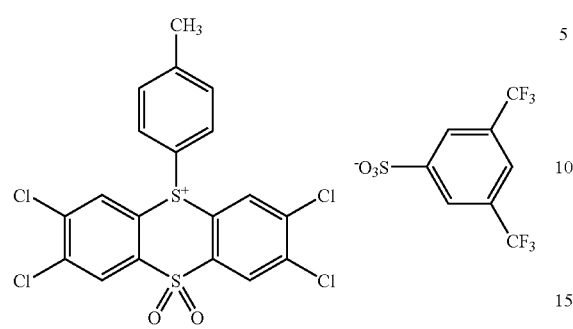 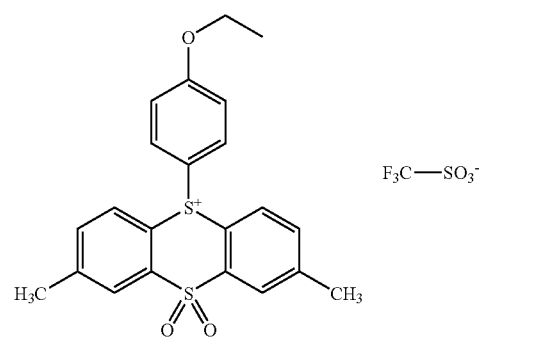
(Z-97) 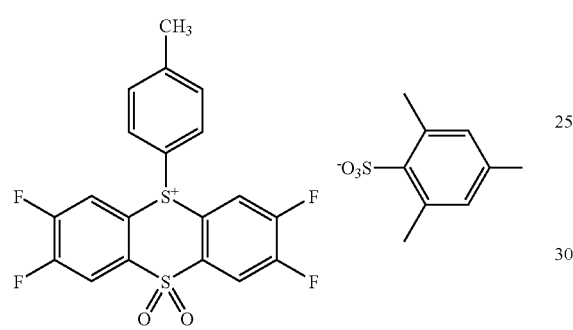
(Z-98) 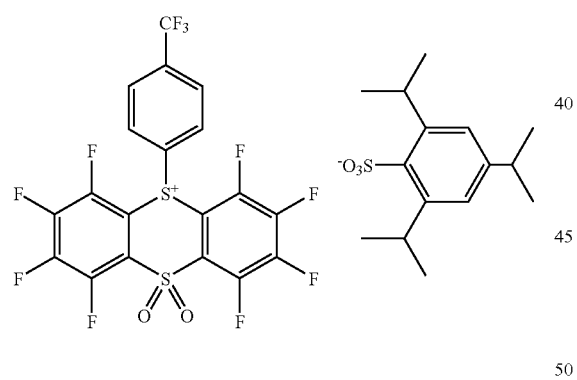
(Z-99) 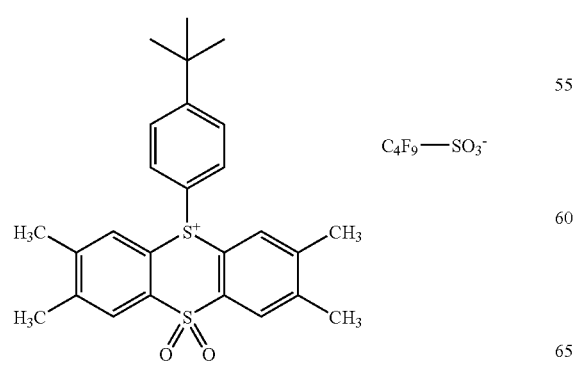
(Z-100) 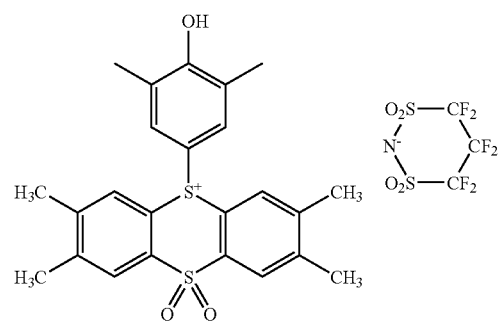
(Z-101) 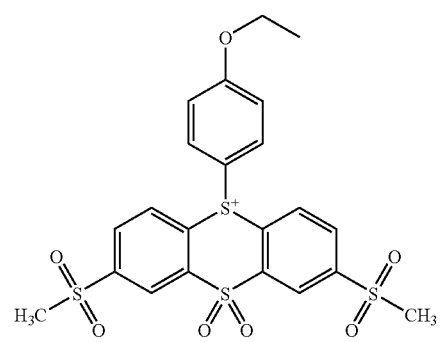
(Z-102) 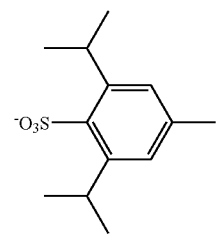

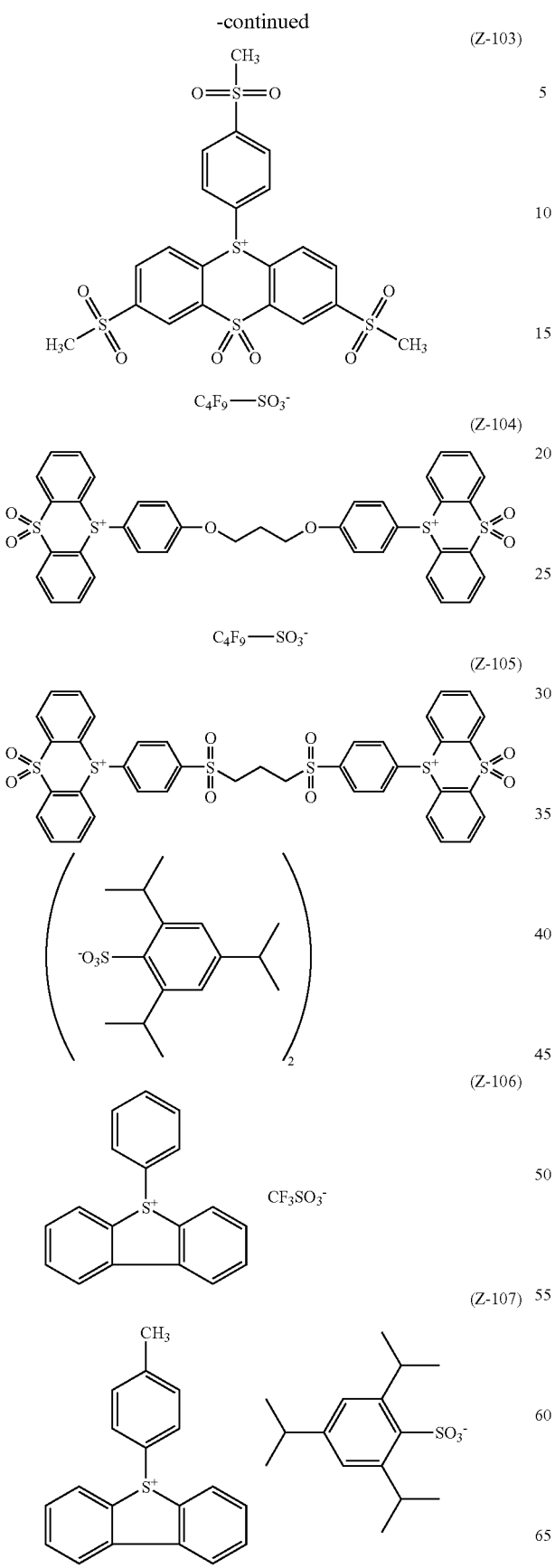
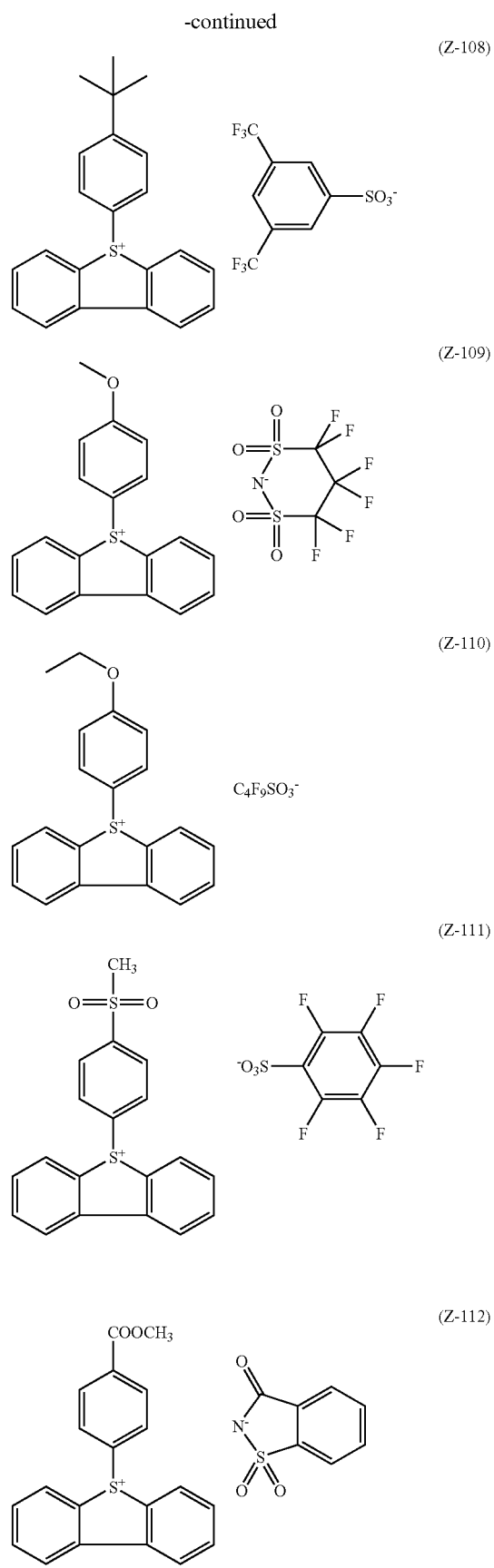

-continued
(Z-113)
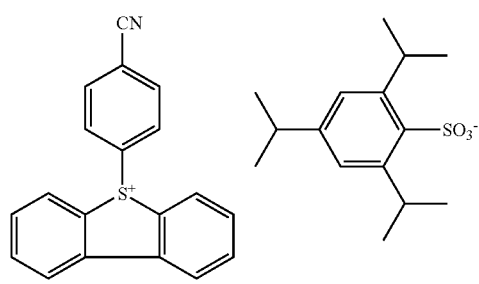
(Z-114)
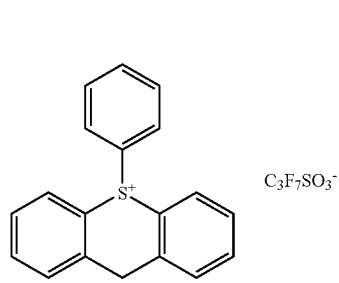
(Z-115)
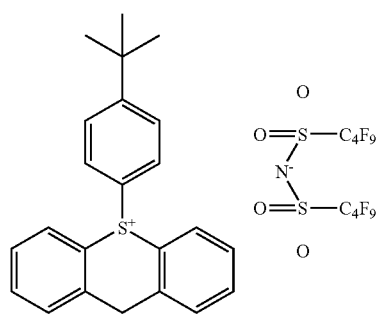
(Z-116)
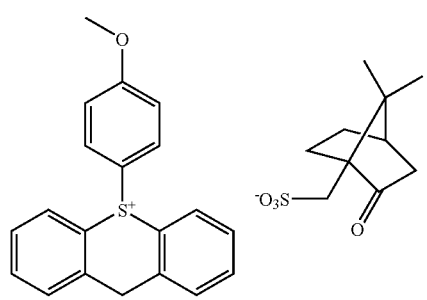
(Z-117)
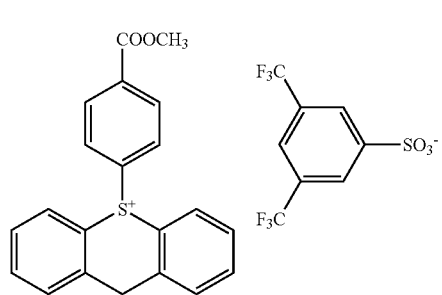
-continued
(Z-118)
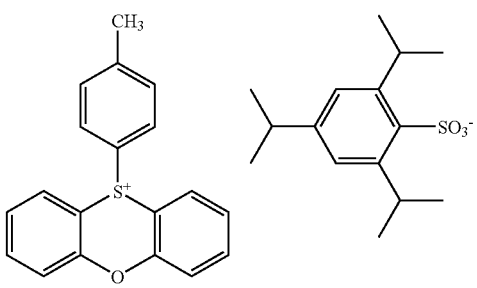
(Z-119)
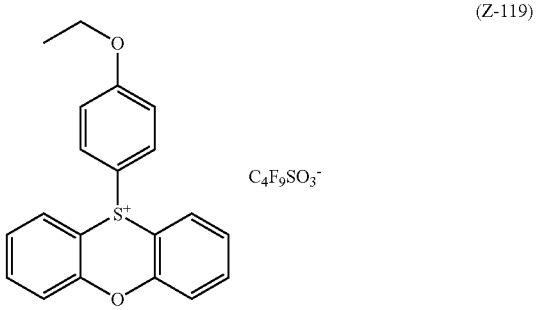
(Z-120)
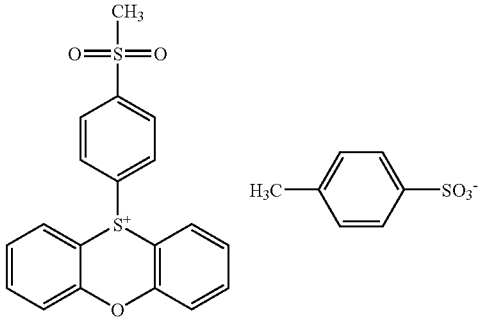
(Z-121)
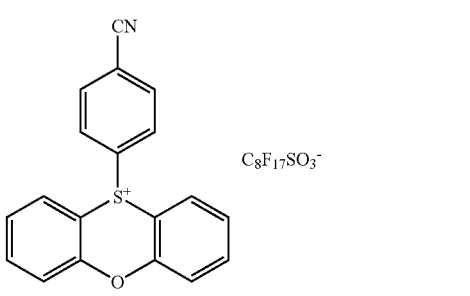
(Z-122)
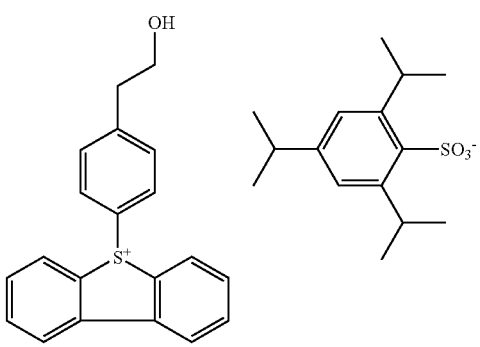

-continued

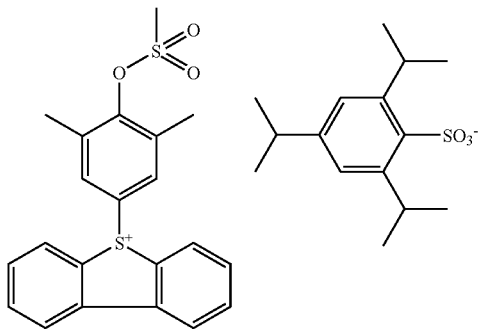

(Z-123)

[2] (A) Compound (Hereinafter Also Referred to as a "Compound (A)") Which Generates a Compound Having a Structure Represented by Formula (A-I) Shown Below Upon Irradiation of an Actinic Ray or Radiation $$Q-A-(X)_n—B—R \quad (A\text{-}I)$$

In formula (A-I), A represents a divalent connecting group, Q represents a sulfo group (—$SO_3H$) or a carboxyl group (—$CO_2H$), X represents —$SO_2$— or —CO—, n represents 0 or 1, B represents a single bond, an oxygen atom or —N($R_x$)—, and $R_x$ represents a hydrogen atom or a monovalent organic group.

The divalent connecting group for A is preferably a divalent connecting group having from 2 to 12 carbon atoms, including, for example, an alkylene group or a phenylene group. It is more preferably an alkylene group having at least one fluorine atom and preferably having from 2 to 6 carbon atoms, more preferably from 2 to 4 carbon atoms. The alkylene group may contain, in the alkylene chain, a connecting group, for example, an oxygen atom or a sulfur atom. Particularly, the alkylene group is preferably an alkylene group in which from 30 to 100% by number of the hydrogen atom is replaced by a fluorine atom, more preferably an alkylene group in which the carbon atom bonded to the Q moiety has a fluorine atom. It is still more preferably a perfluoroalkylene group, and yet still more preferably a perfluoroethylene group, a perfluoropropylene group or a perfluorobutylene group.

The monovalent organic group for $R_x$ preferably has from 4 to 30 carbon atoms and includes, for example, an alkyl group, a cycloalkyl group, an aryl group, an aralkyl group and an alkenyl group.

The alkyl group for Rx may have a substituent, is preferably a straight chain or branched alkyl group having from 1 to 20 carbon atoms and may contain, in the alkyl chain, an oxygen atom, a sulfur atom or a nitrogen atom. Specific examples thereof include a straight chain alkyl group, for example, a methyl group, an ethyl group, a n-propyl group, a n-butyl group, a n-pentyl group, a n-hexyl group, a n-octyl group, a n-dodecyl group, a n-tetradecyl group or a n-octadecyl group and a branched alkyl group, for example, an isopropyl group, an isobutyl group, a tert-butyl group, a neopentyl group or a 2-ethylhexyl group.

The alkyl group having a substituent particularly includes a group in which a cycloalkyl group is substituted to a straight chain or branched alkyl group (for example, an adamantylmethyl group, an adamantylethyl group, a cyclohexylethyl group or a camphor residue).

The cycloalkyl group for $R_x$ may have a substituent, is preferably a cycloalkyl group having from 3 to 20 carbon atoms and may contain, in the ring, an oxygen atom. Specific examples thereof include a cyclopropyl group, a cyclopentyl group, a cyclohexyl group, a norbornyl group and an adamantyl group.

The aryl group for $R_x$ may have a substituent, is preferably an aryl group having from 6 to 14 carbon atoms, and examples thereof include a phenyl group and a naphthyl group.

The aralkyl group for $R_x$ may have a substituent, is preferably an aralkyl group having from 7 to 20 carbon atoms, and examples thereof include a benzyl group, a phenethyl group, a naphthylmethyl group and a naphthylethyl group.

The alkenyl group for $R_x$ may have a substituent, and includes a group having a double bond at an appropriate position of the alkyl group described for $R_x$.

R represents a monovalent organic group including a proton acceptor functional group or a monovalent organic group including an ammonium group. The term "proton acceptor functional group" as used herein means a functional group having a group capable of electrostatically interacting with a proton or an electron, and includes, for example, a functional group including a macrocyclic structure, for example, a cyclic polyether and a functional group containing a nitrogen atom having a lone electron pair which does not contribute to π-conjugation. The nitrogen atom having a lone electron pair which does not contribute to π-conjugation includes, for example, a nitrogen atom having a partial structure represented by any one of the following formulae:

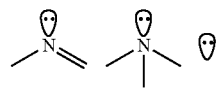

represents an unshared electron pair

Preferable examples of the partial structure of the proton acceptor functional group include a crown ether structure, an aza-crown ether structure, a tertiary amine structure, a secondary amine structure, a primary amine structure, a pyridine structure, an imidazole structure and a pyrazine structure. Preferable examples of the partial structure of the ammonium group include a tertiary ammonium structure, a secondary ammonium structure, a primary ammonium structure, a pyridinium structure, an imidazolinium structure and a pyrazinium structure. The number of carbon atoms included therein is preferably from 4 to 30. Examples of the group which contain such a structure include an alkyl group, a cycloalkyl group, an aryl group, an aralkyl group and an alkenyl group.

The alkyl group, cycloalkyl group, aryl group, aralkyl group and alkenyl group included in the alkyl group, cycloalkyl group, aryl group, aralkyl group and alkenyl group including the proton acceptor functional group or the ammonium group for R are same as the alkyl group, cycloalkyl group, aryl group, aralkyl group and alkenyl group described for $R_x$, respectively.

Examples of the substituent which the above-described groups each may have include a halogen atom, a hydroxy group, a nitro group, a cyano group, a carboxyl group, a carbonyl group, a cycloalkyl group (preferably having from 3 to 10 carbon atoms), an aryl group (preferably having from 6 to 14 carbon atoms), an alkoxy group (preferably having from 1 to 10 carbon atoms), an acyl group (preferably having from 2 to 20 carbon atoms), an acyloxy group (preferably having from 2 to 10 carbon atoms), an alkoxycarbonyl group (preferably having from 2 to 20 carbon atoms) and an aminoacyl group (preferably having from 2 to 20 carbon atoms). With respect to the cyclic structure in the aryl group, cycloalkyl group and the like, the examples of the substituent further include an alkyl group (preferably having from 1 to 20 carbon atoms). The aminoacyl group may further have one or two alkyl groups (preferably each having from of 1 to 20 carbon atoms) as a substituent.

When B represents —N($R_x$)—, R and $R_x$ are preferably combined with each other to form a ring. By forming the ring structure, the stability is increased and the composition using the compound is also improved in the preservation stability. The number of carbon atoms constituting the ring is preferably from 4 to 20, and the ring may be monocyclic or polycyclic and may contain, in the ring, an oxygen atom, a sulfur atom or a nitrogen atom.

Examples of the monocyclic structure include a 4-membered ring, a 5-membered ring, a 6-membered ring, a 7-membered ring and a 8-membered ring each containing a nitrogen atom. Examples of the polycyclic structure include a structure comprising a combination of two monocyclic structures or a combination of three or more monocyclic structures. The monocyclic structure and polycyclic structure each may have a substituent, and preferable examples of the substituent include a halogen atom, a hydroxy group, a cyano group, a carboxyl group, a carbonyl group, a cycloalkyl group (preferably having from 3 to 10 carbon atoms), an aryl group (preferably having from 6 to 14 carbon atoms), an alkoxy group (preferably having from 1 to 10 carbon atoms), an acyl group (preferably having from 2 to 15 carbon atoms), an acyloxy group (preferably having from 2 to 15 carbon atoms), an alkoxycarbonyl group (preferably having from 2 to 15 carbon atoms) and an aminoacyl group (preferably having from 2 to 20 carbon atoms). With respect to the cyclic structure in the aryl group, cycloalkyl group and the like, the examples of the substituent further include an alkyl group (preferably having from of 1 to 15 carbon atoms). The aminoacyl group may further have one or two alkyl groups (preferably each having from of 1 to 15 carbon atoms) as a substituent.

Of the compounds represented by formula (A-I), compounds in which the Q moiety is a sulfonic acid are novel compounds.

The compound in which the Q moiety is a sulfonic acid among the compounds represented by formula (A-I) can be synthesized by using a conventional sulfonamidation reaction. For instance, the compound can be obtained by a method of selectively reacting one sulfonyl halide moiety of a bissulfonyl halide compound with an amine compound to form a sulfonamido bond and then hydrolyzing the other sulfonyl halide moiety, or a method of reacting a cyclic sulfonic anhydride with an amine compound to conduct ring opening.

Specific examples of the compound represented by formula (A-I) are set forth below, but the invention should not be construed as being limited thereto.

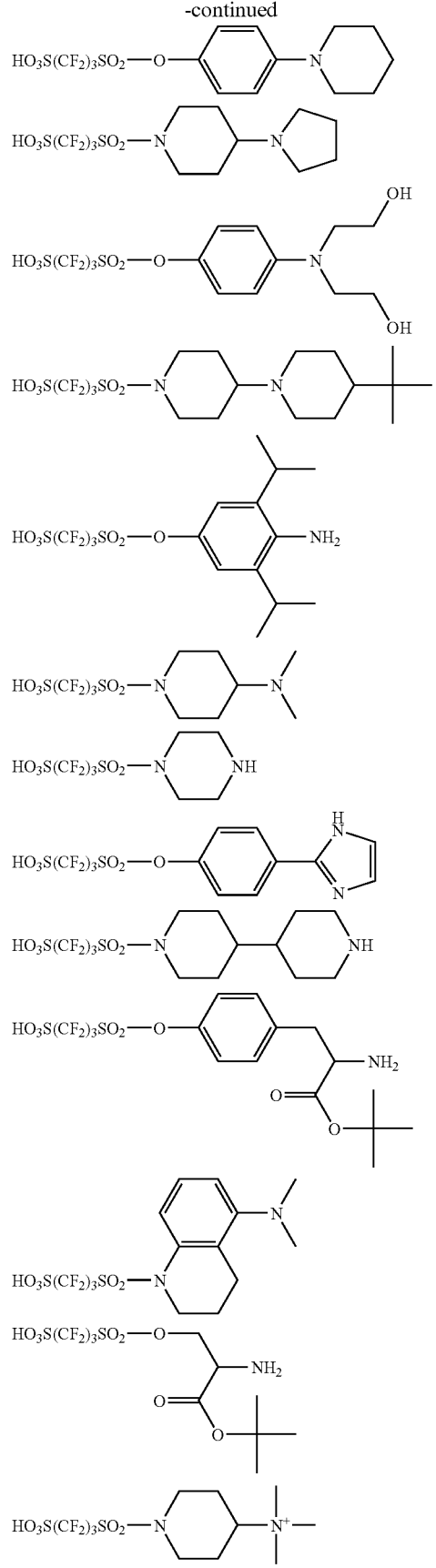

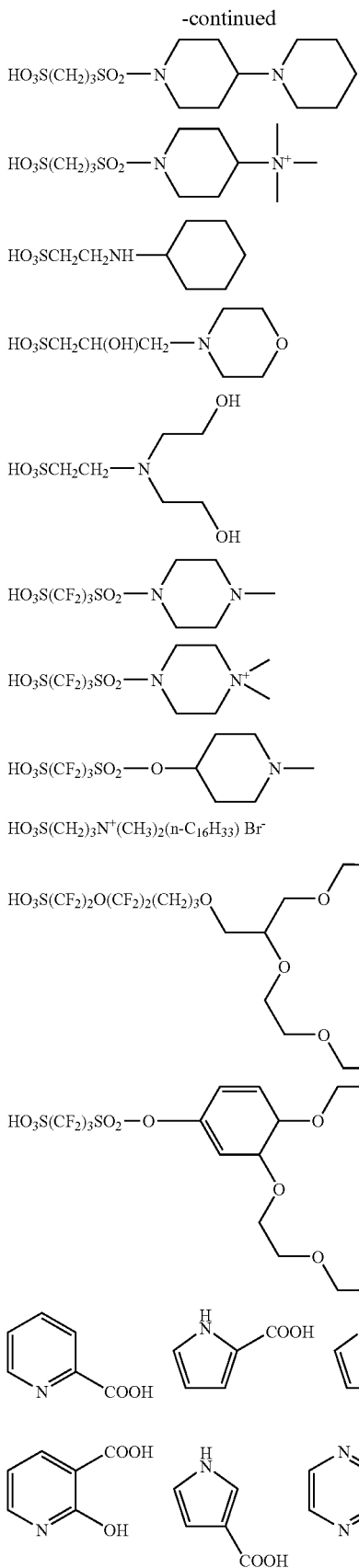

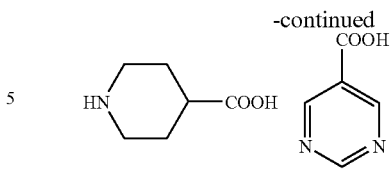

The compound (hereinafter also referred to as a "compound (A)") which generates a compound having a structure represented by formula (A-I) upon irradiation of an actinic ray or radiation is preferably a sulfonium salt compound of the compound having a structure represented by formula (A-I) or an iodonium salt compound of the compound having a structure represented by formula (A-I), and more preferably a compound having a structure represented by any one of the following formulae (A1) and (A2):

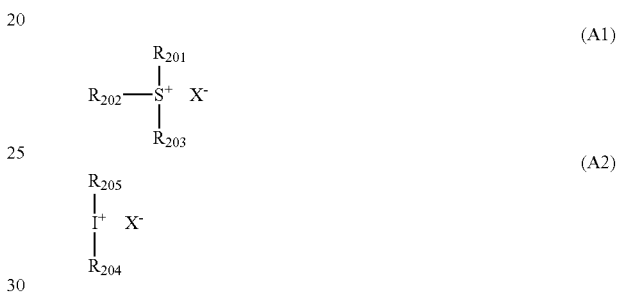

In formula (A1), $R_{201}$, $R_{202}$ and $R_{203}$ each independently represents an organic group.

$X^-$ represents a sulfonic acid anion or carboxylic acid anion which is formed by eliminating the hydrogen atom from the —$SO_3H$ moiety or —COOH moiety of the compound represented by formula (A-I).

A number of carbon atoms included in the organic group represented by any one of $R_{201}$, $R_{202}$ and $R_{203}$ is ordinarily from 1 to 30, and preferably from 1 to 20.

Alternatively, two of $R_{201}$ to $R_{203}$ may be combined with each other to from a ring structure, and the ring structure may include, in the ring, an oxygen atom, a sulfur atom, an ester bond, an amido bond or a carbonyl group. The group formed by combining two of $R_{201}$ to $R_{203}$ includes an alkylene group (for example, a butylene group or a pentylene group).

Specific examples of the organic group represented by any one of $R_{201}$, $R_{202}$ and $R_{203}$ include the corresponding groups in Compounds (A1a), (A1b) and (A1c) described below.

Compounds having two or more of the structures represented by formula (A1) may also be used. For example, a compound having a structure in which at least one of $R_{201}$ to $R_{203}$ in one compound represented by formula (A1) is connected to at least one of $R_{201}$ to $R_{203}$ in another compound represented by formula (A1).

As more preferable examples of the (A1) component, Compounds (A1a), (A1b) and (A1c) described below are exemplified.

Compound (A1a) is an arylsulfonium compound wherein at least one of $R_{201}$ to $R_{203}$ in formula (A1) is an aryl group, that is, a compound including an arylsulfonium as a cation.

In the arylsulfonium compound, all of $R_{201}$ to $R_{203}$ may be aryl groups, or a part of $R_{201}$ to $R_{203}$ may be an aryl group and the remainder may be an alkyl group or a cycloalkyl group.

Examples of the arylsulfonium compound include triarylsulfonium compounds, diarylalkylsulfonium compounds, diarylcycloalkylsulfonium compounds, aryldialkylsulfonium compounds, aryldicycloalkylsulfonium compounds and arylalkylcycloalkylsulfonium compounds.

As the aryl group in the arylsulfonium compound, a phenyl group or a naphthyl group is preferable and a phenyl group is more preferable. When the arylsulfonium compound has two or more aryl groups, the two or more aryl groups may be the same or different from each other.

The alkyl group which is included in the arylsulfonium compound, if desired, is preferably a straight chain or branched alkyl group having from 1 to 15 carbon atoms and includes, for example, a methyl group, an ethyl group, a propyl group, a n-butyl group, a sec-butyl group and a tert-butyl group.

The cycloalkyl group which is included in the arylsulfonium compound, if desired, is preferably a cycloalkyl group having from 3 to 15 carbon atoms and includes, for example, a cyclopropyl group, a cyclobutyl group and a cyclohexyl group.

The aryl group, alkyl group or cycloalkyl group represented by any one of $R_{201}$ to $R_{203}$ may have as a substituent, for example, an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxy group or a phenylthio group. Preferable examples of the substituent include a straight chain or branched alkyl group having from 1 to 12 carbon atoms, a cycloalkyl group having from 3 to 12 carbon atoms and a straight chain, branched or cyclic alkoxy group having from 1 to 12 carbon atoms. An alkyl group having from 1 to 4 carbon atoms and an alkoxy group having from 1 to 4 carbon atoms are most preferred. The substituent may be substituted on any one of $R_{201}$ to $R_{203}$ or the substituents may be substituted on all of $R_{201}$ to $R_{203}$. When any one of $R_{201}$ to $R_{203}$ represents an aryl group, the substituent is preferably substituted on the p-position of the aryl group.

Now, Compound (A1b) is described below.

Compound (A1b) is a compound wherein $R_{201}$ to $R_{203}$ in formula (A1) each independently represents an organic group which does not include an aromatic ring. The term "aromatic ring" as used herein also includes an aromatic ring containing a hetero atom.

The organic group which does not include an aromatic ring represented by any one of $R_{201}$ to $R_{203}$ is an organic group having ordinarily from 1 to 30 carbon atoms, and preferably from 1 to 20 carbon atoms.

$R_{201}$ to $R_{203}$ each independently preferably represents an alkyl group, a cycloalkyl group, an allyl group or a vinyl group, more preferably a straight chain, branched or cyclic 2-oxoalkyl group, a 2-oxocycloalkyl group or an alkoxycarbonylmethyl group, and most preferably a straight chain or branched 2-oxoalkyl group.

The alkyl group represented by any one of $R_{201}$ to $R_{203}$ may be straight chain or branched and preferably includes a straight chain or branched alkyl group having from 1 to 20 carbon atoms, for example, a methyl group, an ethyl group, a propyl group, a butyl group or a pentyl group. More preferable examples of the alkyl group include a straight chain or branched 2-oxoalkyl group and an alkoxycarbonylmethyl group.

The cycloalkyl group represented by any one of $R_{201}$ to $R_{203}$ preferably includes a cycloalkyl group having from 3 to 10 carbon atoms (for example, a cyclopentyl group, a cyclohexyl group or a norbornyl group). More preferable examples of the cycloalkyl group represented by any one of $R_{201}$ to $R_{203}$ include a 2-oxocycloalkyl group.

The straight chain or branched 2-oxoalkyl group for any one of $R_{201}$ to $R_{203}$ may have a double bond in the chain, and preferably includes a 2-oxoalkyl group in which $>C=O$ is present at the 2-position of each of the above-described alkyl group.

The 2-oxocycloalkyl group for any one of $R_{201}$ to $R_{203}$ may have a double bond in the ring, and preferably includes a 2-oxocycloalkyl group in which $>C=O$ is present at the 2-position of each of the above-described cycloalkyl group.

The alkoxy group of the alkoxycarbonylmethyl group represented by any one of $R_{201}$ to $R_{203}$ includes preferably an alkoxy group having from 1 to 5 carbon atoms (for example, a methoxy group, an ethoxy group, a propoxy group, a butoxy group or a pentoxy group).

The group represented by any one of $R_{201}$ to $R_{203}$ may further be substituted with a halogen atom, an alkoxy group (for example, an alkoxy group having from 1 to 5 carbon atoms), an alkoxycarbonyl group (for example, an alkoxycarbonyl group having from 1 to 5 carbon atoms), a hydroxy group, a cyano group or a nitro group.

Compound (A1c) is a compound represented by formula (A1c) shown below, and a compound containing a arylacylsulfonium salt structure.

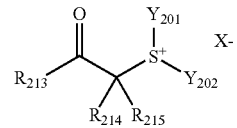

(A1c)

In formula (A1c), $R_{213}$ represents an aryl group which may have a substituent, and is preferably a phenyl group or a naphthyl group.

Preferable examples of the substituent of the aryl group represented by $R_{213}$ include an alkyl group, an alkoxy group, an acyl group, a nitro group, a hydroxy group, an alkoxycarbonyl group and a carboxyl group.

$R_{214}$ and $R_{215}$ each independently represents a hydrogen atom, an alkyl group or a cycloalkyl group.

$Y_{201}$ and $Y_{202}$ each independently represents an alkyl group, a cycloalkyl group, an aryl group or a vinyl group.

$X^-$ represents a sulfonic acid anion or carboxylic acid anion which is formed by eliminating the hydrogen atom from the $-SO_3H$ moiety or $-COOH$ moiety of the compound represented by formula (A-I).

$R_{213}$ and $R_{214}$ may be combined with each other to form a ring structure, $R_{214}$ and $R_{215}$ may be combined with each other to form a ring structure, and $Y_{201}$ and $Y_{202}$ may be combined with each other to form a ring structure. The ring structure formed may contain an oxygen atom, a sulfur atom, an ester bond or an amide bond. Examples of the group formed by combining each of $R_{213}$ and $R_{214}$, $R_{214}$ and $R_{215}$, and $Y_{201}$ and $Y_{202}$ include a butylene group and a pentylene group.

The alkyl group represented by any one of $R_{214}$, $R_{215}$, $Y_{201}$ and $Y_{202}$ is preferably a straight chain or branched alkyl group having from 1 to 20 carbon atoms. The alkyl group represented by any one of $Y_{201}$ and $Y_{202}$ is more preferably a 2-oxoalkyl group having $>C=O$ at the 2-position of the alkyl group, an alkoxycarbonylalkyl group (preferably including the alkoxy group having from 2 to 20 carbon atoms) or a carboxyalkyl group.

The cycloalkyl group represented by any one of $R_{214}$, $R_{215}$, $Y_{201}$ and $Y_{202}$ is preferably a cycloalkyl group having 3 to 20 carbon atoms.

$Y_{201}$ and $Y_{202}$ each preferably represents an alkyl group having 4 or more carbon atoms, more preferably from 4 to 6 carbon atoms, and still more preferably from 4 to 12 carbon atoms.

At least one of $R_{214}$ and $R_{215}$ preferably represents an alkyl group, and more preferably both $R_{214}$ and $R_{215}$ represent alkyl groups respectively.

In formula (A2), $R_{204}$ and $R_{205}$ each independently represents an aryl group, an alkyl group or a cycloalkyl group.

$X^-$ represents a sulfonic acid anion or carboxylic acid anion which is formed by eliminating the hydrogen atom from the —$SO_3H$ moiety or —COOH moiety of the compound represented by formula (A-I).

The aryl group represented by any one of $R_{204}$ and $R_{205}$ is preferably a phenyl group or a naphthyl group, and more preferably a phenyl group.

The alkyl group represented by any one of $R_{204}$ and $R_{205}$ may be either straight chain or branched and is preferably a straight chain or branched alkyl group having from 1 to 10 carbon atoms (for example, a methyl group, an ethyl group, a propyl group, a butyl group or a pentyl group).

The cycloalkyl group represented by any one of $R_{204}$ and $R_{205}$ is preferably a cycloalkyl group having from 3 to 10 carbon atoms (for example, a cyclopentyl group, a cyclohexyl group or a norbornyl group).

The group represented by any one of $R_{204}$ and $R_{205}$ may have a substituent, and examples of the substituent which any one of $R_{204}$ and $R_{205}$ may have include an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxy group and a phenylthio group.

The compound which generates a compound represented by formula (A-I) upon irradiation of an actinic ray or radiation is preferably the compound represented by formula (A1), more preferably the compound represented by any one of formulae (A1a) to (A1c).

Examples of the compound including a proton acceptor functional group and producing a sulfonic acid group or carboxylic acid group upon irradiation of an actinic ray or radiation to reduce or lose the acceptor property or to change the proton acceptor functional group to be acidic for use in the invention include a compound where in the compound represented by formula (A1) or (A2), R of the compound represented by formula (A-I) for $X^-$ is a monovalent organic group containing a proton acceptor functional group.

The terminology "reduction in the acceptor property" as used herein means that when a noncovalent bond complex as a proton adduct is produced from a proton acceptor functional group-containing compound and a proton, the equilibrium constant at the chemical equilibrium decreases.

Specific examples of the compound having a proton acceptor functional group and producing a sulfonic acid group upon irradiation with actinic rays or radiation to reduce or lose the acceptor property or to change the proton acceptor functional group to be acidic, and the compound which generates an organic acid represented by formula (A-I) upon irradiation of an actinic ray or radiation are set forth below, but the invention should not be construed as being limited thereto.

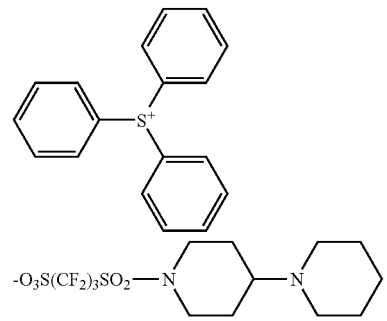

(A-1)

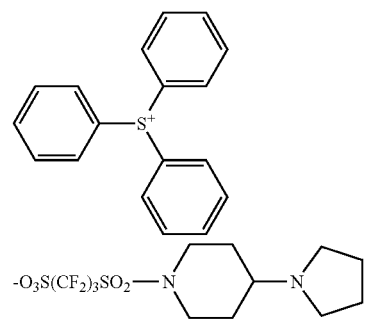

(A-2)

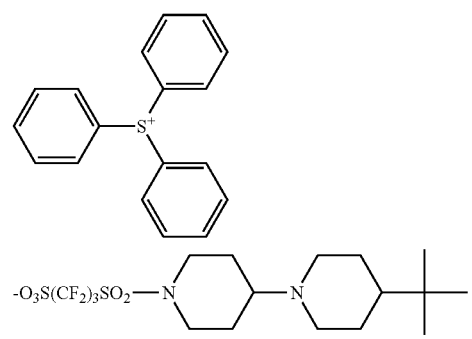

(A-3)

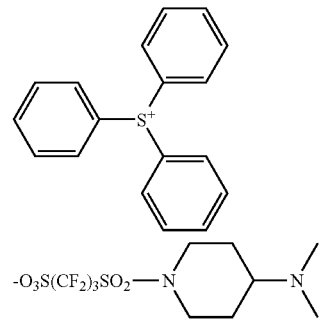

(A-4)

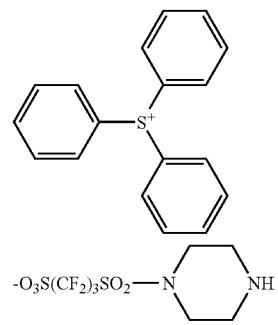

(A-5)

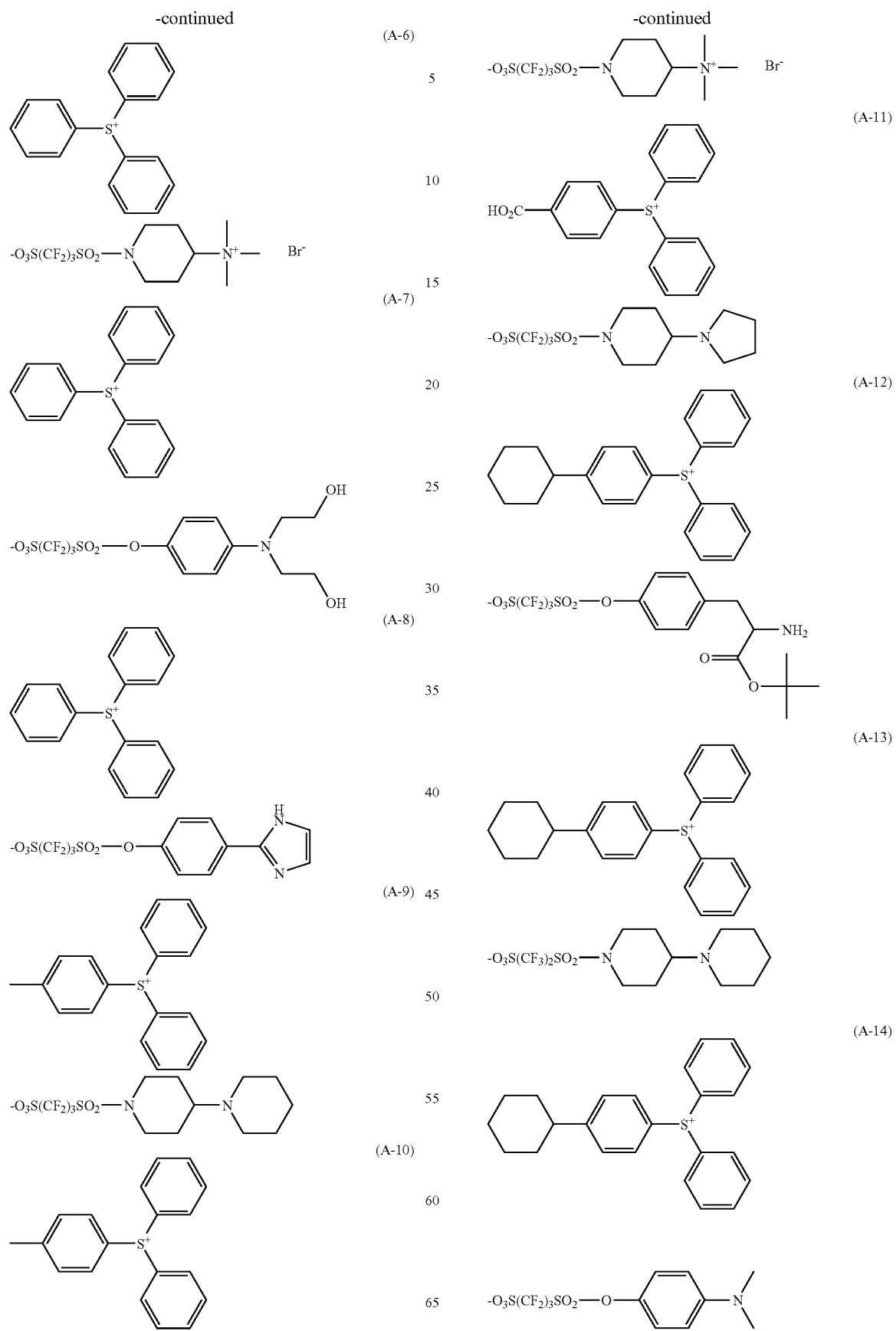

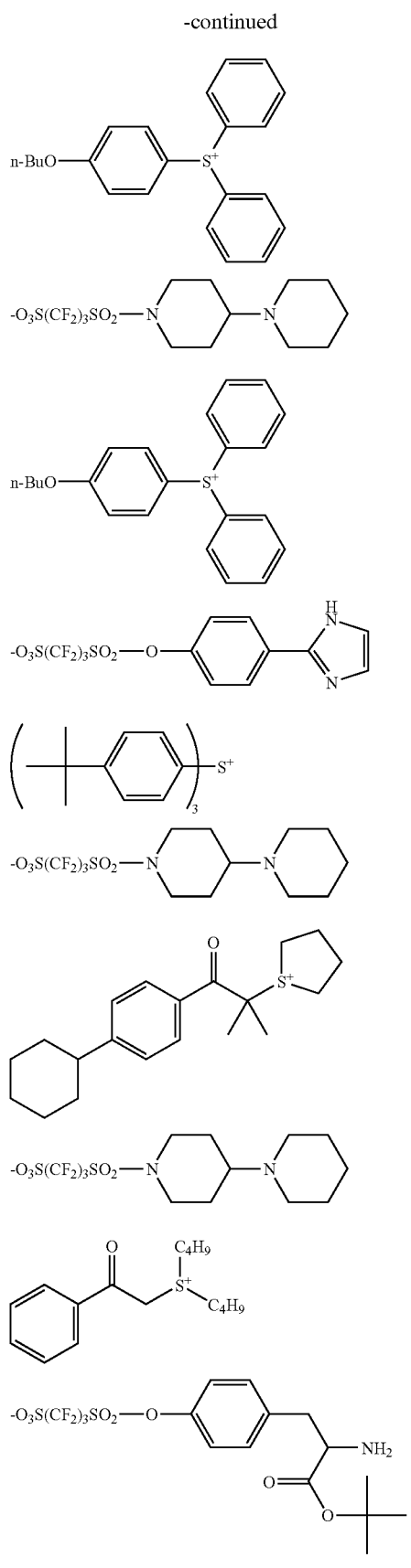
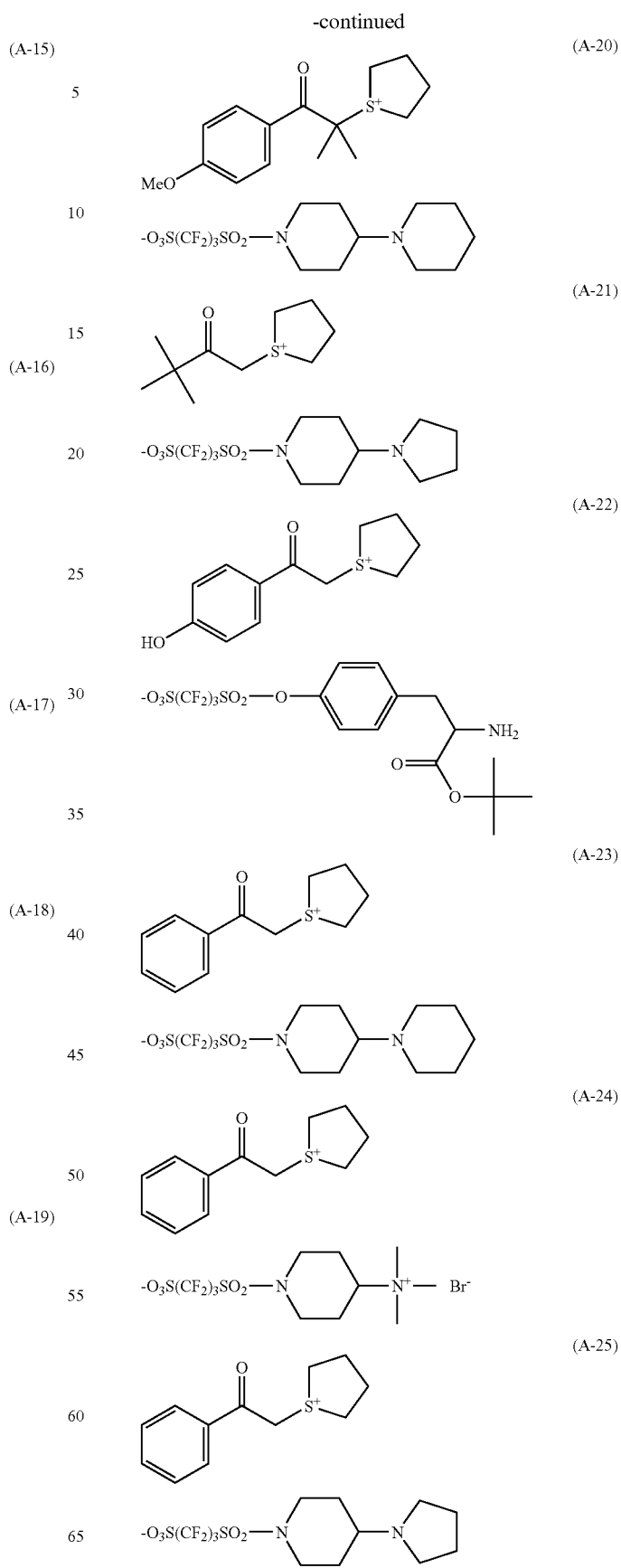

-continued
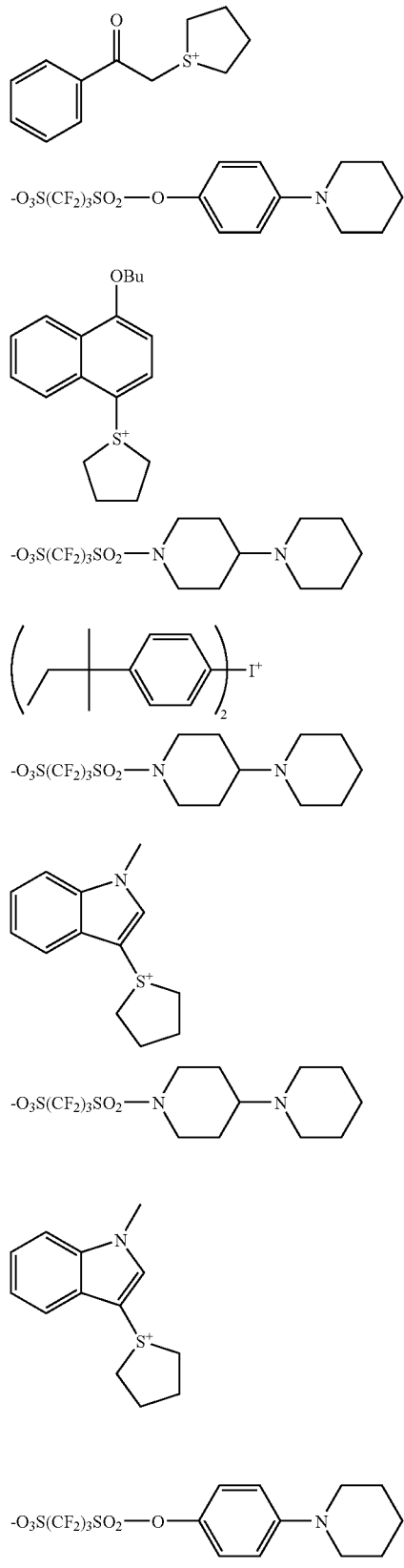
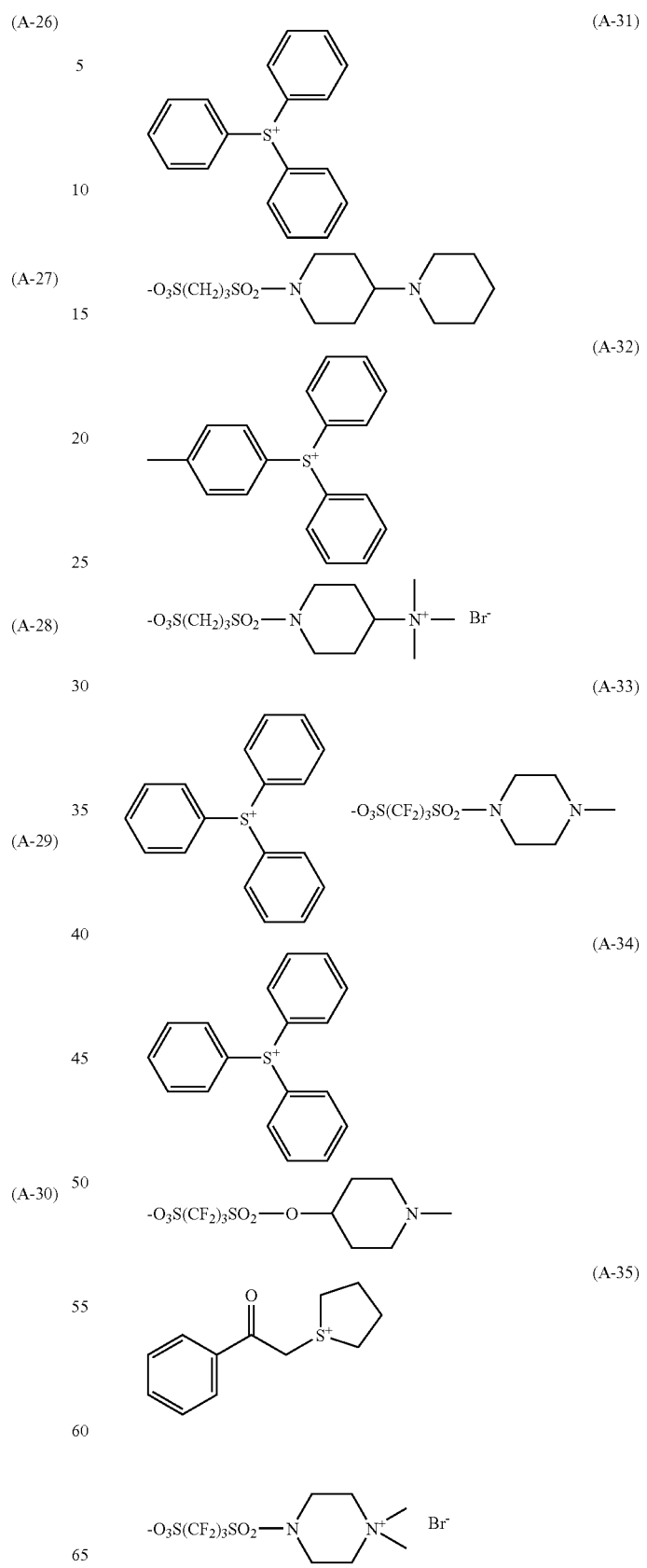

-continued
(A-36)
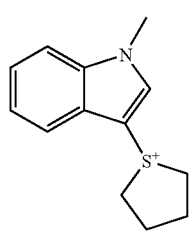 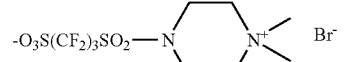
(A-37)
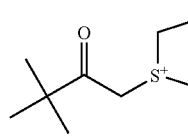 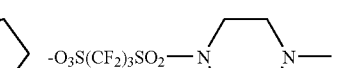
(A-38)
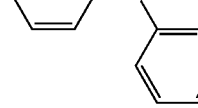 
(A-39)
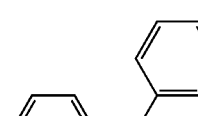 
(A-40)
(A-41)
-continued
(A-42)
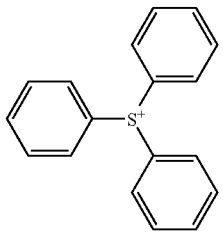
(A-43)
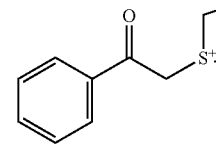
$^-O_3S(CH_2)_3N^+(CH_3)_2(n\text{-}C_{16}H_{33})$  Br$^-$
(A-44)
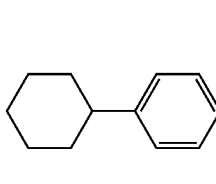
$^-O_3SCH_2CH_2NH$—cyclohexyl
(A-45)
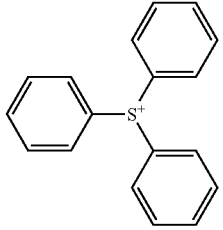
(A-46)
(A-47)
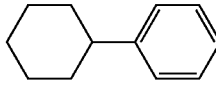

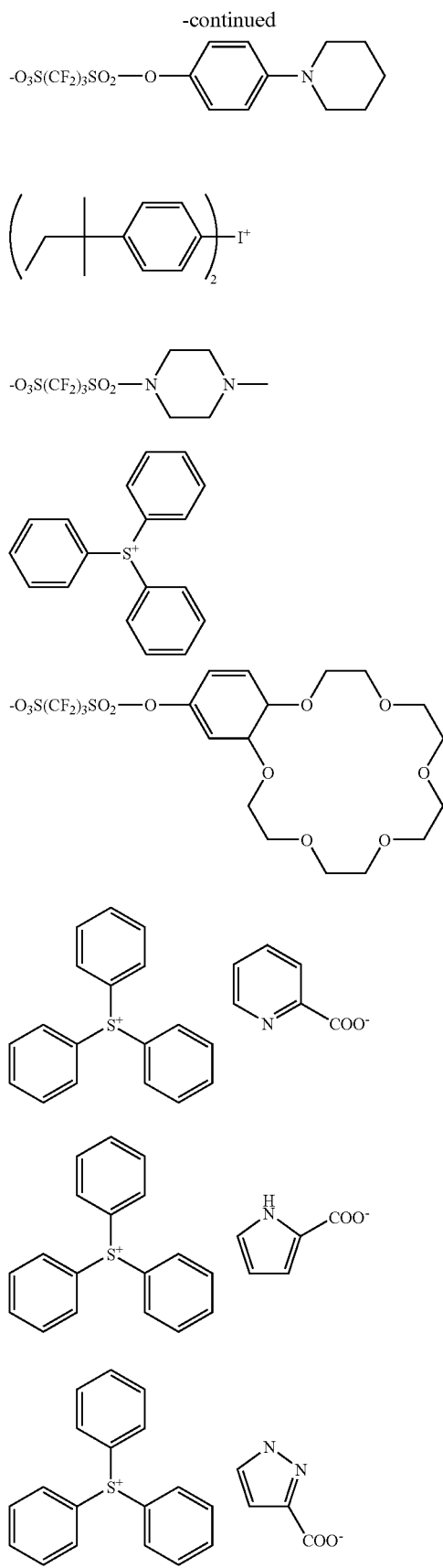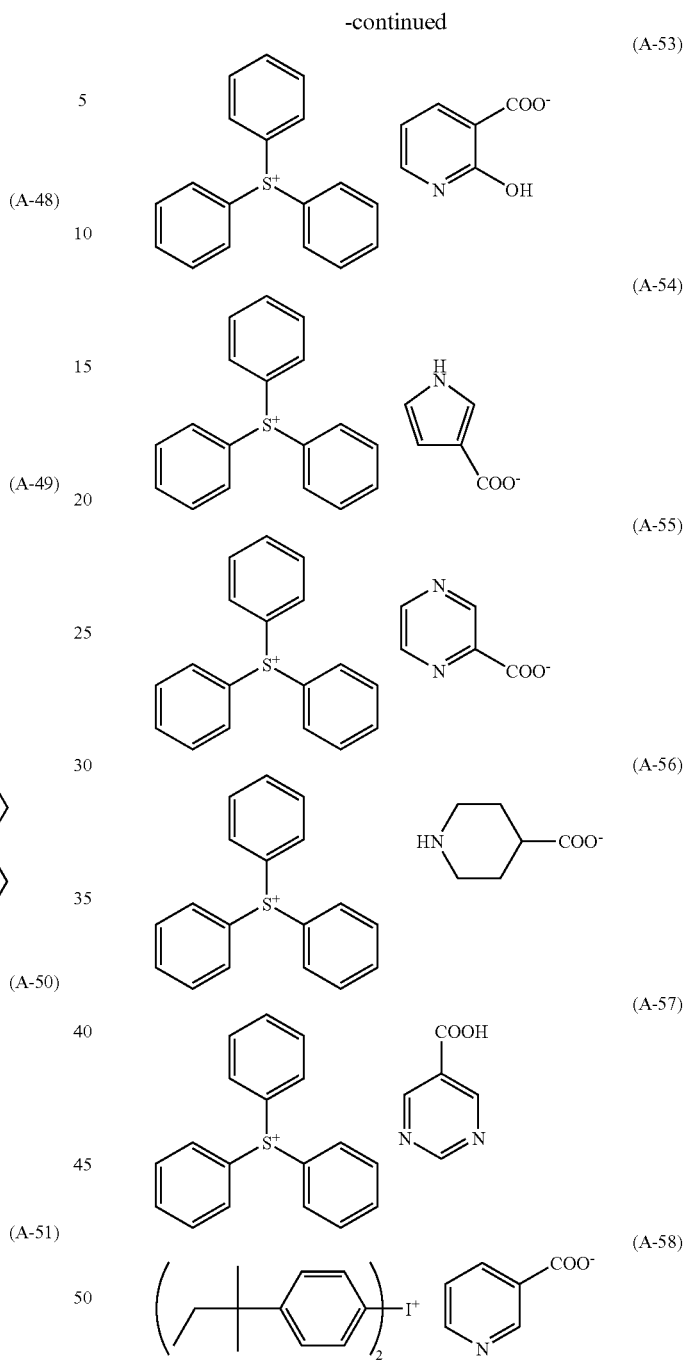

The compound (A) can be easily synthesized from a compound represented by formula (A-I) or a lithium, sodium or potassium salt thereof and a hydroxide, bromide, chloride or the like of iodonium or sulfonium by utilizing an salt-exchange method described in JP-T-11-501909 (the term "JP-T" as used herein means a published Japanese translation of a PCT patent application) or JP-A-2003-246786.

Of the compounds (A), a compound derived from a compound represented by formula (A-I) wherein the Q moiety represents a carboxylic acid is included in compounds described in JP-A-11-125907. However, it should be noted that the combination with the acid generator capable of restraining the outgassing or the low molecular weight compound described in detail hereinafter according to the present invention is novel.

The content of the compound (A) in the positive resist composition of the invention is preferably from 0.1 to 20% by weight, more preferably from 0.1 to 10% by weight, based on the total solid content of the composition.

[3] (T) Low Molecular Weight Compound (Hereinafter Also Referred to as a "(T) Component" or "Compound (T)") Which Increases Solubility in an Alkali Developing Solution by the Action of an Acid The low molecular weight compound (T) for use in the invention which is decomposed by the action of an acid and increases solubility in an alkali developing solution is a compound (binder) which is composed of an aromatic ring and an alkylene chain or cycloalkylene chain and contains an acid decomposable group. Among them, a compound including a structure composed of a linkage of aromatic ring-alkylene chain aromatic ring is preferable.

The low molecular weight compound (T) for use in the invention which increases solubility in an alkali developing solution by the action of an acid is not a polymer. Specifically, the compound (T) is a compound containing a mother compound of a single molecular skeleton substituted with a protective group, for example, an acid decomposable group. Also, it is a compound characterized in that it does not show molecular weight distribution as recognized in a polymer or it does not have 10 or more repeating units resulting from polymerizable monomers.

The compound of (T) component for use in the invention is preferably a compound represented by formula (T-I) shown below.

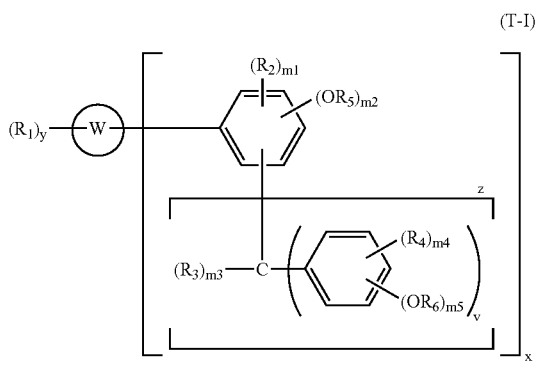

(T-I)

In formula (T-I), $R_1$, $R_2$, $R_3$ and $R_4$ each independently represents a hydrogen atom, an alkyl group or a cycloalkyl group, plural $R_1$s may be combined with each other to form a ring, plural $R_2$s may be combined with each other to form a ring, plural $R_3$s may be combined with each other to form a ring, plural $R_4$s may be combined with each other to form a ring, plural $R_1$s, $R_2$s, $R_3$s and $R_4$s may be the same or different from each other respectively, and $R_5$ and $R_6$ each independently represents a hydrogen atom or an organic group, plural $R_5$s and $R_6$s may be the same or different from each other respectively, provided that at least one of $R_5$s and $R_6$s is an acid-decomposable group.

W represents a single bond, an alkylene group, a cycloalkylene group, an arylene group or a group formed by an appropriate combination of these groups, x represents a positive integer, y represents an integer of 0 or more, when W represents a single bond, y is 0 (when W represents a single bond and x is 2, y is 0), z represents an integer of 0 or more, v represents an integer of 0 or more, m1, m3 and m4 each independently represents a positive integer, and m2 and m5 each independently represents an integer of 0 or more, provided that m1+m2+z=5, m3+v=3, m4+m5=5 and m2+m5≧2.

The alkyl group represented by any one of $R_1$, $R_2$, $R_3$ and $R_4$ may be straight chain or branched, and is preferably an alkyl group having from 1 to 10 carbon atoms, for example, a methyl group, an ethyl group, a propyl group, a butyl group, an isobutyl group, a hexyl group or an octyl group.

The cycloalkyl group represented by any one of $R_1$, $R_2$, $R_3$ and $R_4$ may be monocyclic or polycyclic. Specifically, a group having 5 or more carbon atoms and including, for example, a monocyclo, bicyclo, tricyclo or tetracyclo structure is exemplified. A number of the carbon atoms included is preferably from 6 to 30, and particularly preferably from 7 to 25. Specific examples thereof include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. The cycloalkyl group may have a substituent.

The alkyl group or cycloalkyl group may have a substituent. Examples of the substituent include a hydroxy group, a carboxyl group, a halogen atom (for example, a fluorine atom, a chlorine atom, a bromine atom or an iodine atom) or an alkoxy group (for example, a methoxy group, an ethoxy group, a propoxy group or a butoxy group).

The organic group represented by any one of $R_5$ and $R_6$ represents an acid-decomposable group or acid-undecomposable group. According to the invention, the compound (T) includes from 1 to 30 acid-decomposable groups in the molecule thereof. The number of the acid-decomposable groups included per molecule is preferably from 3 to 25, and more preferably from 4 to 20.

The acid-decomposable organic group represented by any one of $R_5$ and $R_6$ is an organic group (an acid-decomposable group) which is decomposed by the action of an acid to generate an alkali-soluble group, and includes, for example, the groups described hereinafter.

The acid-undecomposable organic group represented by any one of $R_5$ and $R_6$ is an organic group which is not decomposed by the action of an acid, and includes, for example, an alkyl group, an aryl group, an aralkyl group, an alkoxy group, an alkoxycarbonyl group, an amido group and a cyan group, each of which is not decomposed by the action of an acid. The alkyl group is preferably an alkyl group having from 1 to 10 carbon atoms or a cycloalkyl group, for example, a methyl group, an ethyl group, a propyl group, an n-butyl group, a sec-butyl group, a hexyl group, a 2-ethylhexyl group, an octyl group, a cyclopropyl group, a cyclobutyl group, a cyclohexyl group or an adamantyl group. The aryl group is preferably an aryl group having from 6 to 14 carbon atoms, for example, a phenyl group, a naphthyl group or an anthryl group. The aralkyl group is preferably an aralkyl group having front 7 to 12 carbon atoms, for example, a benzyl group, a phenethyl group or a cumyl group. The alkoxy group or the alkoxy group in the alkoxycarbonyl group is preferably an alkoxy group having from 1 to 5 carbon atoms, for example, a methoxy group, an ethoxy group, a propoxy group, a n-butoxy group or an isobutoxy group.

The alkylene group represented by W may be straight chain or branched, and is preferably an alkylene group having from 1 to 10 carbon atoms, for example, a methylene group, an ethylene group, a propylene group, a butylene group or an isobutylene group.

The cycloalkylene group represented by W may be monocyclic or polycyclic. The alkylene group for forming the ring includes, for example, a cycloalkylene group having from 3 to 8 carbon atoms (for example, a cyclopentylene group or a cyclohexylene group).

The alkylene group or cycloalkylene group represented by W may have a substituent. Examples of the substituent include an alkyl group (preferably an alkyl group having from 1 to 10 carbon atoms, for example, a methyl group, an ethyl group, a propyl group, an isopropyl group, an n-butyl group, an isobutyl group, a sec-butyl group, a tert-butyl group, a pentyl group, a hexyl group, a heptyl group, an octyl group, a nonyl group or a decyl group), an alkoxy group (preferably an alkoxy group having from 1 to 4 carbon atoms, for example, a methoxy group, an ethoxy group, a propoxy group or a butoxy group), a fluorine atom, a chlorine atom, a bromine atom and an iodine atom.

The alkylene chain or cycloalkylene chain may include —O—, —OC(=O)—, —OC(=O)O—, —N(R)—C(=O)—, —N(R)—C(=O)O—, —S—, —SO— or —SO$_2$— in the chain thereof. R represents a hydrogen atom or an alkyl group (preferably an alkyl group having from 1 to 10 carbon atoms, for example, a methyl group, an ethyl group, a propyl group, an isopropyl group, an n-butyl group, an isobutyl group, a sec-butyl group, a tert-butyl group, a pentyl group, a hexyl group, a heptyl group, an octyl group, a nonyl group or a decyl group).

The cyclic arylene group represented by W includes preferably an arylene group having from 6 to 15 carbon atoms, for example, a phenylene group, a tolylene group or a naphthylene group.

Further, the compound having a structure represented by formula (T-I) is preferably a compound having a structure represented by any one of formulae (T-II) to (T-IV) shown below.

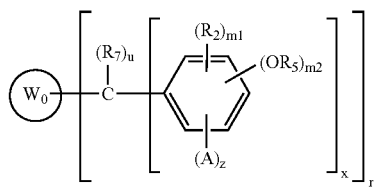
(T-II)

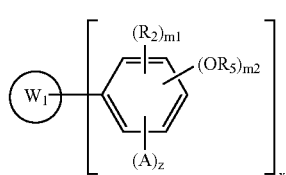
(T-III)

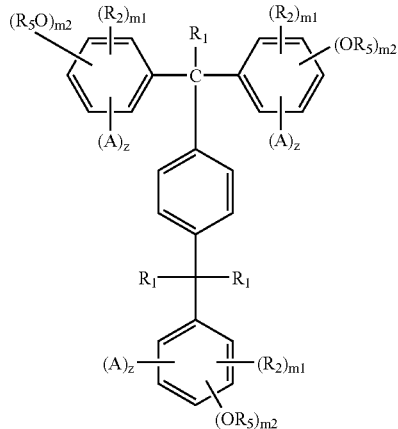
(T-IV)

In formulae (T-II) to (T-IV), $R_1$, $R_2$, $R_5$, $R_6$, x, z, m1 and m2 have the same meanings as those defined in formula (T-I) respectively, $R_7$ represents a hydrogen atom, an alkyl group or a cycloalkyl group, plural $R_7$s may be combined with each other to form a ring, plural $R_7$s may be the same or different from each other, u represents a positive integer, provided that u+x=3, r represents a positive integer, $W_0$ represents an arylene group, $W_1$ represents a single bond, an alkylene group or a cycloalkylene group, and A represents a group having a structure represented by formula (a) shown below:

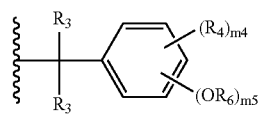

In formula (a), $R_3$, $R_4$, $R_6$, m4 and m5 have the same meanings as those defined in formula (T-I) respectively.

The compound of (T) component for use in the invention is also preferably a calixarene derivative or a calixresolcinolarene derivative represented by the following formula (T-V):

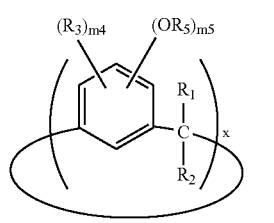
(T-V)

In formula (T-V), $R_1$, $R_2$, $R_3$, $R_5$, m4, m5 and x have the same meanings as those defined in formula (T-I) respectively.

The low molecular weight compound (T) can be synthesized by reacting a phenolic hydroxy group of a compound (mother compound) which constitutes a mother skeleton, for example, a polyhydric phenol compound, with a protecting reactive agent to protect the phenolic hydroxy group of the mother compound with an acid-decomposable group. The protecting reactive agent indicates a compound for use in the proceeding of the reaction of introducing the protective group. A ratio of a number of the phenolic hydroxy groups protected with the acid-decomposable groups to the total number of the phenolic hydroxy groups included in the mother compound is referred to as a protection ratio.

The specific examples of the compound (mother compound) which constitutes a mother skeleton of the (T) component are set forth below, but the invention should not be construed as being limited thereto.

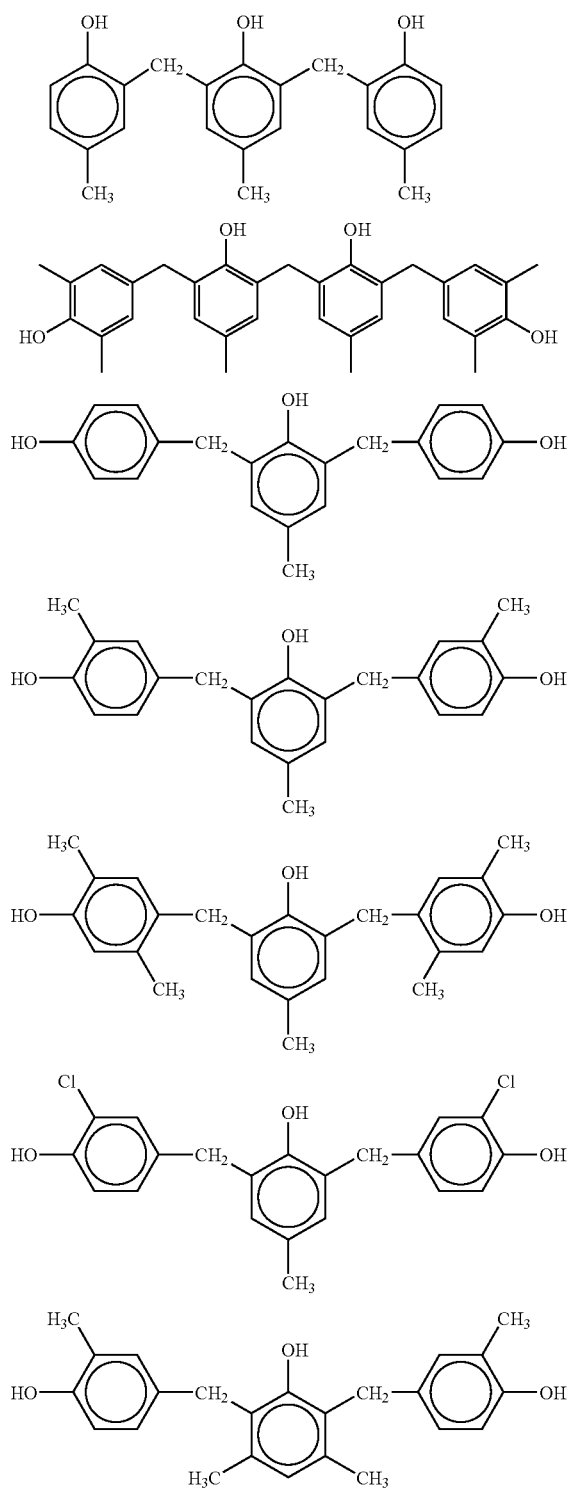

-continued

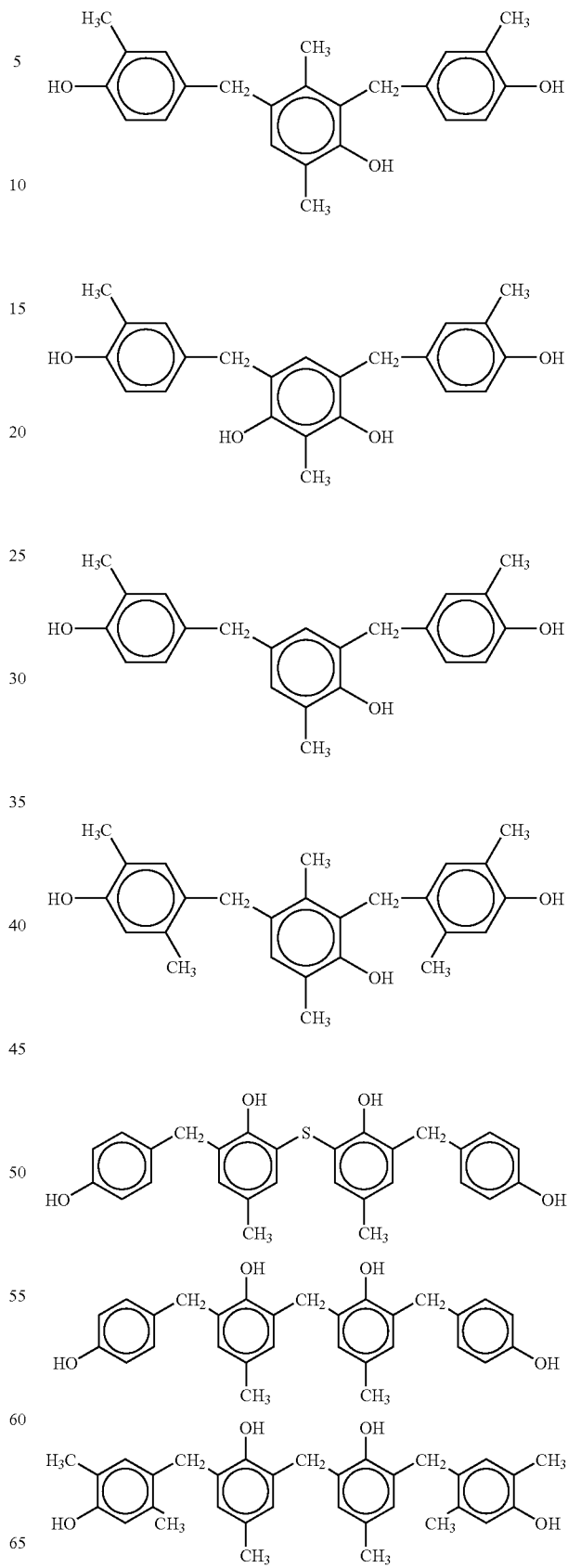

-continued
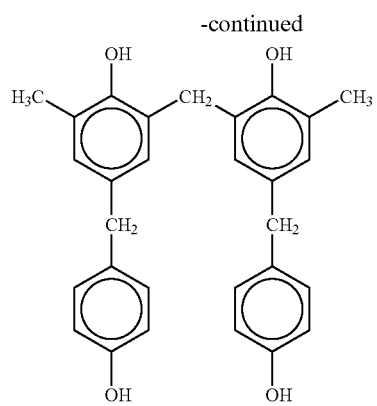
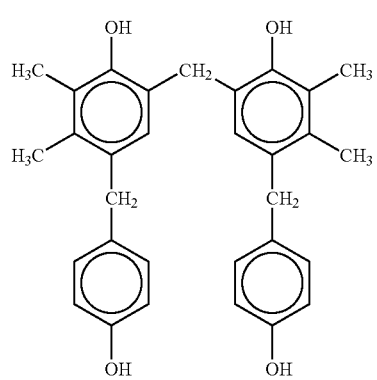
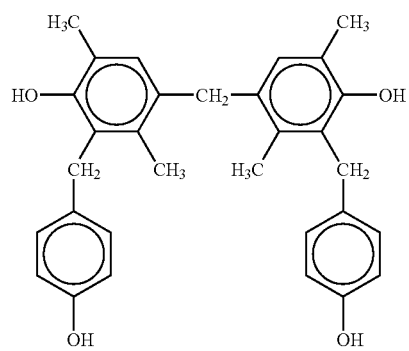
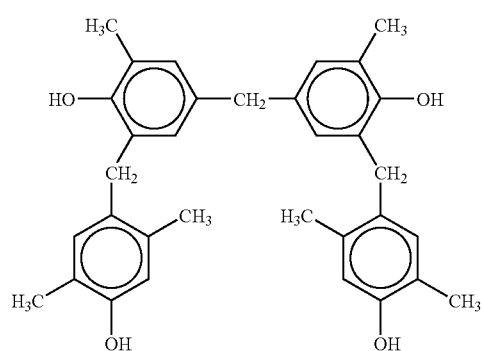
-continued
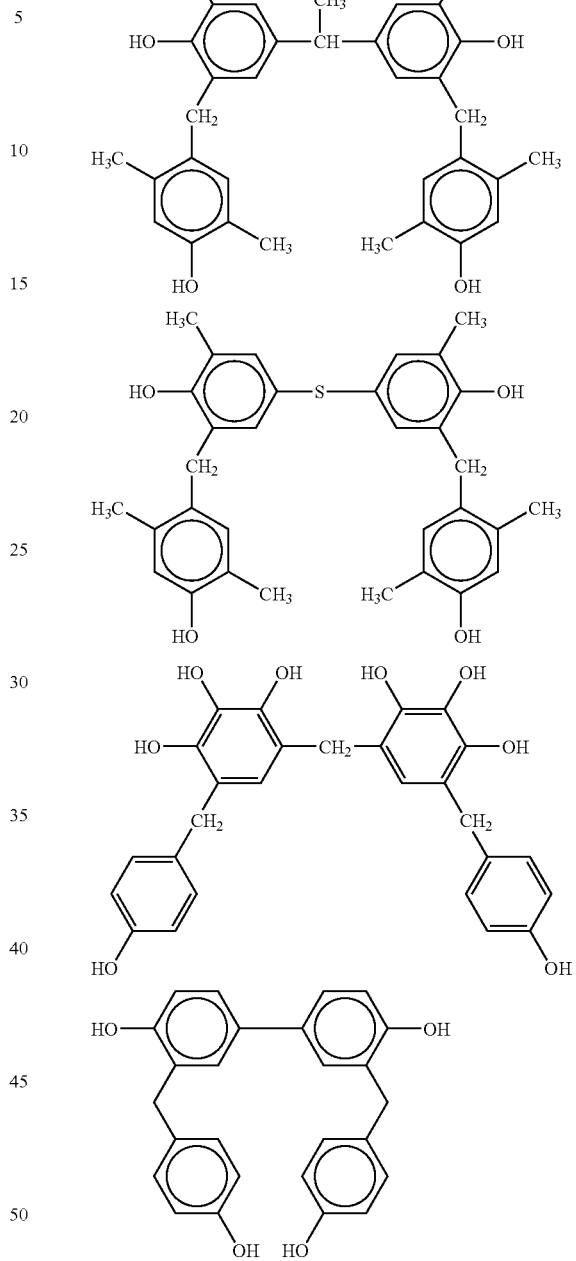
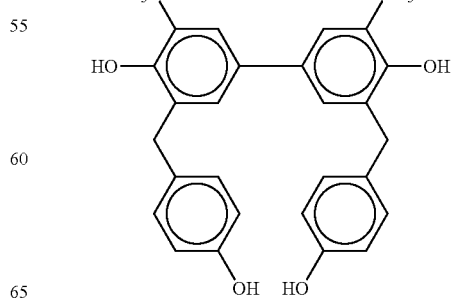

-continued
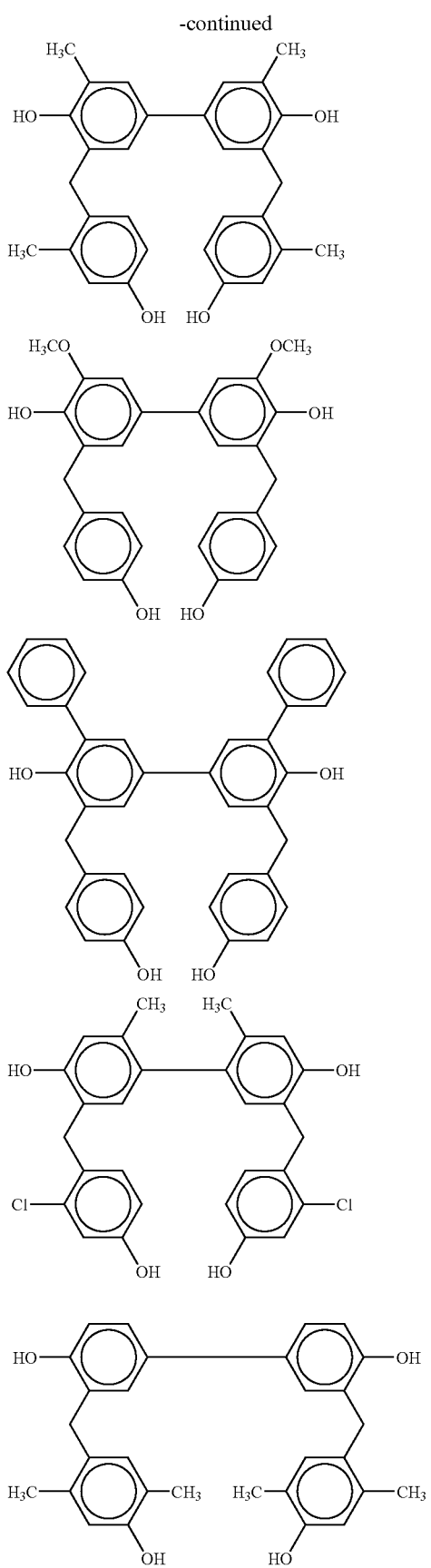
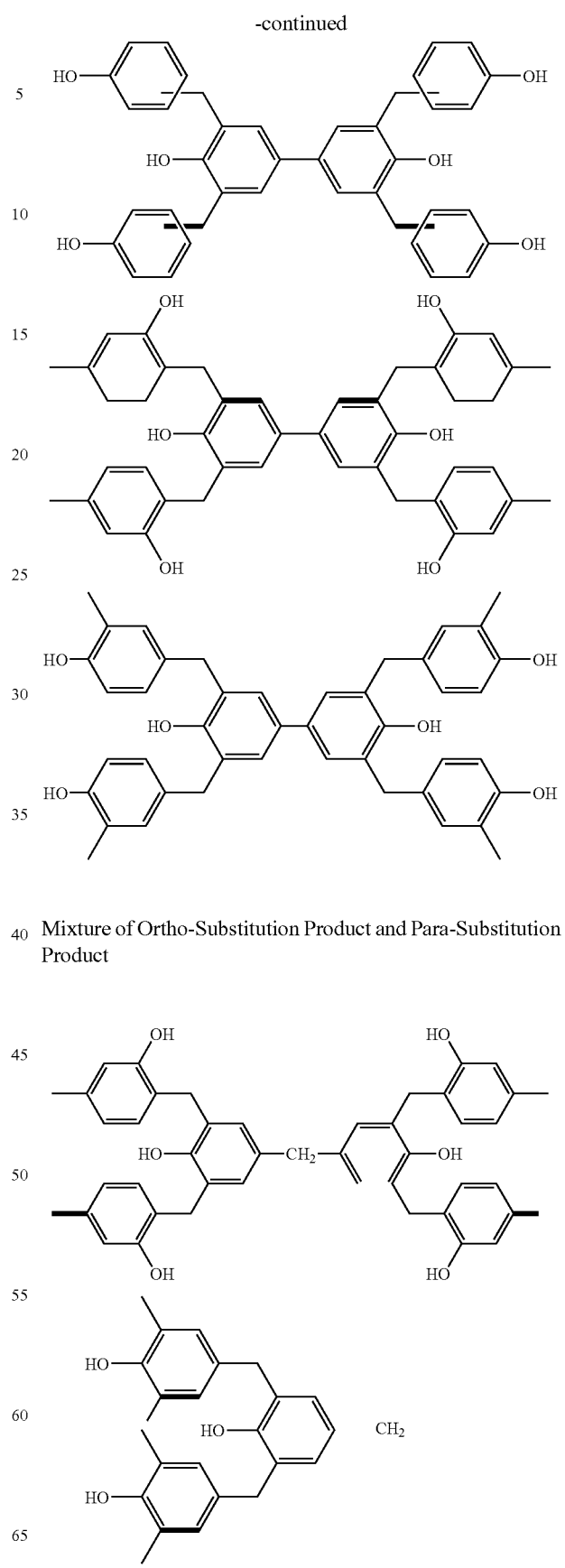
Mixture of Ortho-Substitution Product and Para-Substitution Product -continued
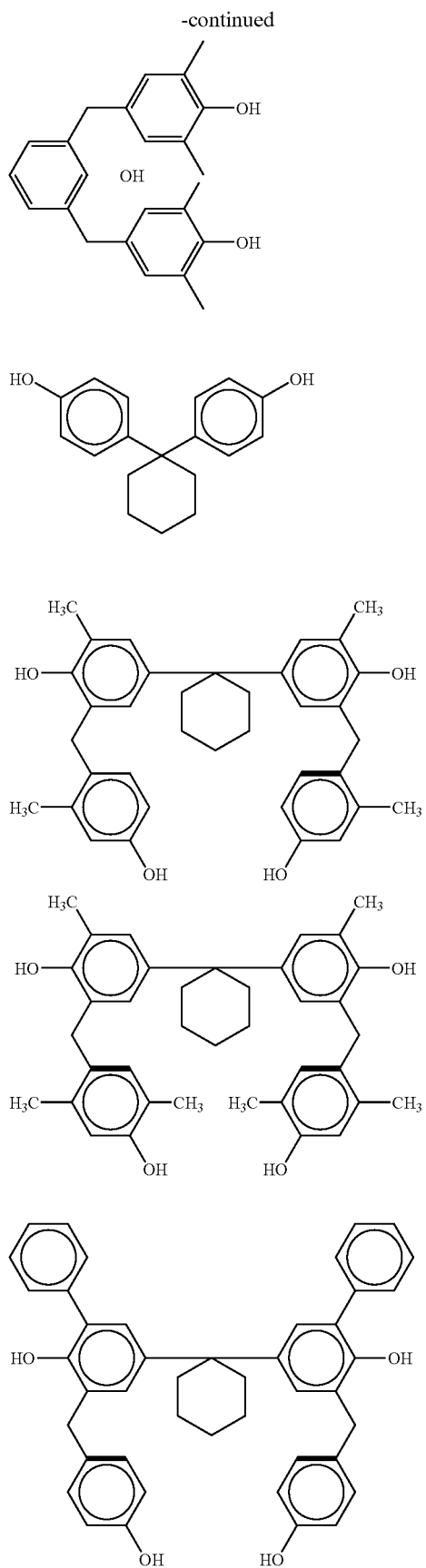
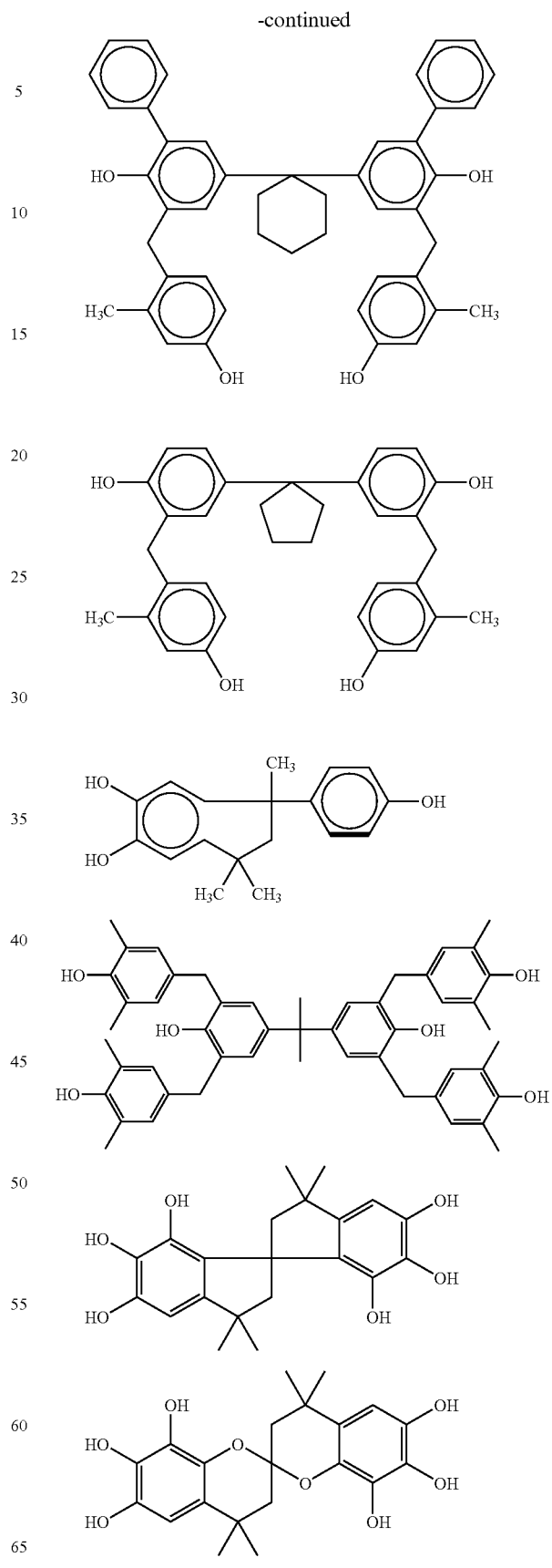

-continued
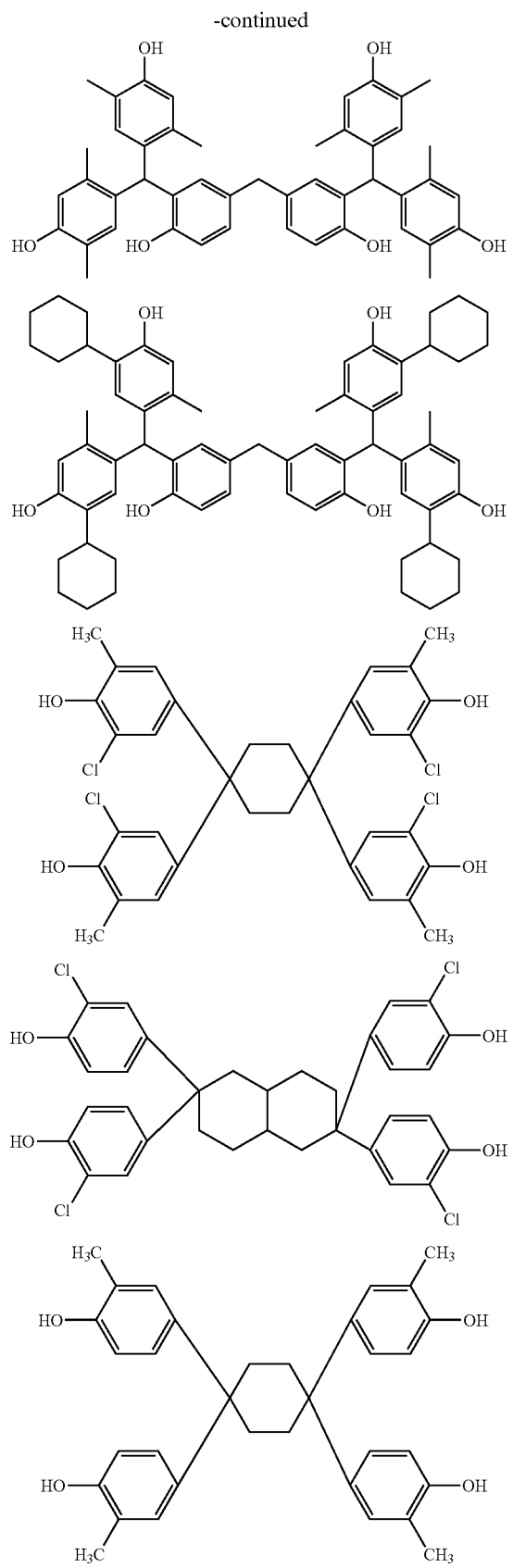
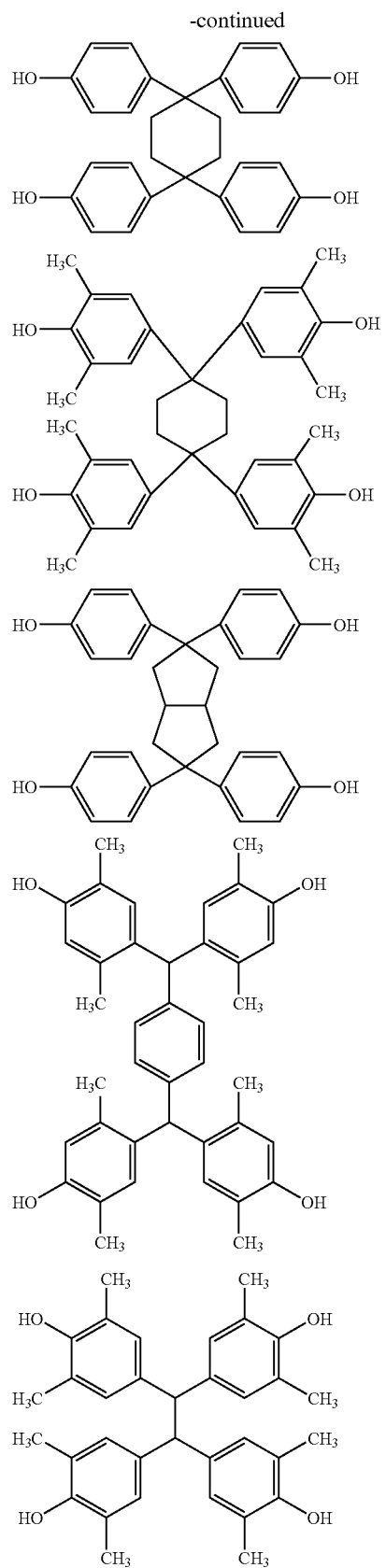

-continued
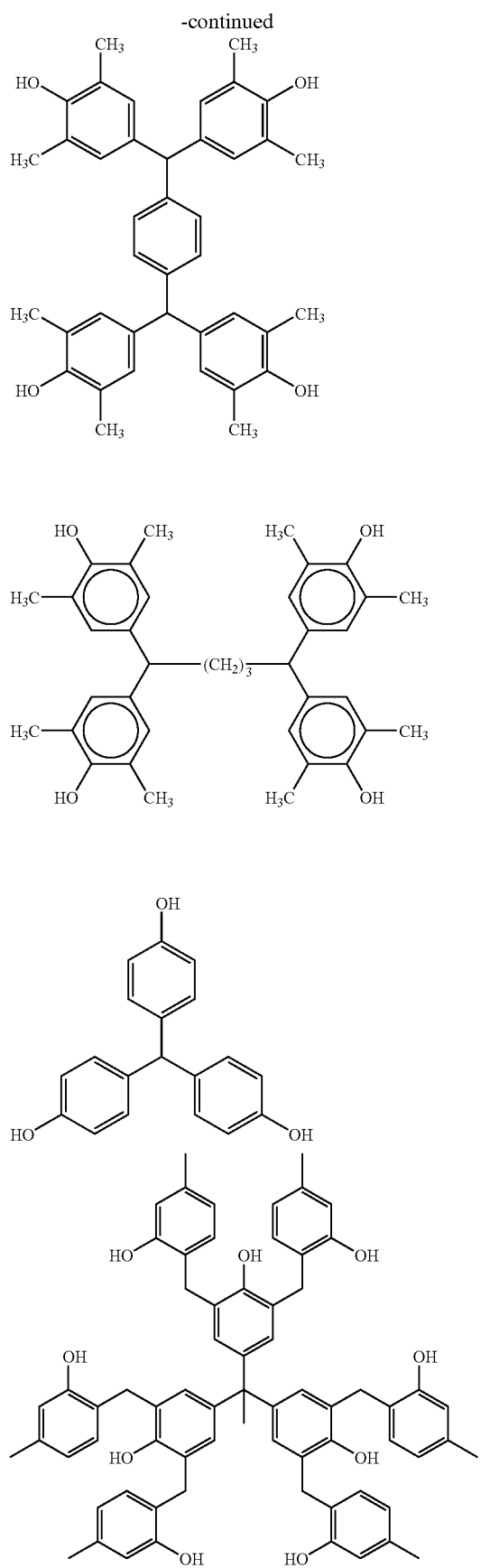
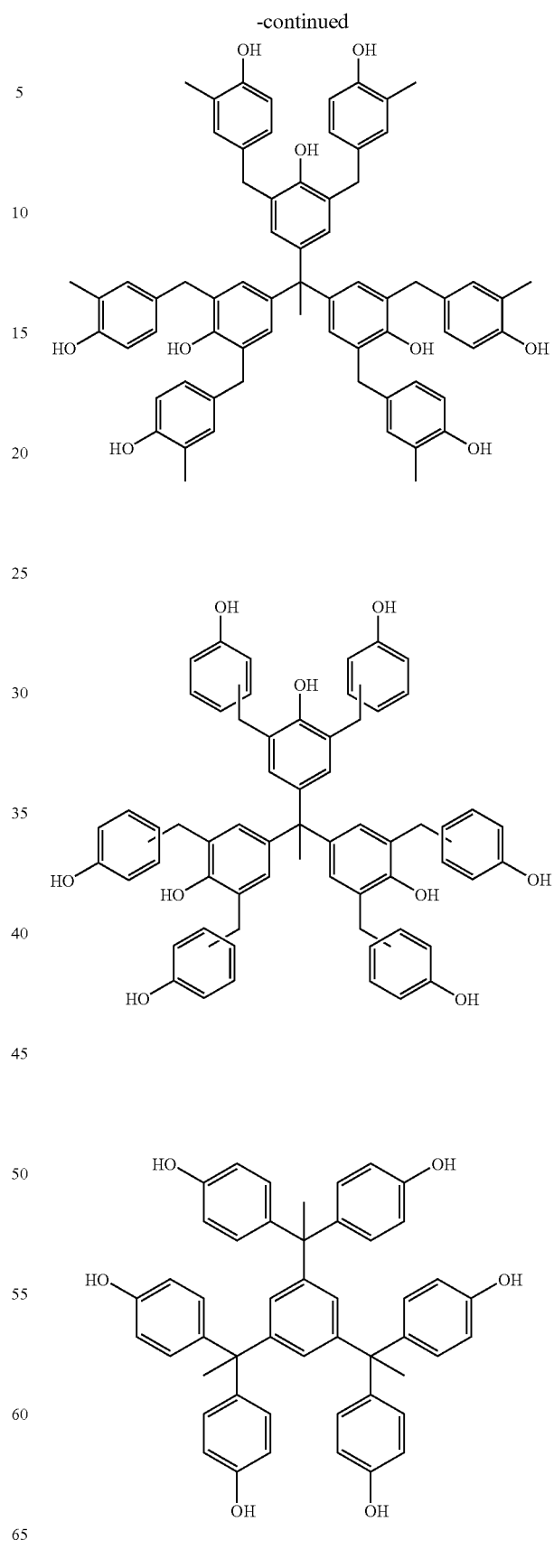

Mixture of Ortho-Substitution Product and Para-Substitution Product
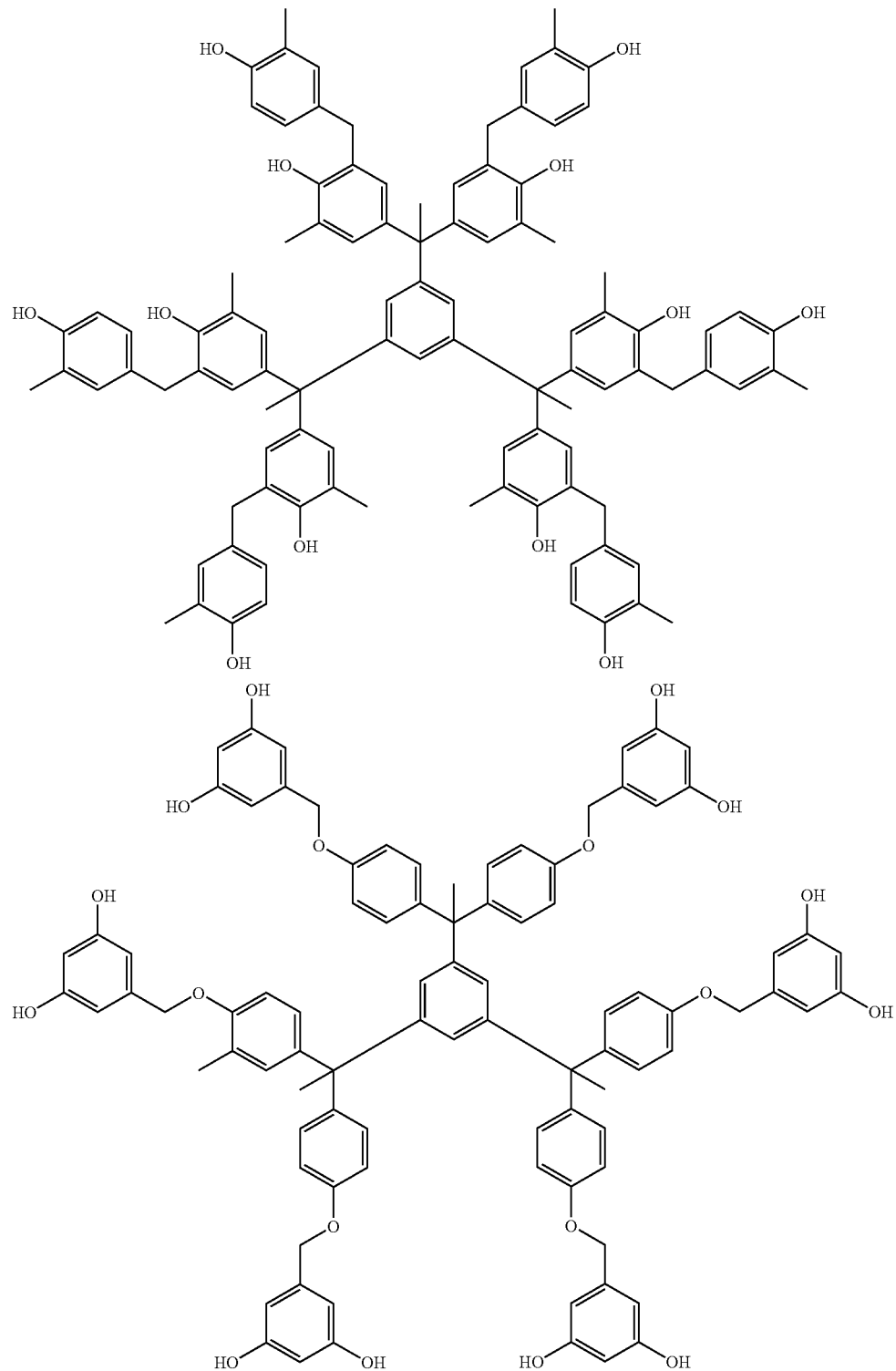

-continued
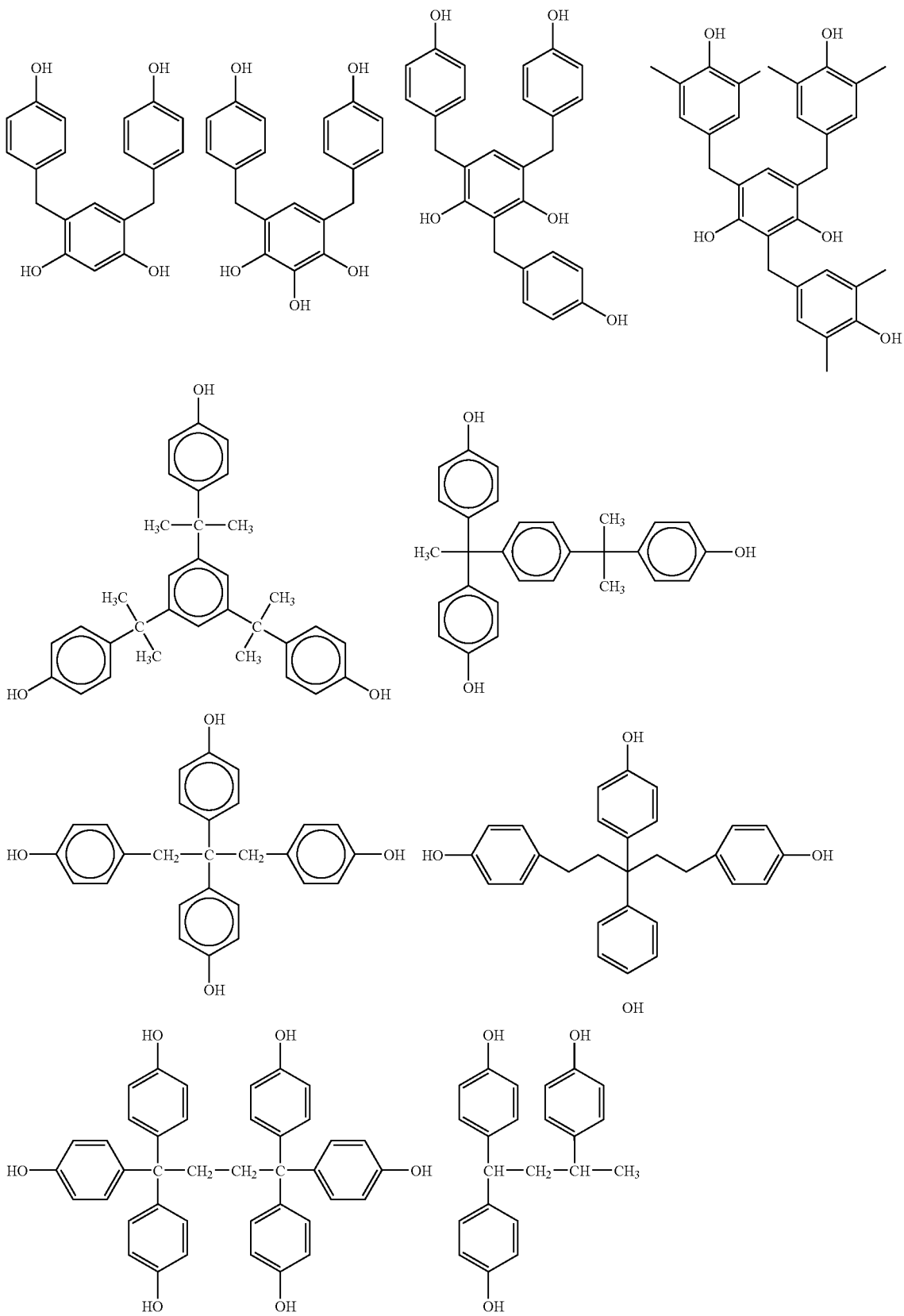

-continued
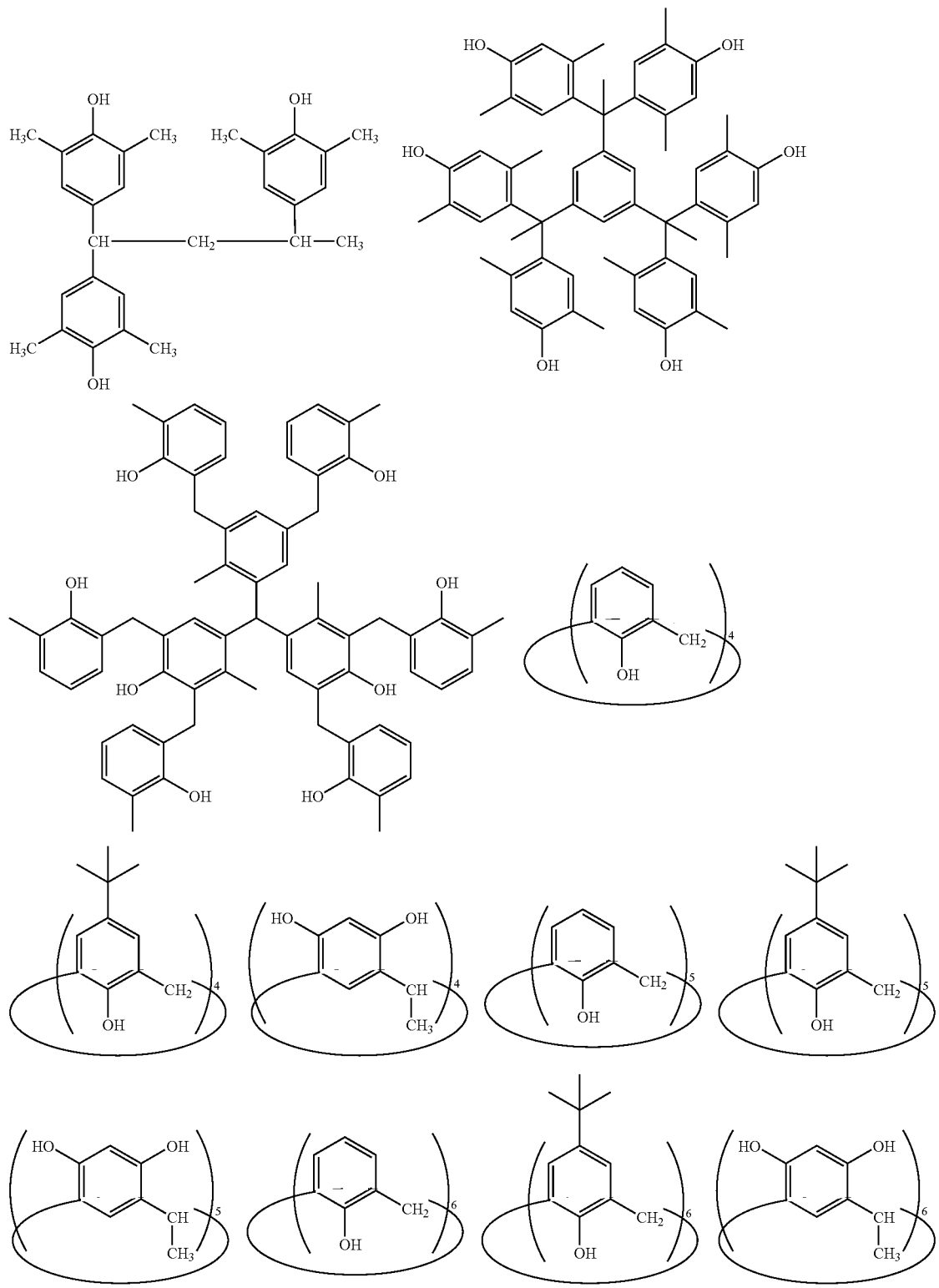

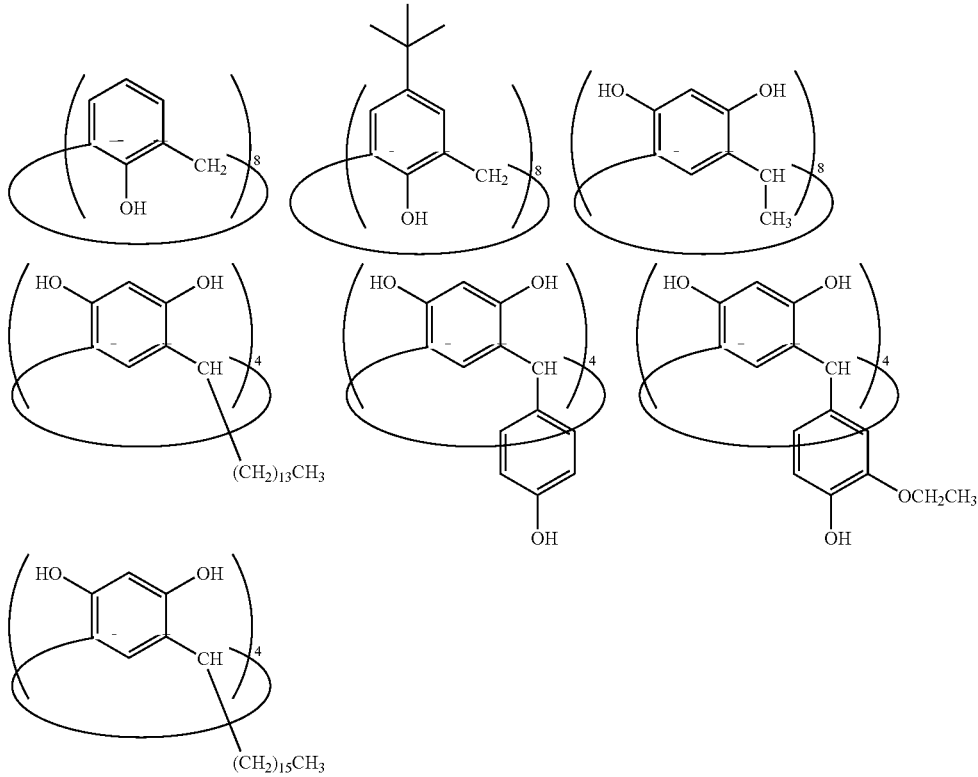

The low molecular weight compound (T) for use in the invention, which is a compound that contains an acid-decomposable group in the molecule and increases solubility in an alkali developing solution by the action of an acid, is preferably contains an alkali-soluble group.

Examples of the alkali-soluble group include a hydroxy group, a sulfo group, a phenol group, a carboxyl group and a hexafluoroisopropanol group [—C(CF$_3$)$_2$OH]. It is preferably a phenol group, a carboxyl group or a hexafluoroisopropanol group, and more preferably a phenol group or a carboxyl group.

The acid-decomposable group is a substituent which is positioned in place of the hydrogen atom of hydroxy group in the alkali-soluble group described above, and preferably includes —C(R$_{11a}$)(R$_{12a}$)(R$_{13a}$), —C(R$_{14a}$)(R$_{15a}$)(OR$_{16a}$) and —CO—OC(R$_{11a}$)(R$_{12a}$)(R$_{13a}$). In the above formulae, R$_{11a}$ to R$_{13a}$ each independently represents an alkyl group, a cycloalkyl group, an alkenyl group, an aralkyl group or an aryl group. R$_{14a}$ and R$_{15a}$ each independently represents a hydrogen atom or an alkyl group. R$_{16a}$ represents an alkyl group, a cycloalkyl group, an alkenyl group, an aralkyl group or an aryl group. Alternatively, two of R$_{11a}$, R$_{12a}$ and R$_{13a}$ or two of R$_{14a}$, R$_{15a}$ and R$_{16a}$ may be connected with each other to from a ring.

In case of R$_5$ or R$_6$ in formula (T-I), for example, a group containing an acid-decomposable group may be introduced by modification as described below.

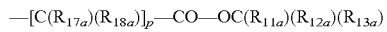

In the formula, R$_{17a}$ and R$_{18a}$ each independently represents a hydrogen atom or an alkyl group, and p represents an integer of 1 to 4. R$_{11a}$, R$_{12a}$ and R$_{13a}$ have the same meanings as defined above respectively.

Preferable specific examples of the acid-decomposable group are set forth below, but the invention should not be construed as being limited thereto.

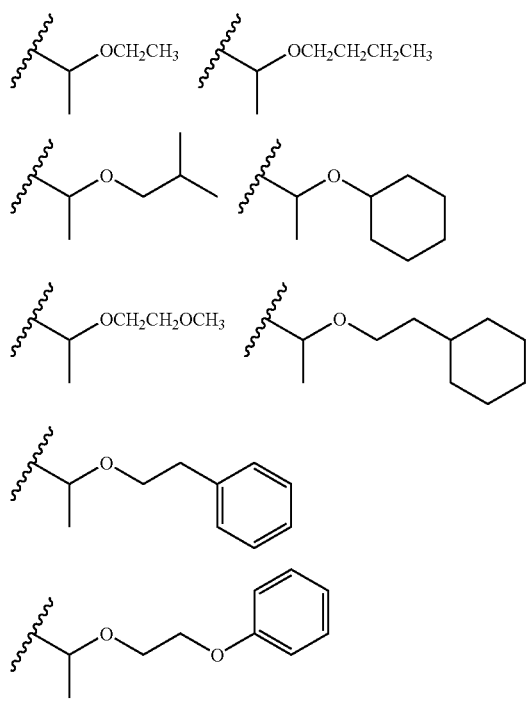

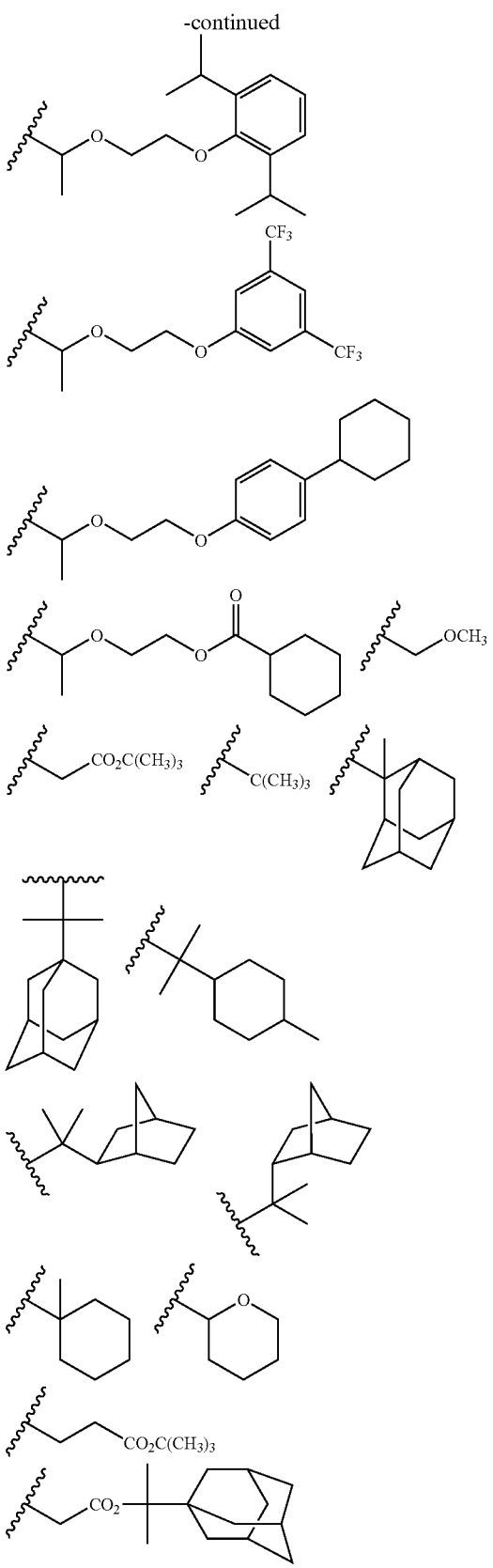

300 to 4,000, more preferably from 400 to 3,000, and particularly preferably from 400 to 1,500. The mother compound of the (T) component is commercially available, for example, from Honshu Chemical Industry Co., Ltd. and such a compound can be employed. Also, it can be synthesized by condensation of various phenol compounds with various aldehydes or ketones.

The content of the (T) component is ordinarily from 50 to 99.5% by weight, preferably from 60 to 99.0% by weight, and more preferably from 70 to 98.0% by weight, based on the total solid content of the positive resist composition.

The positive resist composition of the invention may further contain a resin (polymer). The resin added is an alkali-soluble resin which does not have an acid-decomposable group or an acid-decomposable resin. Examples of the alkali-soluble resin include a homopolymer or copolymer of p-hydroxystyrene, a homopolymer or copolymer of (meth)acrylic acid and a homopolymer or copolymer of p-(1,1,1,3,3,3-hexafluoro-2-hydroxypropyl)styrene. Examples of the acid-decomposable resin include a resin in which the above-described alkali-soluble resin is protected by an acid-decomposable group.

The content of the resin added is ordinarily from 1 to 50% by weight, preferably from 5 to 40% by weight, and more preferably from 8 to 30% by weight, based on the total solid content of the positive resist composition.

<Other Components>

[4] (C) Basic Compound

It is preferable to use (C) basic compound in some cases according to the invention depending on the combination of Compound (Z), Compound (A), Low molecular weight compound (T) and an additive resin described hereinafter.

Preferable structures of the basic compound (C) includes structures represented by any one of formulae (a) to (e) shown below.

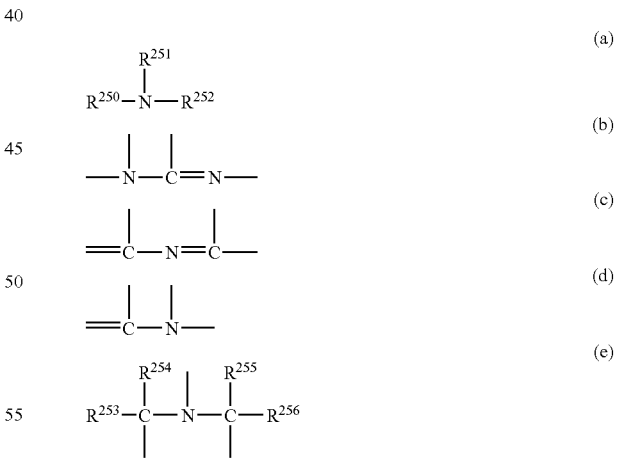

In the above formula, $R^{250}$, $R^{251}$ and $R^{252}$ each independently represent a hydrogen atom, an alkyl group having from 1 to 20 carbon atoms, a cycloalkyl group having from 3 to 20 carbon atoms or an aryl group having from 6 to 20 carbon atoms, or $R^{250}$ and $R^{251}$ may be combined with each other to form a ring. These groups may have a substituent. Preferable examples of the substituted alkyl group and substituted cycloalkyl group include an aminoalkyl group having from 1 to 20 carbon atoms, an aminocycloalkyl group having from 3 to 20 carbon atoms, a hydroxyalkyl group having from 1 to 20 carbon atoms and a hydroxycycloalkyl group having from 3 to 20 carbon atoms.

The alkyl chain described above may contain an oxygen atom, a sulfur atom or a nitrogen atom.

In the above formula, $R^{253}$, $R^{254}$, $R^{255}$ and $R^{256}$ each independently represents an alkyl group having from 1 to 20 carbon atoms or a cycloalkyl group having from 3 to 20 carbon atoms.

Preferable examples of the basic compound include guanidines, aminopyrrolidines, pyrazoles, pyrazolines, piperazines, aminomorpholines, aminoalkylmorpholines and piperidines each of which may have a substituent. More preferable examples of the basic compound include a compound having an imidazole structure, a diazabicyclo structure, an onium hydroxide structure, an onium carboxylate structure, a trialkylamine structure, an aniline structure or a pyridine structure, an alkylamine derivative having a hydroxy group and/or an ether bond, and an aniline derivative having a hydroxy group and/or an ether bond.

The compound having an imidazole structure includes, for example, imidazole, 2,4,5-triphenylimidazole and benzimidazole. The compound having a diazabicyclo structure includes, for example, 1,4-diazabicyclo[2,2,2]octane, 1,5-diazabicyclo[4,3,0]non-5-ene and 1,8-diazabicyclo[5,4,0]undec-7-ene. The compound having an onium hydroxide structure includes, for example, a triarylsulfonium hydroxide, phenacyl sulfonium hydroxide and a 2-oxoalkyl group-containing sulfonium hydroxide, specifically, triphenylsulfonium hydroxide, tris(tert-butylphenyl)sulfonium hydroxide, bis(tert-butylphenyl)iodonium hydroxide, phenacyl thiophenium hydroxide or 2-oxopropyl thiophenium hydroxide. The compound having an onium carboxylate structure includes, for example, a compound wherein an anion portion of the compound having an onium hydroxide structure is replaced by a carboxylate, e.g., acetate, adamantane-1-carboxylate or a perfluoroalkyl carboxylate. The compound having a trialkylamine structure includes, for example, tri(n-butyl)amine and tri(n-octyl)amine. The compound having an aniline structure includes, for example, 2,6-diisopropylaniline and N,N-dimethylaniline. The alkylamine derivative having a hydroxy group and/or an ether bond includes, for example, ethanolamine, diethanolamine, triethanolamine and tris(methoxyethoxyethyl)amine. The aniline derivative having a hydroxy group and/or an ether bond includes, for example, N,N-bis(hydroxyethyl)aniline.

The basic compounds may be used individually or in combination of two or more thereof. In the case wherein the amount of (B) component used is 0.05% by weight or more, the basic compound may not be used. When the basic compound is used, the amount of the basic compound used is ordinarily from 0.001 to 10% by weight, preferably from 0.01 to 5% by weight, based on the total solid content of the positive resist composition. From the standpoint of obtaining the sufficient effect of the addition of basic compound, the amount is preferably 0.001% by weight or more and it is preferably 10% by weight or less in view of sensitivity and developing property of the unexposed area.

[5] (D) Fluorine-Base and/or Silicon-Base Surfactant

It is preferable that the positive resist composition of the invention further contains any one or more of fluorine-base and/or silicon-base surfactants (a fluorine-base surfactant, a silicon-base surfactant and a surfactant containing both a fluorine atom and a silicon atom).

By the incorporation of the fluorine-base and/or silicon-base surfactant, the positive resist composition of the invention can provide, with favorable sensitivity and resolution, resist patterns having good adhesion property and less development defect, when an exposure light source of 250 nm or shorter, especially 220 nm or shorter, is used.

Examples of the fluorine-base and/or silicon-base surfactant include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants as described below can also be used as they are.

Examples of the commercially available surfactant used include fluorine-base or silicon-base surfactants, for example, Eftop EF301 or EF303 (produced by Shin-Akita Kasei Co., Ltd.), Florad FC430 or FC431 (produced by Sumitomo 3M Ltd.), Megafac F171, F173, F176, F189 and R08 (produced by Dainippon Ink and Chemicals, Inc.), Surflon S-382, SC101, SC102, SC103, SC104, SC105 and SC106 (produced by Asahi Glass Co., Ltd.), and Troysol S-366 (produced by Troy Chemical Corp.). A polysiloxane polymer KP-341 (produced by Shin-Etsu Chemical Co., Ltd.) is also used as the silicon-base surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene)) acrylate and/or (poly(oxyalkylene)) methacrylate is preferable. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block connecting) group or poly(oxyethylene-oxypropylene block connecting) group may be used. Further, the copolymer of a monomer having a fluoroaliphatic group with a (poly(oxyalkylene)) acrylate (or methacrylate) may be not only a binary copolymer but also a ternary or more copolymer obtained by copolymerizing simultaneously two or more different monomers having a fluoroaliphatic group with two or more different (poly(oxyalkylene)) acrylates (or methacrylates).

Examples of the polymer including a fluoroaliphatic group include commercially available surfactants, for example, Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate) and (poly(oxypropylene)) acrylate (or methacrylate), copolymers of acrylate (or methacrylate) having a $C_8F_{17}$ group and (poly(oxyalkylene)) acrylate (or methacrylate), copolymers of acrylate (or methacrylate) having a $C_8F_{17}$ group, (poly(oxyethylene)) acrylate (or methacrylate) and (poly(oxypropylene)) acrylate (or methacrylate are exemplified.

The amount of the fluorine-base and/or silicon-base surfactant used is preferably from 0.0001 to 2% by weight, more preferably from 0.001 to 1% by weight, based on the total amount of the positive resist composition (exclusive of a solvent).

[6] (F) Organic Solvent

The positive resist composition of the invention is used by dissolving the above-described components in an appropriate organic solvent.

Examples of the usable organic solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

(Fa) Ketone Solvent

The solvent for use in the invention is preferably a solvent having at least one ketone structure.

The solvent having at least one ketone structure includes a chain ketone solvent and a cyclic ketone solvent. The ketone having the total number of carbon atoms from 5 to 8 is preferable in view of good coating property.

Examples of the chain ketone solvent include 2-heptanone, methyl ethyl ketone and methyl isobutyl ketone, and 2-heptanone is preferable.

Examples of the cyclic ketone solvent include cyclopentanone, 3-methyl-2-cyclopentanone, cyclohexanone, 2-methylcyclohexanone, 2,6-dimethylcyclohexanone, cycloheptanone, cyclooctanone and isophorone, and cyclohexanone and cycloheptanone are preferable.

As for the solvent, a solvent having a ketone structure is preferably used alone or as a mixed solvent with other solvent. Examples of the solvent mixed (solvent used in combination) include a propylene glycol monoalkyl ether carboxylate, an alkyl lactate, a propylene glycol monoalkyl ether, an alkyl alkoxypropionate and a lactone compound.

Examples of the propylene glycol monoalkyl ether carboxylate include propylene glycol monomethyl ether acetate, propylene glycol monomethyl ether propionate and propylene glycol monoethyl ether acetate.

Examples of the alkyl lactate include methyl lactate and ethyl lactate.

Examples of the propylene glycol monoalkyl ether include propylene glycol monomethyl ether and propylene glycol monoethyl ether.

Examples of the alkyl alkoxypropionate include methyl methoxypropionate, ethyl methoxypropionate, methyl ethoxypropionate and ethyl ethoxypropionate.

Examples of the lactone compound include γ-butyrolactone.

The solvent used in combination includes preferably a propylene glycol monoalkyl ether carboxylate, an alkyl lactate and a propylene glycol monoalkyl ether, and more preferably propylene glycol monomethyl ether acetate.

By mixing the ketone solvent and the solvent used in combination, for example, adhesion property to substrate, developing property and DOF are improved.

A ratio (by weight) of the ketone solvent to the solvent used in combination is preferably from 10/90 to 95/5, more preferably from 20/80 to 80/20, and still more preferably from 30/70 to 70/30.

From the standpoint of enhancing the film thickness uniformity or development defect performance, a high boiling point solvent having a boiling point of 200° C. or more, for example, ethylene carbonate or propylene carbonate may also be mixed.

The amount of the high boiling point solvent added is ordinarily from 0.1 to 15% by weight, preferably from 0.5 to 10% by weight, and more preferably from 1 to 5% by weight, based on the entire solvent.

According to the invention, by using a solvent individually, preferably using two or more kinds of solvents, a positive resist composition having a solid content concentration of ordinarily from 3 to 25% by weight, preferably from 5 to 22% by weight, and more preferably from 5 to 15% by weight is prepared.

<Other Additives>

The positive resist composition of the invention may further contain, if desired, other additives, for example, a dye, a plasticizer, a surfactant other than the component (D), a photosensitizer or a compound capable of accelerating solubility in a developing solution.

In the invention, a surfactant other than (D) fluorine-base and/or silicon-base surfactant can also be added. Specific examples thereof include a nonionic surfactant, for example, polyoxyethylene alkyl ethers, polyoxyethylene alkylaryl ethers, polyoxyethylene-polyoxypropylene block copolymers, sorbitan fatty acid esters and polyoxyethylene sorbitan fatty acid esters.

The surfactants may be added individually or in combination of two or more thereof.

(Pattern Formation Method)

The positive resist composition of the invention is used by dissolving the above-described components in an appropriate organic solvent, preferably in the mixed solvent described above, and coating on an appropriate substrate in the following manner.

Specifically, for instance, the positive resist composition is coated on a substrate (for example, silicon/silicon dioxide coating) as used for the production of a precise integrated circuit device by an appropriate coating method, for example, spinner or coater, and dried to form a resist film.

The resist film is irradiated with an actinic ray or radiation through an appropriate mask, preferably subjected to baking (heating) and then developed. Thus, good patterns can be obtained.

At the irradiation with an actinic ray or radiation, exposure (immersion exposure) may be carried out in the state of filling between the resist film and the lens with a liquid having a refractive index higher than air. This makes it possible to increase resolution.

The actinic ray or radiation for the exposure includes, for example, an infrared ray, visible light, an ultraviolet ray, a far ultraviolet ray, an X-ray and an electron beam, and it is preferably a far ultraviolet ray having a wavelength of 250 nm or less, more preferably 220 nm or less. Specific examples thereof include a KrF excimer laser (248 nm), an ArF excimer laser (193 nm), an $F_2$ excimer laser (157 nm), an X-ray and an electron beam. An ArF excimer laser, an $F_2$ excimer laser, EUV (13 nm) and an electron beam are preferable.

In the development step, an alkali developing solution as described below is used. The alkali developing solution used for the resist composition of the invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A solution prepared by adding an appropriate amount of an alcohol or a surfactant to the alkali developing solution described above is also used.

The alkali concentration in the alkali developing solution is ordinarily from 0.1 to 20% by weight.

The pH of the alkali developing solution is ordinarily from 10.0 to 15.0.

EXAMPLES

The invention will be described in more detail with reference to the following examples, but the invention should not be construed as being limited thereto.

Synthesis Example 1

Synthesis of 10-tolyl-9-oxothioxanthenium nonafluorobutanesulfonate (Z-1)

In 40 ml of trifluoroacetic acid was stirred 10 g of thioxanthen-9-one, and a solution prepared by mixing 5.4 ml of an aqueous 30% hydrogen peroxide solution and 10.8 ml of trifluoroacetic acid was gradually added thereto under cooling with ice. The mixture was stirred for 30 minutes under cooling with ice and then stirred at room temperature for one hour. The reaction solution was poured into water and the crystals deposited were collected by filtration. The crystals obtained were recrystallized from acetonitrile to obtain 4.6 g of a sulfoxide form. Subsequently, 3 g of the sulfoxide form was stirred in 20 ml of toluene, and 3.7 ml of trifluoroacetic anhydride and 2.2 ml nonafluorobutanesulfonic acid were added thereto under cooling with ice. The temperature of the reaction solution was gradually raised to room temperature and then the reaction solution was stirred for one hour. Diisopropyl ether was added to the reaction solution to deposit crystals and the crystals were recrystallized from a mixed solvent of ethyl acetate and diisopropyl ether to obtain 3.9 g of 10-tolyl-9-oxothioxanthenium nonafluorobutanesulfonate (Z-1). $^1$H-NMR (400 MHz, CDCl$_3$): σ 2.38 (s, 3H), 7.34 (d, 2H), 7.72 (m, 2H), 7.95 (m, 4H), 8.28 (m, 2H), 8.63 (d, 2H).

Synthesis Example 2

Synthesis of 10-tolyl-9-oxothioxanthenium 3,5-bistrifluoromethylbenzenesulfonate (Z-2)

In a methanol/water (1/1) solution was dissolved 1.5 g of 10-tolyl-9-oxothioxanthenium nonafluorobutanesulfonate (Z-1) obtained in Synthesis Example 1, and the resulting solution was passed through an ion exchange resin (Amberlite IRA402Cl in which the anion was replaced by OH with an aqueous NaOH solution). After adding 1 g of 3,5-bistrifluoromethylbenzenesulfonic acid to the eluent, the solution was extracted with chloroform to obtain 1.7 g of 10-tolyl-9-oxothioxanthenium 3,5-bistrifluoromethylbenzenesulfonate (Z-2) which was a compound in which the counter salt was changed. $^1$H-NMR (400 MHz, CDCl$_3$): σ 2.37 (s, 3H), 7.34 (d, 2H), 7.79 (m, 3H), 7.93 (m, 4H), 8.34 (m, 4H), 8.62 (d, 2H).

Synthesis Example 3

Synthesis of 2-acetyl-10-tolyl-9-oxothioxanthenium nonafluorobutanesulfonate (Z-8)

In 200 ml of dimethylformamide were stirred 15 g of thiosalicylic acid and 20 g of 4-bromoacetophenone in the presence of 12 g of sodium carbonate and 0.2 g of copper catalyst at 170° C. for 6 hours, and the reaction solution was poured into an aqueous hydrochloric acid solution and filtered. The crystals obtained were recrystallized from acetonitrile to obtain 16 g of a sulfide. Subsequently, 10 g of the sulfide obtained was stirred in 100 g of polyphosphoric acid at 60° C. for 5 hours and the mixture was poured inro ice water. The crystals deposited were collected by filtration, washed with an aqueous sodium hydrogencarbonate solution and then water, and then recrystallized from ethanol to obtain 5 g of 2-acetyl-9H-thioxan-9-one. Further, 3 g of the 2-acetyl-9H-thioxan-9-one obtained was stirred in 12 ml of trifluoroacetic acid under cooling with ice, and a mixed solution containing 1.4 ml of an aqueous 30% hydrogen peroxide solution and 2.7 ml of trifluoroacetic acid was gradually added thereto. After the completion of the addition, the mixture was stirred for 30 minutes under cooling with ice and then stirred at room temperature for one hour, thereby completing the reaction. The reaction solution was poured into water and subjected to liquid separation with ethyl acetate and an aqueous sodium hydroxide solution, and the organic layer was subjected to distillation under a reduced pressure to remove the solvent, thereby obtaining 3.6 g of a sulfoxide form. The sulfoxide form was stirred in 15 g of toluene, and 3.3 ml of trifluoroacetic anhydride and 1.9 ml of nonafluorobutanesulfonic acid were added thereto under cooling with ice, followed by stirring for 30 minutes under cooling with ice and then at room temperature for one hour. Diisopropyl ether was added to the reaction solution to deposit crystals, and the crystals obtained were recrystallized from a mixed solvent of ethyl acetate and diisopropyl ether to obtain 1 g of 2-acetyl-10-tolyl-9-oxothioxanthenium nonafluorobutanesulfonate (Z-8). $^1$H-NMR (400 MHz, CDCl$_3$): σ 2.39 (s, 3H), 2.74 (s, 3H), 7.37 (d, 2H), 7.72 (m, 2H), 7.97 (m, 2H), 8.19 (m, 1H), 8.39 (m, 2H), 8.67 (d, 1H), 9.09 (s, 1H).

Synthesis Example 4

Synthesis of (Z-40)

In 300 ml of acetic acid was refluxed 20 g of thianthrene and 36 ml of diluted nitric acid was gradually added dropwise thereto. After reacting for 5 hours, the reaction solution was poured into 1.2 liters of water to deposit crystals. The crystals were collected by filtration and recrystallized from acetonitrile to obtain 12 g of thianthrene-S-oxide. $^1$H-NMR (400 MHz, CDCl$_3$): σ 7.42 (t, 2H), 7.56 (t, 2H), 7.63 (d, 2H), 7.93 (d, 2H).

In 10 ml of toluene was dissolved 2 g of thianthrene-S-oxide and the solution was cooled with ice. Then, 2.8 ml of trifluoroacetic anhydride and 1.2 ml of nonafluorobutanesulfonic acid were added thereto, followed by stirring for one hour. Diisopropyl ether was added thereto and the supernatant solution was removed. The residue was purified by a silica gel column (chloroform/methanol=19/1) to obtain 4.4 g of 5-(p-tolyl)thianthrenium nonafluorobutanesulfonate. $^1$H-NMR (400 MHz, CDCl$_3$): σ 2.34 (s, 3H), 7.08 (d, 2H), 7.22 (d, 2H), 7.78 (m, 6H), 8.65 (d, 2H).

In 6 ml of triuoroacetic acid was suspended 2 g of 5-(p-tolyl)thianthrenium nonafluorobutanesulfonate and 0.75 ml of an aqueous 30% hydrogen peroxide solution was added dropwise thereto at room temperature. The mixture was stirred at 80° C. for one hour and water and chloroform were added thereto, followed by subjecting to liquid separation. The chloroform layer was subjected to distillation under a reduced pressure to remove the solvent and the residue was purified by a silica gel column (chloroform/methanol=19/1)

to obtain 1.2 g of (Z-40). $^1$H-NMR (400 MHz, CDCl$_3$): σ 2.47 (s, 3H), 7.47 (d, 2H), 7.66 (d, 2H), 7.98 (t, 2H), 8.04 (t, 2H), 8.40 (d, 2H), 8.43 (d, 2H).

Synthesis Example 5

Synthesis of (Z-73)

With 1.1 ml of ethoxybenzene was mixed 1 g of thianthrene-S-oxide and the mixture was cooled with ice. Then, 1.2 ml of trifluoroacetic anhydride and 0.7 ml of nonafluorobutanesulfonic acid were added thereto, followed by stirring for 15 minutes. Diisopropyl ether was added thereto and the supernatant solution was removed. Chloroform and water were added to the residue, followed by subjecting to liquid separation. The chloroform layer was subjected to distillation under a reduced pressure to remove the solvent, thereby obtaining 2.5 g of 5-(p-ethoxybenzene)thianthrenium nonafluorobutanesulfonate. $^1$H-NMR (400 MHz, CDCl$_3$): σ 1.38 (t,3H), 4.00 (q,2H), 6.92 (d,2H), 7.29 (d,2H), 7.75 (m,6H), 8.65 (d,2H).

In 10 ml of triluoroacetic acid was suspended 2.5 g of 5-(p-ethoxybenzene)thianthrenium nonafluorobutanesulfonate, followed by cooling with ice. Then, 0.89 ml of an aqueous 30% hydrogen peroxide solution was added dropwise thereto and the mixture was stirred for one hour. After the completion of the reaction, the reaction solution was poured into water, and chloroform was added thereto, followed by subjecting to liquid separation. The chloroform layer was subjected to distillation under a reduced pressure to remove the solvent and the residue was recrystallized from a mixed solvent of diisopropyl ether and ethyl acetate to obtain 1.3 g of (Z-73). $^1$H-NMR (400 MHz, CDCl$_3$): σ 1.47 (t,3H), 4.20 (q, 2H), 7.26 (d,2H), 7.91 (m,6H), 7.98 (m,2H), 8.39 (d,2H).

The compounds (Z-1) to (Z-105) other than the above-described compounds were also synthesized in a similar manner. The compounds (Z-106) to (Z-123) were synthesized by known methods as described, for example, in JP-A-2003-149800.

Synthesis Example of Compound (A)

Synthesis Example A1

Synthesis of Compound (A-1)

In a 500 ml-volume three-neck flask equipped with a 300 ml-volume dropping funnel and a nitrogen inlet tube was charged 15.0 g (47.4 mmol) of 1,1,2,2,3,3-hexafluoropropane-1,3-disulfonyl difluoride, then dissolved in 150 ml of THF under nitrogen atmosphere. While stirring the solution under cooling with ice, 100 ml of a THF solution containing 7.98 g (47.4 mmol) of 4-piperidinopiperidine and 9.60 g (47.4 mmol) of triethylamine was added dropwise thereto through the dropping funnel over a period of one hour. After the completion of the dropwise addition, the mixed solution was stirred under cooling with ice for one hour and after removing the ice bath, it was further stirred at room temperature for 4 hours. Then, 200 ml of AcOEt and 100 ml of water were added to the reaction solution, and the solid deposited was collected by filtration and washed with acetone to obtain 13.1 g of a white solid. Subsequently, 11.1 of the solid was stirred in a mixed solvent of 300 ml of MeOH and 50 ml of an aqueous 1M-sodium hydroxide solution at room temperature for one hour, and 8.2 g (24 mmol) of triphenylsulfonium bromide was added thereto, followed by stirring at room temperature for 3 hours. To the reaction solution was added 200 ml of chloroform and the organic layer was washed several times with water, concentrated and then vacuum-dried to obtain 14.2 g of the solid of the desired compound.

$^1$H-NMR (300 MHz, CDCl$_3$): δ 1.43 (m, 2H), 1.58 (m, 6H), 1.70 (m, 2H), 2.41 (t, 1H), 2.48 (m, 4H), 3.05 (t, 2H), 4.01 (d, 2H), 7.72 (m, 15H).

$^{19}$F-NMR (300 MHz, CDCl$_3$): δ –114.4 (t, 2F), –118.0 (m, 2F), –122.9 (m, 2F).

Synthesis Example A2

Synthesis of Compound (A-33)

In a 500 ml-volume three-neck flask equipped with a 300 ml-volume dropping funnel and a nitrogen inlet tube was charged 15.0 g (47.4 mmol) of 1,1,2,2,3,3-hexafluoropropane-1,3-disulfonyl difluoride, then dissolved in 150 ml of THF under nitrogen atmosphere. While stirring the solution under cooling with ice, 100 ml of a THF solution containing 4.75 g (47.4 mmol) of 4-methylpiperazine and 4.80 g (47.4 mmol) of triethylamine was added dropwise thereto through the dropping funnel over a period of one hour. After the completion of the dropwise addition, the mixed solution was stirred under cooling with ice for one hour and after removing the ice bath, it was further stirred at room temperature for 4 hours. Then, 50 ml of an aqueous 1M-sodium hydroxide solution was added to the reaction solution and stirred at room temperature for 4 hours, and 14.6 g (43 mmol) of triphenylsulfonium bromide was added thereto, followed by stirring at room temperature for 3 hours. To the reaction solution was added 300 ml of chloroform, and the organic layer was washed several times with water, concentrated and then vacuum-dried to obtain 14.9 g of the solid of the desired compound.

$^1$H-NMR (400 MHz, CDCl$_3$): δ 2.31 (s, 3H), 2.45 (bs, 4H), 3.56 (bs, 4H), 7.72 (m, 15H).

$^{19}$F-NMR (400 MHz, CDCl$_3$): δ –110.8 (t, 2F), –114.0 (m, 2F), –119.0 (t, 2F).

Synthesis Example A3

Synthesis of Compound (A-39)

To 150 ml of methanol were added 16.1 g (46.9 mmol) of tripheylsulfonium bromide and 12.4 g (53.5 mmol) of silver oxide and the mixture was stirred at room temperature for 2 hours. After removing the silver salt by filtration, 10.0 g (46.9 mmol) of N-bis(2-hydroxyethyl)-2-aminoethanesulfonic acid was added to the filtrate, followed by stirring for one hour. After removing the solvent, the residue was dried to obtain 22.5 g of the white solid of the desired compound.

$^1$H-NMR (400 MHz, CDCl$_3$): δ 2.615 (m, 4H), 3.005 (s, 4H), 3.583 (bs, 4H), 4.932 (bs, 2H), 7.277-7.835 (m, 15H).

Synthesis Example A4

Synthesis of Compound (A-40)

To 150 ml of methanol were added 16.1 g (46.9 mmol) of tripheylsulfonium bromide and 12.4 g (53.5 mmol) of silver oxide and the mixture was stirred at room temperature for 2 hours. After removing the silver salt by filtration, 10.57 g (46.9 mmol) of 2-hydroxy-3-morpholinopropanesulfonic acid was added to the filtrate, followed by stirring for one hour. After removing the solvent, the residue was dried to obtain 20.0 g of the colorless oil of the desired compound.

$^1$H-NMR (400 MHz, CDCl$_3$): δ 2.354 (m, 1H), 2.543 (m, 5H), 2.842 (m, 1H), 3.084 (m, 1H), 3.694 (t, 4H), 4.35 (m, 1H), 5.02 (bs, 1H), 7.684-7.823 (m, 15H).

Synthesis Example A5

Synthesis of Compound (A-42)

To 150 ml of methanol were added 16.1 g (46.9 mmol) of tripheylsulfonium bromide and 12.4 g (53.5 mmol) of silver oxide and the mixture was stirred at room temperature for 2 hours. After removing the silver salt by filtration, 10.38 g (46.9 mmol) of N-cyclohexyl-3-aminopropanesulfonic acid was added to the filtrate, followed by stirring for one hour. After removing the solvent, the residue was dried to obtain 24.8 g of the colorless oil of the desired compound.

$^1$H-NMR (400 MHz, CDCl$_3$): δ 0.98-1.28 (m, 6H), 1.61 (d, 1H), 1.69 (d, 2H), 1.85 (d, 2H), 2.42 (m, 1H), 2.73 (t, 2H), 2.88 (m, 2H), 7.72 (m, 9H), 7.85 (m, 6H).

The compounds A other than the above-described compounds were synthesized in a similar manner.

<Synthesis of Binder (T)>

Synthesis Example T1

Synthesis of Binder (T-1)

In a reaction vessel were charged 35.74 g (0.05 mol) of Phenol compound (1) shown below, 200 g of propylene glycol monomethyl ether acetate (abbreviated as PGMEA hereinafter), 41.46 g (0.05 mol) of potassium carbonate and 40.96 g (0.21 mol) of Protecting reactive agent (4) (bromoacetic acid tert-Bu ester), and the reaction solution was heated at 100° C. After stirring for 3 hours, the reaction solution was allowed to cool to room temperature, an aqueous 0.1 N—HCl solution was added thereto to neutralize, and conducted washing by adding 50 ml of ethyl acetate and 50 ml of distilled water, followed by vacuum-drying to obtain Binder (T-1). From the $^1$H- and $^{13}$C-NMR analysis, it was found that the protection rate to the total phenolic OH group was 46.3%.

Synthesis Example T2

Synthesis of Binder (T-2)

In a reaction vessel were charged 34.04 g (0.05 mol) of Phenol compound (1) shown below, 150 g of PGMEA, 25.04 g (0.2475 mol) of triethylamine and 2.0 g of 4-dimethylaminopyridine and the mixture was stirred. To the mixture was added dropwise 100 ml of a tetrahydrofuran solution containing 54.02 g (0.2475 mol) of Protecting reactive agent (5) (di-tert-butyl dicarbonate) over a period of 2 hours. After the completion of the dropwise addition, the mixture was further stirred for 3 hours, an aqueous 0.1 N—HCl solution was added thereto to neutralize, washed by adding 50 ml of ethyl acetate and 50 ml of distilled water and extracted. The organic layer was separated, followed by vacuum-drying to obtain Binder (T-2). From the $^1$H- and $^{13}$C-NMR analysis, it was found that the protection rate to the total phenolic OH group was 45.6%.

Synthesis Example T3

Synthesis of Binder (T-4)

In a reaction vessel, 44.16 g (0.05 mol) of Phenol compound (2) shown below was dissolved in 200 g of PGMEA and the solution was depressurized to 20 mmHg at 60° C. to distil off about 40 g of the solvent together with water remaining in the system. The solution was cooled to 20° C. and 49.75 g (0.18 mol) of Protecting reactive agent (1) shown below and 2.5 g of p-toluenesulfonic acid were added thereto, followed by stirring at room temperature for 2 hours. Then, 3.0 g of triethylamine was added thereto to neutralize, and subjected to three times washing operations with 50 ml of ethyl acetate and 50 ml of water, followed by vacuum-drying to obtain Binder (T-4). From the $^1$H- and $^{13}$C-NMR analysis, it was found that the protection rate to the total phenolic OH group was 45.3%.

Other binders shown in Table 1 below were also obtained in a manner similar to Synthesis Examples T1 to T3 described above except for changing the phenol compound and protecting reactive agent used respectively.

Structures of Phenol compounds (1) to (6) which are the mother compounds and Protecting reactive agents (1) to (6) are shown below.

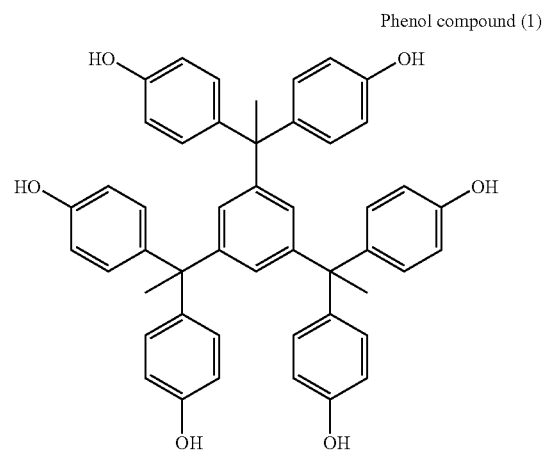

Phenol compound (1)

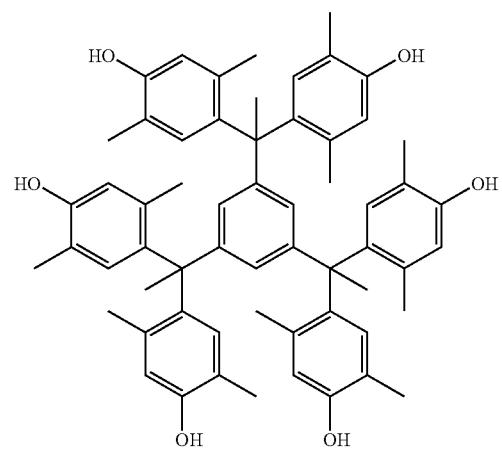

Phenol compound (2)

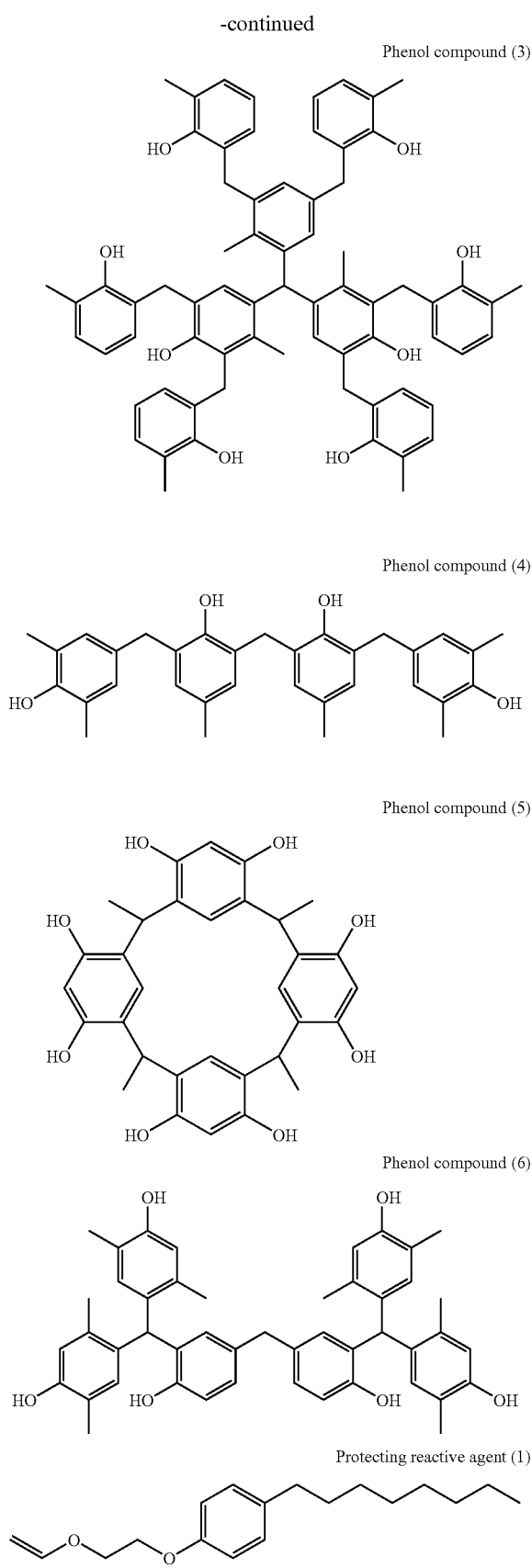
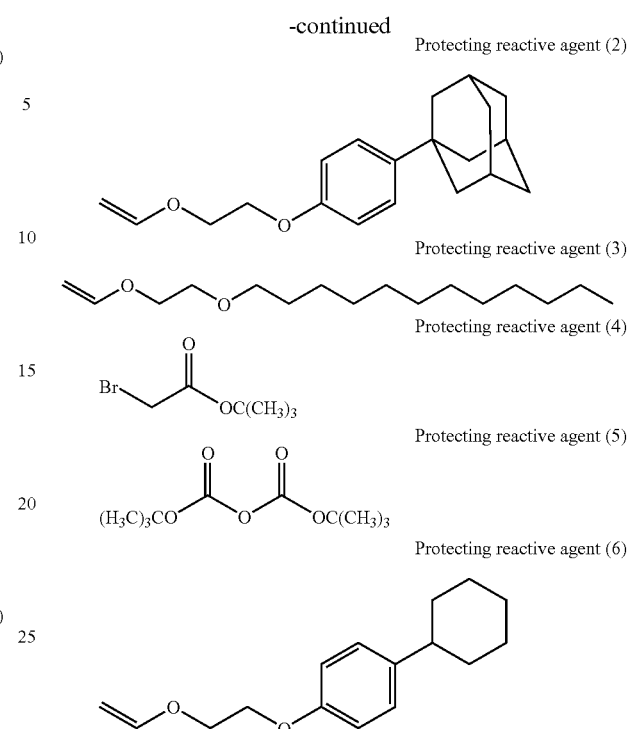

In the case of using any one of Protecting reactive agents (1) to (3) and (6), the phenolic OH groups in Phenol compounds (1) to (6) are protected with acetal groups. In the case of using Protecting reactive agent (4), the phenolic OH groups in Phenol compounds (1) to (6) are protected with tert-butoxycarbonylmethyl groups. In the case of using Protecting reactive agent (5), the phenolic OH groups in Phenol compounds (1) to (6) are protected with tert-butoxycarbonyl groups.

Phenol compounds (1) to (6) and Protecting reactive agents (1) to (6) are easily available or can be synthesized according to conventional methods.

The mother compounds and protecting reactive agents used for the synthesis of the binder and the protection rate are collectively shown in Table 1 below. The protection rate is indicated by mole % to the total phenolic OH groups of the mother compound.

TABLE 1

| (T) Component | Mother Compound | Molecular Weigh of Mother Compound | Protecting Reactive Agent | Protection Rate |
|---|---|---|---|---|
| T-1 | (1) | 714.84 | (4) | 46.3 |
| T-2 | (1) | 714.84 | (5) | 45.6 |
| T-3 | (1) | 714.84 | (6) | 45.0 |
| T-4 | (2) | 883.16 | (1) | 45.3 |
| T-5 | (2) | 883.16 | (2) | 46.0 |
| T-6 | (2) | 883.16 | (6) | 48.0 |
| T-7 | (3) | 1039.3 | (1) | 45.1 |
| T-8 | (3) | 1039.3 | (2) | 47.0 |
| T-9 | (3) | 1039.3 | (6) | 49.0 |
| T-10 | (4) | 496.64 | (2) | 54.0 |
| T-11 | (4) | 496.64 | (3) | 52.0 |
| T-12 | (4) | 496.64 | (6) | 51.0 |
| T-13 | (5) | 544.59 | (1) | 30.0 |
| T-14 | (5) | 544.59 | (2) | 28.0 |
| T-15 | (5) | 544.59 | (6) | 35.2 |

TABLE 1-continued

| (T) Component | Mother Compound | Molecular Weigh of Mother Compound | Protecting Reactive Agent | Protection Rate |
|---|---|---|---|---|
| T-16 | (6) | 708.88 | (2) | 36.5 |
| T-17 | (6) | 708.88 | (4) | 39.4 |
| T-18 | (6) | 708.88 | (6) | 38.2 |

Example i) Preparation of Resist Composition for Example 3

| | |
|---|---|
| Binder (T-2) of the invention | 1.1300 g |
| Additive Resin (BT-2) | 0.1250 g |
| Compound (Z) (Z-33) | 0.0759 g |
| Compound (A) (A-48) | 0.0150 g |
| Surfactant (W-3) | 0.002 g |

The above components were dissolved in the solvent shown in Table 2 below to prepare a solution having the solid concentration of 6.5% by weight. The solution was filtered with a Teflon filter having a pore size of 0.1 μm to obtain a positive resist solution. The resist solutions for other examples and comparative examples were also obtained in the same manner as described above using the components shown in Table 2 respectively.

(ii) Formation and Evaluation of Pattern (EB Irradiation)

The positive resist solution prepared above was uniformly coated on a silicon wafer subjected to hexamethyldisilazane treatment using a spin coater and dried by heating at 120° C. for 90 seconds to form a positive resist film having a thickness of 0.15 μm. The resist film was subjected to electron beam irradiation using an electron beam drawing apparatus (HL750 produced by Hitachi, Ltd.; accelerating voltage: 50 Kev). After the irradiation, the resist film was baked at 110° C. for 90 seconds, immersed in an aqueous 2.38% by weight tetramethylammonium hydroxide (TMAH) solution for 60 seconds, rinsed with water for 30 seconds and dried. The pattern obtained was evaluated in the following manner.

<Sensitivity>

A cross-sectional shape of the pattern was observed using a scanning electron microscope (S-4300 produced by Hitachi, Ltd.). The minimum irradiation energy necessary for resolving a line pattern of 150 nm (line:space=1:1) was designated as the sensitivity.

<Resolution>

The limiting resolution (capable of separately resolving the line and space) in the irradiation amount for defining the sensitivity above was designated as the resolution.

<Pattern Profile>

A cross-section of the portion having a line width of 150 nm (line:space=1:1) was observed using a scanning electron microscope (S-4300 produced by Hitachi, Ltd.) and evaluated according to the following criteria:

A: A case wherein both of the angle between the side wall of the pattern and the substrate and the angle between the side wall of the pattern and the surface of the pattern were 90±2 degrees.

B: A case wherein the angle between the side wall of the pattern and the substrate was 90±2 degrees but the angle between the side wall of the pattern and the surface of the pattern was from 85 degrees to less than 88 degrees or from 92 degrees to less than 95 degrees. Alternatively, a case wherein the angle between the side wall of the pattern and the surface of the pattern was 90±2 degrees but the angle between the side wall of the pattern and the substrate was from 85 degrees to less than 88 degrees or from 92 degrees to less than 95 degrees.

C: A case wherein both of the angle between the side wall of the pattern and the substrate and the angle between the side wall of the pattern and the surface of the pattern were from 85 degrees to less than 88 degrees or from 92 degrees to less than 95 degrees.

D: A case wherein the angle between the side wall of the pattern and the substrate was less than 85 degrees or not less than 95 degrees, a case wherein a T-top shape was observed or a case wherein the whole pattern surface became round.

<Line Edge Roughness (LER)>

A distance from the standard line where the edge should be present was measured in appropriate 30 points in the area of a length of 50 μm in the longitudinal direction of the line pattern of 150 nm in the irradiation amount for defining the sensitivity above using a scanning electron microscope (S-9220, produced by Hitachi, Ltd.), and after determining the standard deviation, 3σ was calculated. It is indicated that as the value is smaller, the performance is better.

<Outgassing>

The outgassing was evaluated by a fluctuation rate of the film thickness at the irradiation of the minimum irradiation energy necessary for resolving a line pattern of 150 nm (line:space=1:1).

Outgassing=[(Film thickness before irradiation)−(Film thickness after irradiation)]/(Film thickness before irradiation)×100

It is indicated that as the value is smaller, the performance is better.

The results of the evaluation are shown in Table 2.

TABLE 2

| | (T) Component (g) | Additive Resin (g) | Compound (Z) (g) | Compound (A) (g) | Basic Compound | Surfactant (0.002 g) | Solvent (weight ratio) | Sensitivity (μC/cm²) | Resolution (nm) | Pattern Profile | LER (nm) | Outgassing (%) |
|---|---|---|---|---|---|---|---|---|---|---|---|---|
| Example 1 | T-1 (1.2550) | — | Z-3 (0.0760) | A-50 (0.0150) | — | W-2 | S-3 | 13 | 100 | A | 5.2 | 2.5 |
| Example 2 | T-2 (1.2550) | — | Z-33 (0.0760) | A-58 (0.0150) | — | W-3 | S-1/S-2 (80/20) | 12 | 125 | B | 5.4 | 2.2 |
| Example 3 | T-2 (1.1300) | BT-2 (0.1250) | Z-33 (0.0759) | A-48 (0.0150) | — | W-3 | S-1/S-2 (80/20) | 14 | 125 | A | 5.0 | 2.0 |

TABLE 2-continued

| | (T) Component (g) | Additive Resin (g) | Compound (Z) (g) | Compound (A) (g) | Basic Compound | Surfactant (0.002 g) | Solvent (weight ratio) | Sensitivity ($\mu C/cm^2$) | Resolution (nm) | Pattern Profile | LER (nm) | Outgassing (%) |
|---|---|---|---|---|---|---|---|---|---|---|---|---|
| Example 4 | T-3 (1.2550) | — | Z-65 (0.0760) | A-1 (0.0150) | — | W-1 | S-1/S-2 (80/20) | 11 | 87.5 | A | 5.0 | 1.7 |
| Example 5 | T-3 (1.2550) | — | Z-72 (0.0760) | A-40 (0.0150) | — | W-1 | S-1/S-2 (80/20) | 11 | 87.5 | A | 5.3 | 1.8 |
| Example 6 | T-3 (1.2550) | — | Z-107 (0.0760) | A-42 (0.0150) | — | W-1 | S-1/S-2 (80/20) | 13 | 87.5 | A | 5.0 | 1.8 |
| Example 7 | T-3 (1.2550) | — | Z-122 (0.0760) | A-50 (0.0150) | — | W-1 | S-1/S-2 (80/20) | 11 | 87.5 | B | 5.3 | 1.8 |
| Example 8 | T-3 (1.1300) | BT-2 (0.1250) | Z-122 (0.0759) | A-33 (0.0150) | — | W-1 | S-1/S-2 (80/20) | 12 | 87.5 | A | 5.4 | 1.8 |
| Example 9 | T-4 (1.2550) | — | Z-3 (0.0760) | A-1 (0.0150) | — | W-2 | S-3 | 13 | 100 | A | 5.2 | 2.5 |
| Example 10 | T-5 (1.2550) | — | Z-33 (0.0760) | A-40 (0.0150) | — | W-3 | S-1/S-2 (80/20) | 12 | 125 | B | 5.5 | 2.2 |
| Example 11 | T-6 (1.2550) | — | Z-107 (0.0760) | A-1 (0.0150) | — | W-1 | S-1/S-2 (80/20) | 9 | 87.5 | A | 4.8 | 1.8 |
| Example 12 | T-6 (1.2550) | — | Z-72 (0.0760) | A-40 (0.0150) | — | W-1 | S-1/S-2 (80/20) | 10 | 87.5 | A | 5.0 | 1.8 |
| Example 13 | T-6 (1.2550) | — | Z-65 (0.0760) | A-42 (0.0150) | — | W-1 | S-1/S-2 (80/20) | 11 | 87.5 | A | 4.9 | 1.9 |
| Example 14 | T-6 (1.2550) | — | Z-122 (0.0760) | A-33 (0.0150) | — | W-1 | S-1/S-2 (80/20) | 11 | 87.5 | B | 4.8 | 1.7 |
| Example 15 | T-6 (1.2550) | — | Z-123 (0.0760) | A-1 (0.0150) | — | W-1 | S-1/S-2 (80/20) | 10 | 87.5 | A | 4.5 | 1.9 |
| Example 16 | T-6 (1.1300) | BT-1 (0.1250) | Z-123 (0.0759) | A-33 (0.0150) | — | W-1 | S-1/S-2 (80/20) | 12 | 87.5 | A | 4.1 | 1.9 |
| Example 17 | T-6 (1.1300) | BT-2 (0.1250) | Z-123 (0.0759) | A-33 (0.0150) | — | W-1 | S-1/S-2 (80/20) | 12 | 87.5 | A | 4.4 | 1.9 |
| Example 18 | T-6 (1.2550) | — | Z-3 (0.0760) | A-1 (0.0150) | N-3 (0.0090) | W-1 | S-1/S-2 (80/20) | 12 | 87.5 | B | 5.2 | 2.0 |
| Example 19 | T-7 (1.2550) | — | Z-3 (0.0760) | A-1 (0.0150) | — | W-2 | S-3 | 13 | 100 | A | 5.2 | 2.4 |
| Example 20 | T-8 (1.2550) | — | Z-33 (0.0760) | A-33 (0.0150) | — | W-3 | S-1/S-2 (80/20) | 12 | 125 | B | 5.5 | 2.1 |
| Example 21 | T-9 (1.2550) | — | Z-107 (0.0760) | A-1 (0.0150) | — | W-1 | S-1/S-2 (80/20) | 11 | 100 | A | 4.7 | 1.9 |
| Example 22 | T-9 (1.2550) | — | Z-72 (0.0760) | A-40 (0.0150) | — | W-1 | S-1/S-2 (80/20) | 10 | 87.5 | A | 5.2 | 1.8 |
| Example 23 | T-9 (1.2550) | — | Z-65 (0.0760) | A-42 (0.0150) | — | W-1 | S-1/S-2 (80/20) | 12 | 100 | A | 4.7 | 1.9 |
| Example 24 | T-9 (1.2550) | — | Z-122 (0.0760) | A-33 (0.0150) | — | W-1 | S-1/S-2 (80/20) | 12 | 87.5 | B | 5.0 | 1.8 |
| Example 25 | T-9 (1.2550) | — | Z-123 (0.0760) | A-1 (0.0150) | — | W-1 | S-1/S-2 (80/20) | 10 | 100 | B | 4.7 | 1.9 |
| Example 26 | T-9 (1.1300) | BT-1 (0.1250) | Z-123 (0.0759) | A-33 (0.0150) | — | W-1 | S-1/S-2 (80/20) | 14 | 87.5 | A | 4.3 | 1.8 |
| Example 27 | T-9 (1.1300) | BT-2 (0.1250) | Z-122 (0.0759) | A-33 (0.0150) | — | W-1 | S-1/S-2 (80/20) | 15 | 87.5 | A | 5.0 | 1.9 |
| Example 28 | T-9 (1.2550) | — | Z-123 (0.0760) | A-1 (0.0150) | N-3 (0.0090) | W-1 | S-1/S-2 (80/20) | 12 | 100 | A | 4.8 | 2.0 |
| Example 29 | T-10 (1.2550) | — | Z-3 (0.0760) | A-1 (0.0150) | — | W-2 | S-3 | 12 | 87.5 | A | 5.5 | 1.5 |
| Example 30 | T-11 (1.2550) | — | Z-33 (0.0760) | A-1 (0.0150) | — | W-3 | S-1/S-2 (80/20) | 12 | 125 | B | 6.3 | 1.4 |
| Example 31 | T-12 (1.2550) | — | Z-65 (0.0760) | A-1 (0.0150) | — | W-1 | S-1/S-2 (80/20) | 12 | 87.5 | A | 4.8 | 2.0 |
| Example 32 | T-12 (1.2550) | — | Z-72 (0.0760) | A-40 (0.0150) | — | W-1 | S-1/S-2 (80/20) | 12 | 87.5 | A | 5.1 | 1.8 |
| Example 33 | T-12 (1.2550) | — | Z-107 (0.0760) | S-1/S-2 (80/20) | — | W-1 | S-1/S-2 (80/20) | 12 | 87.5 | A | 4.9 | 1.9 |
| Example 34 | T-12 (1.2550) | — | Z-122 (0.0760) | A-33 (0.0150) | — | W-1 | S-1/S-2 (80/20) | 12 | 100 | A | 5.2 | 1.7 |
| Example 35 | T-12 (1.2550) | — | Z-123 (0.0760) | A-1 (0.0150) | — | W-1 | S-1/S-2 (80/20) | 12 | 87.5 | A | 4.8 | 1.8 |
| Example 36 | T-13 (1.2550) | — | Z-65 (0.0760) | A-33 (0.0150) | — | W-1 | S-1/S-2 (80/20) | 11 | 100 | A | 4.9 | 1.9 |
| Example 37 | T-14 (1.2550) | — | Z-107 (0.0760) | A-1 (0.0150) | — | W-1 | S-1/S-2 (80/20) | 11 | 87.5 | A | 4.7 | 1.9 |
| Example 38 | T-15 (1.2550) | — | Z-65 (0.0760) | A-1 (0.0150) | — | W-1 | S-1/S-2 (80/20) | 10 | 87.5 | A | 5.0 | 1.8 |
| Example 39 | T-15 (1.2550) | — | Z-72 (0.0760) | A-40 (0.0150) | — | W-1 | S-1/S-2 (80/20) | 10 | 100 | A | 5.1 | 1.8 |
| Example 40 | T-15 (1.2550) | — | Z-107 (0.0760) | A-42 (0.0150) | — | W-1 | S-1/S-2 (80/20) | 12 | 100 | A | 4.5 | 1.9 |

TABLE 2-continued

| | (T) Component (g) | Additive Resin (g) | Compound (Z) (g) | Compound (A) (g) | Basic Compound | Surfactant (0.002 g) | Solvent (weight ratio) | Sensitivity (μC/cm²) | Resolution (nm) | Pattern Profile | LER (nm) | Outgassing (%) |
|---|---|---|---|---|---|---|---|---|---|---|---|---|
| Example 41 | T-15 (1.2550) | — | Z-122 (0.0760) | A-33 (0.0150) | — | W-1 | S-1/S-2 (80/20) | 12 | 87.5 | A | 4.6 | 1.7 |
| Example 42 | T-15 (1.2550) | — | Z-123 (0.0760) | A-1 (0.0150) | — | W-1 | S-1/S-2 (80/20) | 10 | 87.5 | B | 5.2 | 1.8 |
| Example 43 | T-15 (1.1300) | BT-1 (0.1250) | Z-123 (0.0759) | A-33 (0.0150) | — | W-1 | S-1/S-2 (80/20) | 14 | 87.5 | A | 5.3 | 2.0 |
| Example 44 | T-15 (1.1300) | BT-2 (0.1250) | Z-123 (0.0759) | A-33 (0.0150) | — | W-1 | S-1/S-2 (80/20) | 14 | 100 | A | 5.5 | 1.8 |
| Example 45 | T-15 (1.2550) | — | Z-122 (0.0760) | A-1 (0.0150) | N-3 (0.0090) | W-1 | S-1/S-2 (80/20) | 14 | 87.5 | A | 5.0 | 2.1 |
| Comparative Example 1 | T-3 (1.2550) | — | PAG-R (0.0760) | — | N-1 (0.0090) | W-1 | S-1/S-2 (80/20) | 20 | 137.5 | A | 15.0 | 17.2 |
| Comparative Example 2 | T-6 (1.2550) | — | PAG-R (0.0760) | — | N-1 (0.0090) | W-1 | S-1/S-2 (80/20) | 24 | 125.0 | D | 13.8 | 16.2 |
| Comparative Example 3 | T-9 (1.3000) | BT-2 (0.1250) | PAG-R (0.0759) | — | N-2 (0.0090) | W-1 | S-1/S-2 (80/20) | 22 | 87.5 | D | 14.9 | 15.8 |
| Comparative Example 4 | T-12 (1.2550) | — | PAG-R (0.0760) | — | N-2 (0.0090) | W-1 | S-1/S-2 (80/20) | 21 | 137.5 | D | 14.0 | 18.2 |
| Comparative Example 5 | T-15 (1.2550) | — | PAG-R (0.0760) | — | N-3 (0.0090) | W-1 | S-1/S-2 (80/20) | 19 | 137.5 | D | 14.0 | 19.0 |
| Comparative Example 6 | — | BT-1 (1.3000) | PAG-R (0.0760) | — | N-3 (0.0090) | W-1 | S-1/S-2 (80/20) | 20 | 137.5 | D | 15.0 | 19.3 |
| Comparative Example 7 | — | BT-1 (1.3000) | Z-114 (0.0760) | A-50 (0.0150) | — | W-1 | S-1/S-2 (80/20) | 17 | 125.0 | D | 10.0 | 2.1 |
| Example 46 | T-15 (1.2550) | — | Z-72 (0.0760) | A-56 (0.0150) | — | W-3 | S-1/S-3 (60/40) | 12 | 100 | A | 4.5 | 1.9 |
| Example 47 | T-16 (1.2550) | — | Z-122 (0.0760) | A-34 (0.0150) | — | W-3 | S-1/S-3 (60/40) | 12 | 87.5 | A | 4.6 | 1.7 |
| Example 48 | T-16 (1.2550) | — | Z-172 (0.0760) | A-42 (0.0150) | — | W-3 | S-1/S-3 (60/40) | 11 | 87.5 | B | 5.2 | 1.8 |
| Example 49 | T-17 (1.2550) | — | Z-122 (0.0760) | A-56 (0.0150) | — | W-3 | S-1/S-3 (60/40) | 12 | 100 | B | 5.2 | 1.8 |
| Example 50 | T-18 (1.2550) | — | Z-107 (0.0760) | A-42 (0.0150) | — | W-3 | S-1/S-3 (60/40) | 14 | 87.5 | B | 5.8 | 2.1 |
| Example 51 | T-3 (0.6550) T-15 (0.6000) | — | Z-107 (0.0760) | A-42 (0.0150) | — | W-3 | S-1/S-3 (60/40) | 14 | 87.5 | B | 5.8 | 2.1 |
| Example 52 | T-10 (1.2550) | — | Z-20 (0.0360) Z-107 (0.0400) | A-42 (0.0150) | — | W-3 | S-1/S-3 (60/40) | 14 | 87.5 | B | 5.8 | 2.1 |
| Example 53 | T-18 (1.2550) | — | Z-72 (0.0760) | A-10 (0.0080) A-42 (0.0070) | — | W-3 | S-1/S-3 (60/40) | 13 | 87.5 | B | 5.9 | 2.1 |

The abbreviations of the components shown in Table 2 are explained below. Additive Resin:

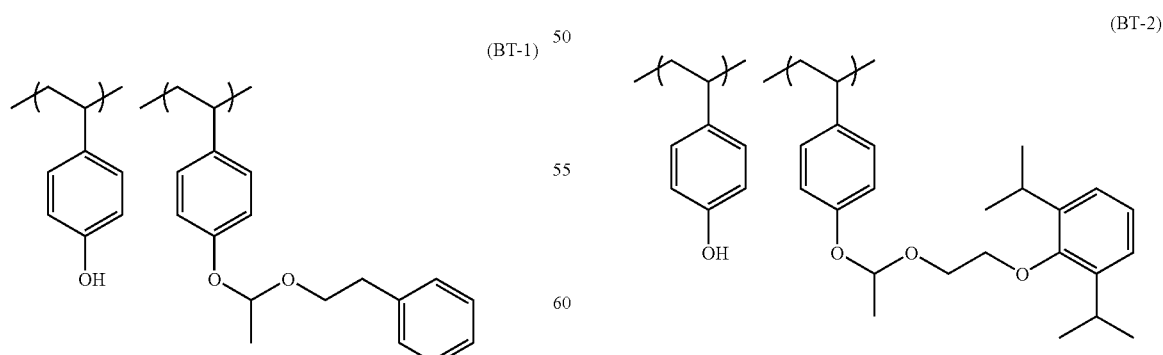

(BT-1)

Mw = 10000
Mw/Mn = 1.23
Protection ratio 45.5%

(BT-2)

Mw = 10000
Mw/Mn = 1.25
Protection ratio 45.5%

Acid Generator:

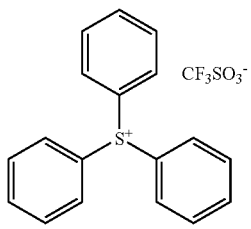

(PAG-R)

Basic Compound:
N-1: Trioctylamine
N-2: 1,5-Diazabicyclo[4.3.0]-5-nonene
N-3: 2,4,5-Triphenylimidazole Surfactant:
W-1: Megafac F176 (produced by Dainippon Ink and Chemicals, Inc.)
W-2: Megafac R08 (produced by Dainippon Ink and Chemicals, Inc.)
W-3: Troysol S-366 (produced by Troy Chemical Corp.)
W-4: Polyoxyethylene lauryl ether Solvent:
S-1: Propylene glycol monomethyl ether acetate
S-2: Propylene glycol monomethyl ether
S-3: Ethyl lactate As is apparent from the results shown in Table 2, the positive resist compositions of the invention exhibit excellent characteristics in the sensitivity, resolution, pattern profile, line edge roughness and fluctuation of line width due to PEB in vacuo in comparison with the compositions of comparative examples.

Using each of the resist compositions for Examples 7, 11, 23, 32 and 41 and Comparative Examples 1 to 5 described above, a resist film was prepared in the same manner as in Example 1. The resist film thus-obtained was subjected to plane exposure with EUV beam (wavelength: 13.5 nm) while changing the exposure amount in 0.5-mJ steps in the range from 0 to 10.0 mJ and baked at 110° C. for 90 seconds. Then, the dissolution rate in each exposure amount was measured by using an aqueous 2.38% tetramethylammonium hydroxide (TMAH) solution and a sensitivity curve was obtained from the measured values. The sensitivity was defined as the exposure amount when the dissolution rate of resist was saturated on the sensitivity curve. Also, the dissolution contrast (γ value) was calculated from the gradient in the straight line part of the sensitivity curve. As the γ value is larger, the dissolution contrast is more excellent. These procedures were designated as Examples 54 to 58 and Comparative Examples 8 to 12 respectively.

The results of the evaluation are shown in Table 3.

TABLE 3

|  | Sensitivity (mJ/cm$^2$) | γ Value | Outgassing (%) |
| --- | --- | --- | --- |
| Example 54 | 8.2 | 8.6 | 1.8 |
| Example 55 | 7.2 | 7.9 | 1.7 |
| Example 56 | 8.7 | 8.5 | 1.8 |
| Example 57 | 8.9 | 8.5 | 1.8 |
| Example 58 | 9.1 | 8.6 | 1.9 |
| Comparative Example 8 | 17.2 | 7.3 | 17.0 |
| Comparative Example 9 | 23.4 | 7.0 | 16.5 |
| Comparative Example 10 | 19.6 | 7.2 | 16.1 |
| Comparative Example 11 | 18.3 | 7.3 | 18.5 |
| Comparative Example 12 | 16.3 | 7.2 | 19.5 |

As is apparent from the results shown in Table 2, the positive resist compositions of the invention satisfy all of the high sensitivity, high dissolution constant and suppression of outgassing.

This application is based on Japanese Patent application JP 2006-86217, filed Mar. 27, 2006, and Japanese Patent application JP 2006-257965, filed Sep. 22, 2006, the entire contents of which are hereby incorporated by reference, the same as if set forth at length.

What is claimed is:

1. A positive resist composition comprising:
    a compound including a sulfonium cation having a structure represented by the following formula (Z-I);
    a low molecular weight compound which increases solubility in an alkali developing solution by an action of an acid; and
    a compound which generates a compound having a structure represented by the following formula (A-I) upon irradiation of an actinic ray or a radiation:

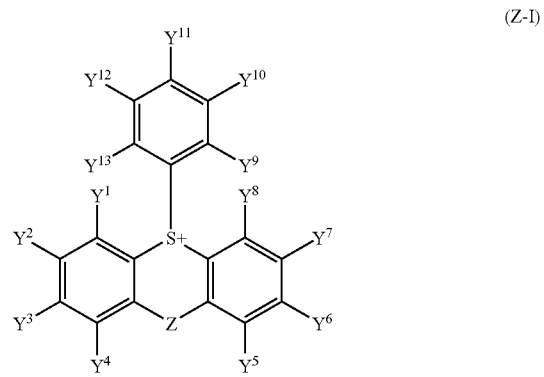

(Z-I)

wherein $Y^1$ to $Y^{13}$ each independently represents a hydrogen atom or a substituent, or adjacent members of $Y^1$ to $Y^{13}$ may be combined with each other to form a ring, and Z represents a single bond or a divalent connecting group;

$$Q-A-(X)_n-B-R \qquad \text{(A-I)}$$

wherein Q represents a sulfo group or a carboxyl group, A represents a divalent connecting group, X represents —$SO_2$— or —CO—, n represents 0 or 1, B represents a single bond, an oxygen atom or —$N(R_x)$— in which $R_x$ represents a hydrogen atom or a monovalent organic group, R represents a monovalent organic group including a proton acceptor functional group or a monovalent organic group including an ammonium group, and when B represents —$N(R_x)$—, R and $R_x$ may be combined with each other to form a ring.

2. The positive resist composition as claimed in claim 1, wherein the low molecular weight compound is a compound having a structure represented by the following formula (T-I):

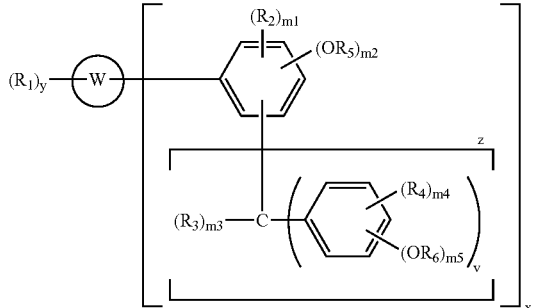

wherein $R_1$, $R_2$, $R_3$ and $R_4$ each independently represents a hydrogen atom, an alkyl group or a cycloalkyl group, plural $R_1$s may be combined with each other to form a ring, plural $R_2$s may be combined with each other to form a ring, plural $R_3$s may be combined with each other to form a ring, plural $R_4$s may be combined with each other to form a ring, plural $R_1$s, $R_2$s, $R_3$s and $R_4$s may be the same or different from each other respectively, and $R_5$ and $R_6$ each independently represents a hydrogen atom or an organic group, plural $R_5$s and $R_6$s may be the same or different from each other respectively, provided that at least one of $R_5$s and $R_6$s is an acid-decomposable group, W represents a single bond, an alkylene group, a cycloalkylene group, an arylene group or a group formed by a combination of at least two of an alkylene group, a cycloalkylene group and an arylene group, x represents a positive integer, y represents an integer of 0 or more, when W represents a single bond, y is 0, z represents an integer of 0 or more, v represents an integer of 0 or more, m1, m3 and m4 each independently represents a positive integer, and m2 and m5 each independently represents an integer of 0 or more, provided that m1+m2+z=5, m3+v=3, m4+m5=5 and m2+m5≧2.

3. The positive resist composition as claimed in claim 2, wherein the compound having a structure represented by the formula (T-I) is a compound having a structure represented by one of the following formulae (T-II) to (T-IV):

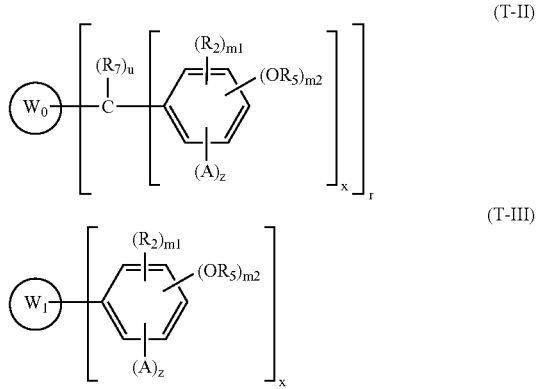

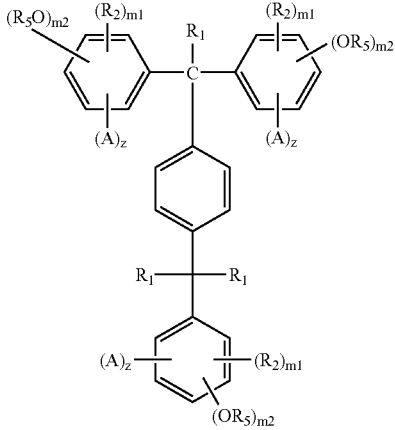

wherein $R_1$ and $R_2$ each independently represents a hydrogen atom, an alkyl group or a cycloalkyl group, plural $R_1$ s may be combined with each other to form a ring, plural $R_2$s may be combined with each other to form a ring, plural $R_1$s and $R_2$s may be the same or different from each other respectively, and $R_5$ and $R_6$ each independently represents a hydrogen atom or an organic group, plural $R_5$s and $R_6$s may be the same or different from each other respectively, provided that at least one of $R_5$s and $R_6$s is an acid-decomposable group, x represents a positive integer, z represents an integer of 0 or more, m1 represents a positive integer, and m2 represents an integer of 0 or more, provided that m1+m2+z=5, $R_7$ represents a hydrogen atom, an alkyl group or a cycloalkyl group, plural $R_7$s may be combined with each other to form a ring, plural $R_7$s may be the same or different from each other, u represents a positive integer, provided that u+x=3, r represents a positive integer, $W_0$ represents an arylene group, $W_1$ represents a single bond, an alkylene group or a cycloalkylene group, and A represents a group having a structure represented by the following formula (a):

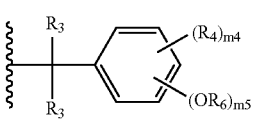

wherein $R_3$ and $R_4$ each independently represents a hydrogen atom, an alkyl group or a cycloalkyl group, plural $R_3$s may be combined with each other to form a ring, plural $R_4$s may be combined with each other to form a ring, plural $R_3$s and $R_4$s may be the same or different from each other respectively, and $R_6$ represents a hydrogen atom or an organic group, plural $R_6$s may be the same or different from each other, m4 represents a positive integer, and m5 represents an integer of 0 or more, provided that m4+m5=5.

4. The positive resist composition as claimed in claim 1, wherein the low molecular weight compound is a compound having a structure represented by the following formula (T-V):

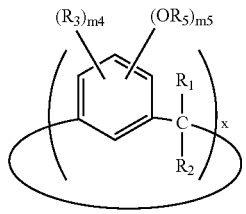

(T-V)

wherein $R_1$, $R_2$ and $R_3$ each independently represents a hydrogen atom, an alkyl group or a cycloalkyl group, plural $R_1$s may be combined with each other to form a ring, plural $R_2$s may be combined with each other to form a ring, plural $R_3$s may be combined with each other to form a ring, plural $R_1$s, $R_2$s and $R_3$s may be the same or different from each other respectively, and $R_5$ represents a hydrogen atom or an organic group, plural $R_5$s may be the same or different from each other, x represents a positive integer, m4 represents a positive integer, and m5 represents an integer of 0 or more, provided that m4+m5=5.

5. The positive resist composition as claimed in claim 1, wherein the compound which generates a compound having a structure represented by the formula (A-I) upon, irradiation of an actinic ray or a radiation is a sulfonium salt compound of the compound having a structure represented by the formula (A-I) or an iodonium salt compound of the compound having a structure represented by the formula (A-I).

6. The positive resist composition as claimed in claim 2, wherein the compound which generates a compound having a structure represented by the formula (A-I) upon irradiation of an actinic ray or a radiation is a sulfonium salt compound of the compound having a structure represented by the formula (A-I) or an iodonium salt compound of the compound having a structure represented by the formula (A-I).

7. The positive resist composition as claimed in claim 3, wherein the compound which generates a compound having a structure represented by the formula (A-I) upon irradiation of an actinic ray or a radiation is a sulfonium salt compound of the compound having a structure represented by the formula (A-I) or an iodonium salt compound of the compound having a structure represented by the formula (A-I).

8. The positive resist composition as claimed in claim 4, wherein the compound which generates a compound having a structure represented by the formula (A-I) upon irradiation of an actinic ray or a radiation is a sulfonium salt compound of the compound having a structure represented by the formula (A-I) or an iodonium salt compound of the compound having a structure represented by the formula (A-I).

9. A resist pattern formation method comprising:
coating the positive resist composition as claimed in claim 1 on a substrate to form a resist film;
exposing the resist film; and
developing the exposed resist film to form a resist pattern.

10. The positive resist composition as claimed in claim 1, wherein the low molecular weight compound contains an alkali-soluble group.

11. The positive resist composition as claimed in claim 1, wherein the amount of the low molecular weight compound is from 50 to 99.5% by weight based on the total solids content of the positive resist composition.

* * * * *